(12) United States Patent
Balog

(10) Patent No.: US 7,567,947 B2
(45) Date of Patent: Jul. 28, 2009

(54) METHODS AND SYSTEMS FOR SEMICONDUCTOR TESTING USING A TESTING SCENARIO LANGUAGE

(75) Inventor: Gil Balog, Jerusalem (IL)

(73) Assignee: Optimaltest Ltd., Nes-Zionna (IL)

( * ) Notice: Subject to any disclaimer, the term of this patent is extended or adjusted under 35 U.S.C. 154(b) by 297 days.

(21) Appl. No.: 11/396,938

(22) Filed: Apr. 4, 2006

(65) Prior Publication Data

US 2007/0233629 A1    Oct. 4, 2007

(51) Int. Cl.
  *G06F 17/00* (2006.01)
  *G06N 5/02* (2006.01)
(52) U.S. Cl. .................... 706/47; 706/12; 706/14
(58) Field of Classification Search .................. None
  See application file for complete search history.

(56) References Cited

U.S. PATENT DOCUMENTS

| | | | |
|---|---|---|---|
| 5,901,154 A | 5/1999 | Motohama et al. | |
| 5,910,895 A | 6/1999 | Proskauer et al. | |
| 6,128,759 A | 10/2000 | Hansen | |
| 6,574,778 B2* | 6/2003 | Chang et al. | 716/1 |
| 6,591,152 B1 | 7/2003 | Takano | |
| 6,601,203 B1 | 7/2003 | Asano et al. | |
| 6,618,682 B2 | 9/2003 | Bulaga et al. | |
| 6,618,853 B1 | 9/2003 | Ohyama et al. | |
| 6,711,514 B1 | 3/2004 | Bibbee | |
| 2003/0208345 A1* | 11/2003 | O'Neill et al. | 703/6 |
| 2004/0215361 A1 | 10/2004 | Hlotyak et al. | |
| 2004/0225459 A1 | 11/2004 | Krishnaswamy et al. | |
| 2005/0154551 A1 | 7/2005 | Pramanick et al. | |
| 2005/0273685 A1 | 12/2005 | Sachdev et al. | |
| 2007/0072091 A1* | 3/2007 | Smith et al. | 430/5 |
| 2007/0234246 A1* | 10/2007 | Sinha et al. | 716/4 |
| 2007/0240086 A1* | 10/2007 | Sinha et al. | 716/4 |

OTHER PUBLICATIONS

Bruce A. Beitman, Generalization of Electromigration Ground Rules Utilizing Monte Carlo Simulation Methods, Feb. 1991, IEEE, 0894-6507/91/0200-0063, 63-66.*
"Wafer (electronics)", *Wikipedia, the free encyclopedia*, printed on Feb. 28, 2006, last modified on Jan. 6, 2006, pp. 1-2. available online at http://en.wikipedia.org/wiki/wafer_%28electronics%29.
"Integrated circuit", *Wikipedia, the free encyclopedia*, printed on Feb. 28, 2006, last modified on Feb 28, 2006, pp. 1-9. available online at http://en.wikipedia.org/wiki/Integrated_circuit.

* cited by examiner

*Primary Examiner*—Joseph P Hirl
(74) *Attorney, Agent, or Firm*—The Nath Law Group; Jerald L. Meyer; Derek Richmond

(57) ABSTRACT

Methods and systems for semiconductor testing. In one embodiment, a semiconductor testing method includes one or more of the following stages: defining a rule relating to semiconductor testing, validating the rule, bundling the rule with other rules, correlating the rule with other rules, publishing the rule, actualizing the rule, and follow up relating to the rule. In one embodiment, a semiconductor testing system includes one or more of the following modules: rule creation module(s), analysis module(s), simulation module(s), real time production module(s), and offline production module(s). In one embodiment, user friendly graphical user interface(s) can be used for defining the building blocks of a rule and/or for viewing an optional hierarchy of categories to which the rule belongs.

29 Claims, 38 Drawing Sheets

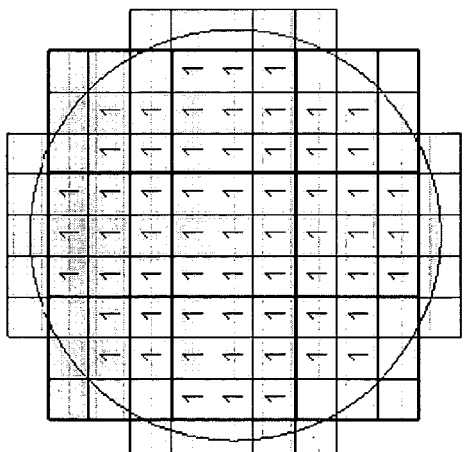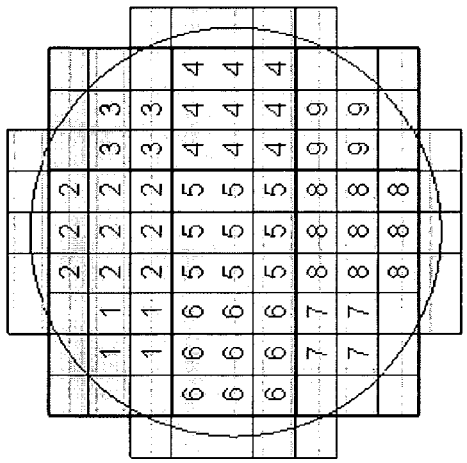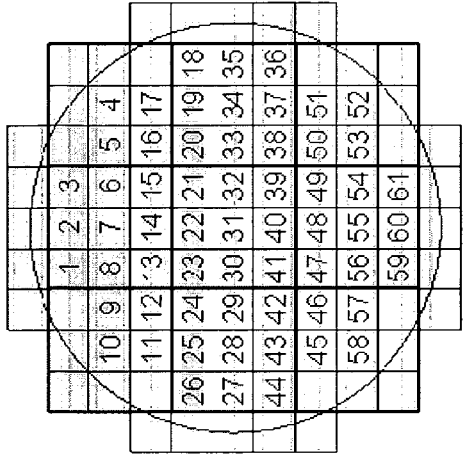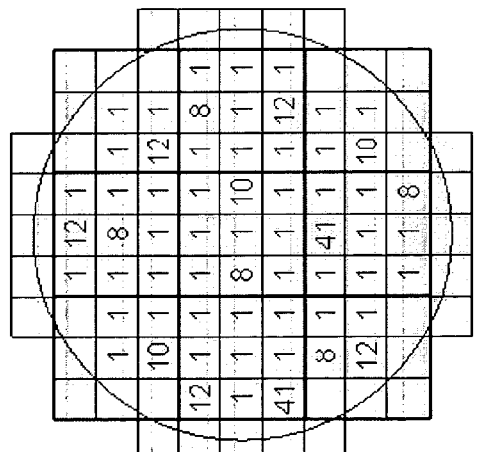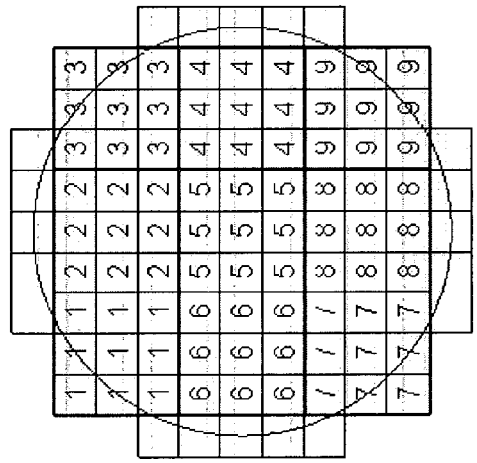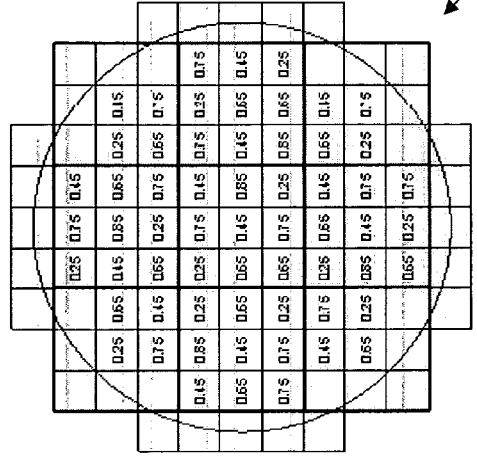
FIG. 17

FIG. 22

Form 2

Save  LoadFile  Split  Filter: |Products|  |▽|Select Product  |⊞|Production  |▽|Online  |▽|Load  BaseLines RuleSets

- ⊞ Product1 (Logic)
  - ETest
  - Sort
  - ⊟ TP11
    - ⊟ RuleSet 4:
      - ⊞ Bin SPC
      - ⊞ Parametric SPC ⎯ 1906
      - ⊟ TTR
        - Search Optimization
        - Masking (Skip Die)
        - Sampling (Skip Test)
        - Classical TTR
        - Adaptive TTR
        - Delay Time Optimization
        - Datalog Control
      - ⊟ Quality & Reliability ⎯ 1908
        - Reference Cells
        - Additional Tests
        - Stress Test
        - Force Value
        - Kill Limits
        - Masking for H/W Protection
      - ⊟ Control Rules ⎯ 1910
        - Validation Wafer (Bins)
        - Validation Wafer (Parameters)
        - Reference (Bins)
        - Reference (Parameters)
        - Dog Wafer (Bins)
        - Dog Wafer (Parameters)
      - ⊞ Disposition ⎯ 1912
        - Additional Resort Trigger
        - Modify Bin (Inkless)
        - Modify Parameter (Inkless)
        - Skip Area
      - ⊞ Post Processing
      - ⊞ Correlation
  - TP12
  - Burn-In
  - ⊞ Final Test
  - System Validation
- ⊞ Product2 (Flash)

Summary For RuleSet 4

New CBL Rule

RuleSets
- Product1 (Logic)
  - ETest
  - Sort
    - TP11
      - RuleSet 4
        - Bin SPC
          - CBL
            - CBL Occurrences per Entity
            - CBL Retest Bin Switching
            - CBL Event Free Window
          - TBL
            - TBL Occurrences per Entity
            - TBL Retest Bin Switching
          - SBL
            - SBL Resort Rate per Entity
            - SBL Resort Bin Switching
            - SBL Retest Bin Switching
          - Retest Limit Control
          - Clean Limit Control
          - Generic Retest Bin Switching
        - Parametric SPC
        - TTR
        - Quality & Reliability
        - Control Rules
        - Disposition
        - Post Processing
        - Correlation
    - TP12
    - Burn-In
    - Final Test
    - System Validation
- Product2 (Flash)

Rule — 2700
Actions
Alarms
Rule Limit
Parametric Filter
Functional Filter
Exclude Criteria
Scope
Name

--- Rule Limit ---
☑ Limit this rule's occurrences:
Limit: 3
Rule Behavior: Disable
Rule Limit RPM
☑ Alarm & Pause          Light Tow
Additional Alerts         Ot (Rule
☐ Custom Message
Troubleshooting Prompt:   [None]
Use RPM:
☐ User can ignore
☐ User can postpone to:   Rule will --- Parametric Filter ---
☑ Parametric Filter by:   Cres — 2702
⊙ Value is    Greater Than   1.0 — 2704
○ Value equals            ±
○ All values are equal ±

[Next]

New CBL Rule

Rule

Actions

Alarms

Rule Limit
2800 — Parametric Filter

Functional Filter

Exclude Criteria

Scope

Name

---

Parametric Filter

☑ Parametric Filter by: [Cress ▷]

⦿ Value is  [Greater Than ▷] [1.0 ▲▽]

○ Value equals  [▲▽] ±

○ All values are equal ± [▲▽]

Functional Filter

☑ Functional Filter :

⦿ Some failing channels reoccur

○ All failing channels reoccur

○ Specific failing channels always exist

```
TC 0  PC 8878, 71
TC 1  PC 7765, 79
TC 2  PC 8076
TC 3  PC 7072
TC 4  PC 7478, 82
TC 5  PC 7471, 65
TC 6  PC 8884
TC 7  PC 6965, 87
TC 8  PC 8483, 78
TC 9  PC 8371, 98
TC 10 PC 7088, 7
TC 11 PC 7774, 6
TC 12 PC 9088, 6
TC 13 PC 7185, 8
TC 14 PC 8070, 7
TC 15 PC 7981
TC 16 PC 7672, 7
TC 17 PC 7969, 8
```

[Next]

---

RuleSets

- Product1 (Logic)
  - ETest
  - Sort
    - TP11
      - RuleSet 4
        - Bin SPC
          - CBL
            - CBL Occurrences per Entity
            - CBL Retest Bin Switching
            - CBL Event Free Window
          - TBL
            - TBL Occurrences per Entity
            - TBL Retest Bin Switching
          - SBL
            - SBL Resort Rate per Entity
            - SBL Resort Bin Switching
            - SBL Retest Bin Switching
          - Retest Limit Control
          - Clean Limit Control
          - Generic Retest Bin Switching
        - Parametric SPC
        - TTR
        - Quality & Reliability
        - Control Rules
        - Disposition
        - Post Processing
        - Correlation
    - TP12
  - Burn-In
  - Final Test
  - System Validation
- Product2 (Flash)

| RuleSets | Summary for Bin SPC |
|---|---|
| ⊟ Product1 (Logic)<br>⋯ ETest<br>⊟ Sort<br>  ⊟ TP11<br>    ⊟ RuleSet 4<br>      ⊟ [Bin SPC] ← 1902<br>        ⋯ CBL<br>        ⋯ CBL Occurrences per Entity<br>        ⋯ CBL Retest Bin Switching<br>        ⋯ CBL Event Free Window<br>        ⋯ TBL<br>        ⋯ TBL Occurrences per Entity<br>        ⋯ TBL Retest Bin Switching<br>        ⋯ SBL<br>        ⋯ SBL Resort Rate per Entity<br>        ⋯ SBL Resort Bin Switching<br>        ⋯ SBL Retest Bin Switching<br>        ⋯ Retest Limit Control<br>        ⋯ Clean Limit Control<br>        ⋯ Generic Retest Bin Switching<br>      ⊞ Parametric SPC<br>      ⊞ TTR<br>      ⊞ Quality & Reliability<br>      ⊞ Control Rules<br>      ⊞ Disposition<br>      ⊞ Post Processing<br>      ⊞ Correlation<br>  ⋯ TP12<br>  ⋯ Burn-In<br>  ⋯ Final Test<br>  ⊞ System Validation<br>⊞ Product2 (Flash) | CBL (Bin 15 Soft Bin [Any])> 3; Clean Type: Plate Retest, No SC Alarm, No Engineering Alarm; Limit rule to 3 occurrences ← 3302 |

New Search Optimization Rule

RuleSets
- Product1 (Logic)
  - ETest
  - Sort
    - TP11
      - RuleSet 4
        - Bin SPC
        - Parametric SPC — 3700
        - TTR
          - Search Optimization:
          - Masking (Skip Die)
          - Sampling (Skip Test)
          - Classical TTR
          - Adaptive TTR
          - Delay Time Optimization
          - Datalog Control
        - Quality & Reliability
        - Control Rules
        - Disposition
        - Post Processing
        - Correlation
    - TP12
  - Burn-In
  - Final Test
  - System Validation
- Product2 (Flash)

Conditions

Target Population

Parameter: [Fmax ▼]

Target Population: [Current Die ▼]

Globals

Global: [Fmax_Search_Min ▼]

Global 2: [Fmax_Search_Max ▼]

Target Value: [50.0]

Target Value 2: [100.0]

Control Rules

In case one of the rules in the grid below occurs, this rule will be disabled

| Type | Rule |
|---|---|
| Validation Wafer (Bins) | VLD_B_5 |

— 3702

[Next]

Exclude Criteria

Name

New Search Optimization Rule

| | |
|---|---|
| Conditions | Global 2: Fmax_Search_Max |
| | Target Value: 50.0 |
| Target Population | Target Value 2: 100.0 |
| | Control Rules |
| Globals | In case one of the rules in the grid below occurs, this rule will be disabled |
| Control Rules | |
| | Type     Rule |
| Exclude Criteria | Validation Wafer (Bins)     VLD_B_5 |
| | |
| | Exclude Criteria |
| | ☑ The rule will always run unless the conditions below occur. Otherwise it will run only for "include lots" |
| | Exclude Material: |
| Name | Exclude Area Maps: |
| | Name |
| | Name: SRCH_Fmax_50_100 — 3902 |
| | Comments: — 3904 |
| | [ Finish ] |

RuleSets
- Product1 (Logic)
  - ETest
  - Sort
    - TP11
      - RuleSet 4
        - Bin SPC
        - Parametric SPC
        - TTR
          - Search Optimization — 3900
          - Masking (Skip Die)
          - Sampling (Skip Test)
          - Classical TTR
          - Adaptive TTR
          - Delay Time Optimization
          - Datalog Control
        - Quality & Reliability
        - Control Rules
        - Disposition
        - Post Processing
        - Correlation
    - TP12
  - Burn-In
  - Final Test
  - System Validation
- Product2 (Flash)

| RuleSets | Summary for TTR |
|---|---|
| ⊟ Product1 (Logic)<br>··· ETest<br>⊟ Sort<br>····⊟ TP11<br>········⊟ RuleSet 4<br>············⊞ Bin SPC<br>············⊞ Parametric SPC ─1906<br>············⊟ TTR<br>················⊞ Search Optimization<br>··················· Masking (Skip Die)<br>··················· Sampling (Skip Test)<br>··················· Classical TTR<br>··················· Adaptive TTR<br>··················· Delay Time Optimization<br>··················· Datalog Control<br>············⊞ Quality & Reliability<br>············⊞ Control Rules<br>············⊞ Disposition<br>············⊞ Post Processing<br>············⊞ Correlation<br>······· TP12<br>····⊞ Burn-In<br>······· Final Test<br>······· System Validation<br>⊞ Product2 (Flash) | • Search Optimization When if Current_Die(ETest_ACLEN) Between 2 and 4 occurs, change FMax for Current Die to (50 - 100) ─4202 |

FIG. 42

| RuleSets | Summary for RuleSet 4 |
|---|---|
| ⊟ Product1 (Logic)<br>⋮⋯ ETest<br>⋮⋯ Sort<br>⋮⋯ ⊟ TP11<br>⋮⋮⋯ ⊟ RuleSet 4<br>⋮⋮⋯⋮⋯ ⊞⋯ Bin SPC<br>⋮⋮⋯⋮⋯ ⋯ Parametric SPC<br>⋮⋮⋯⋮⋯ ⋯ TTR<br>⋮⋮⋯⋮⋯ ⊞⋯ Quality & Reliability<br>⋮⋮⋯⋮⋯ ⊞⋯ Control Rules<br>⋮⋮⋯⋮⋯ ⊞⋯ Disposition<br>⋮⋮⋯⋮⋯ ⊞⋯ Post Processing<br>⋮⋮⋯⋮⋯ ⋯ Correlation<br>⋮⋯ TP12<br>⋮⋯ Burn-In<br>⋮⋯ ⊞ Final Test<br>⋮⋯ System Validation<br>⊞ Product2 (Flash) | • CBL (Bin 15 Soft Bin [Any]) > 3; Clean Type: Plate, Retest, No SC Alarm, No Engineering Alarm; Limit Rule to 3 occurrences<br>• Search Optimization When If Current_Die(ETest_ACLEN) Between 2 and 4 occurs, change Fmax for Current Die to (50 -100)<br>• Validation Wafer (Bins) If Yield is less than 0.7 In validation wafers, Trigger parent rule: WorkFlow Action: Hold } 4300 |

FIG. 43

METHODS AND SYSTEMS FOR SEMICONDUCTOR TESTING USING A TESTING SCENARIO LANGUAGE

FIELD OF THE INVENTION

The invention relates to semiconductor testing.

BACKGROUND OF THE INVENTION

Testing has emerged as a key constraint in the push for more advanced, reliable and cost-effective semiconductor based products. Advances in semiconductor process technology have enabled chip designers to pack high volume production chips with 100 million transistors. Experts predict this will increase to more than 1 billion transistors within the next few years.

Semiconductor process technology is characterized by Moore's Law, which states that the numbers of transistors in a given surface area will double every 18 months. Much of this density increase is driven by smaller and smaller line widths or geometries. Today 90 nm devices are common and 25 nm designs are in development (a nanometer is one millionth of a meter or $\frac{1}{1200}$th width of human hair). These advances place a strain on test systems as more transistors and structures must be tested. This exponential growth rate also drives a continual increase in the process, design and manufacturing complexities which, in turn, can increase systemic problems that affect quality, yield and product reliability. All of these factors tend to drive the need for more test time and more comprehensive testing, thus test cost has become a major factor in the overall manufacturing cost of an integrated circuit.

It will now be illuminated some terms used in semiconductor testing industry:

- An integrated circuit (IC) is a small electronic device made out of a semiconductor material.
- A wafer is a thin slice of semiconductor material, such as silicon, upon which microcircuits are constructed by doping (for example, diffusion or ion implantation), etching, and deposition of various materials.
- A wafer is usually made up of many single units also called dice (one unit=die, two or more units=dice). After the fabrication process is completed, the wafer will be cut during the assembly process and each die may be connected into a package using aluminum (or occasionally gold) wires which are welded to pads, usually found around the edge of the die.
- There are various testing stages. For example, sort (also known as wafer probe) is done while the units are still at wafer level. For example, final test is done after the units have been packaged.
- A "touchdown" is the term used when the interface unit (either at Sort—probe-card or Final Test—contactor) "touches" the unit under test. In parallel testing, units tested at the same time have the same touchdown.
- Note that the term device may have many meanings in semiconductor testing, including integrated circuits, product type, wafer or die and the meaning can be construed based on the context.
- The term lot may also have more than one meaning in semiconductor testing. Typically although not necessarily in fabrication and sort test, a lot refers to a plurality of wafers that were manufactured at the same time, whereas in assembly/final test, a lot typically although not necessarily refers to a plurality of units that were tested in the same batch.

In one test floor configuration, there are one or more testing stations. In each station there are a tester (test equipment) and a prober or handler (the prober is configured to handle a wafer and the handler is configured to handle an individual unit). The tester and prober/handler together are considered the test module. On the prober/handler sits an interface unit—probe-card or contactor configured to hold a wafer or individual packaged unit. One or more station controllers control the tester and the prober/handler. For example one station controller may control both the tester and the prober/handler. As another example one station controller may control the tester and another station controller may control the prober/handler. Upon receiving instructions from the controlling station controller, the prober/handler takes the device to the tester so that the tester can test device. Typically although not necessarily, the tester and the station controller include programs which when run cause the tester and the station controller to perform the testing in accordance with the programs.

Currently testing is performed by two basic methods. Either, devices are tested a single one at a time, sequentially, or several are tested at the same time in "parallel". Single tests are more common with complex products such as CPUs while memory devices are most often tested in parallel. Note, however, that these examples are not binding. Currently, there are various test sockets (aka operations or stages) for a given product that together comprise a test flow. A test socket is an operation that may be distinguished by a specific testing type at specific test conditions. For instance, for a given socket, a set of tests is performed at a given temperature, whereas for another socket, the same (or similar) tests are performed at a different temperature. By way of another example, functional tests are applied at the first socket and structural tests are applied at the second socket. Test sockets include (again, non-binding): E-test (or parametric electrical testing), Sort (or wafer probe test), Burn-in, Final Test, and System Validation. Each socket may include various sub-steps such as Sort1, Sort2 and Sort3. Sort is done while the dice (aka devices or units) are still at the wafer level whereas at Final test, the semiconductor devices have been packaged. The main goal of the specified stages is to separate out potentially good devices from those that fail testing. Electrical parametric tests are executed on the wafers scribe line (between the dice) and usually measure transistor parametric characteristics. Burn-in is executed, after packaging, in order to simulate an extended life cycle by stressing the devices at a high temperature (in a burn-in oven) while applying an elevated voltage at an extended duration. It is important to note that there are various types of burn-in. Some methods only "bake" the devices at a high temperature, others apply an elevated voltage as well and some perform all this while executing a functional pattern (with high toggle coverage) on the device IO's. System validation is performed usually as the last step by testing the device in "customer mode". For example a CPU device will be placed on an actual motherboard and "booted-up" using an operating system as well as testing other software applications. In summary, every product may go through a different flow. In addition, not all devices of the same product may go through the entire flow. For example, burn-in and system validation are good examples where devices are tested in "sample mode".

SUMMARY OF THE INVENTION

According to the present invention there is provided a system for creating a rule set relating to semiconductor testing, comprising: a comparator configured to compare a rule relating to semiconductor testing with at least one other rule relating to semiconductor testing, according to at least one predetermined criterion; a resolver configured to resolve any problematic relationship determined by the comparator between the rule and the at least one other rule; and a publisher configured to prepare a rule set including the rule for actualization after any problematic relationship has been resolved.

According to the present invention there is also provided, a system for creating a rule relating to semiconductor testing, comprising: a user interface configured to receive from a user a specification of a parameter for a rule relating to semiconductor testing, wherein the specification does not provide the parameter with a definitive value; and a simulator configured to simulate the rule a plurality of times with different values for the parameter in order to quantify a definitive value for the parameter.

According to the present invention there is further provided, a system for creating a rule relating to semiconductor testing, comprising: means for providing at least one parameter for a semiconductor rule; wherein the at least one parameter defines a condition for actualization of the rule; and a simulator configured to assume whether the condition exists and simulating actualization or non actualization of the semiconductor rule accordingly.

According to the present invention there is still further provided, a system for semiconductor testing, comprising: a first actualization module configured to actualize a first rule relating to semiconductor testing; and a second actualization module configured to actualize a second rule relating to semiconductor testing, wherein the second rule refers to the first rule.

According to the present invention there is provided, a method of creating a rule set relating to semiconductor testing, comprising: comparing a rule relating to semiconductor testing with at least one other rule relating to semiconductor testing, according to at least one predetermined criterion; resolving any problematic relationship determined by the comparator between the rule and the at least one other rule; and preparing a rule set including the rule for actualization after any problematic relationship has been resolved.

According to the present invention there is also provided, a method of creating a rule relating to semiconductor testing, comprising: receiving a specification of a parameter for a rule relating to semiconductor testing, wherein the specification does not provide the parameter with a definitive value; and simulating the rule a plurality of times with different values for the parameter in order to quantify a definitive value for the parameter.

According to the present invention there is also provided, a method of creating a rule relating to semiconductor testing, comprising: providing at least one parameter for a semiconductor rule; wherein the at least one parameter defines a condition for actualization of the rule; and assuming whether the condition exists and simulating actualization or non actualization of the semiconductor rule accordingly.

According to the present invention there is further provided, a method of semiconductor testing, comprising: a first actualization module actualizing a first rule relating to semiconductor testing; and a second actualization module actualizing a second rule relating to semiconductor testing, wherein the second rule refers to the first rule.

According to the present invention there is provided, a method of semiconductor testing, comprising: defining a rule relating to semiconductor testing; validating the rule; bundling the rule with other rules; correlating the rule with other rules; publishing the rule; and actualizing the rule.

According to the present invention there is also provided, a system for semiconductor testing, comprising: means for defining a rule relating to semiconductor testing; means for validating the rule; means for bundling the rule with other rules; means for correlating the rule with other rules; means for publishing the rule; and means for actualizing the rule.

According to the present invention there is further provided, a system for creating rules relating to semiconductor testing, comprising: means for providing a hierarchy of categories relating to semiconductor testing rules to a user; means for receiving from the user a position of a new rule relating to semiconductor testing within the hierarchy; and means for determining and providing to the user for specification a plurality of parameters relating to the rule, based on the position.

According to the present invention there is still further provided a method for creating rules relating to semiconductor testing, comprising: providing a hierarchy of categories relating to semiconductor testing rules to a user; receiving from the user a position of a new rule relating to semiconductor testing within the hierarchy; and determining and providing to the user for specification a plurality of parameters relating to the rule, based on the position.

According to the present invention there is provided, a system for semiconductor testing comprising: a data access layers, comprising at least one layer of information in a format of a wafer map; and a production executor configured to access the information from the data access layers during semiconductor testing.

According to the present invention there is also provided, a method of semiconductor testing comprising: providing a data access layers which comprises at least one layer of information in a format of a wafer map; and accessing the information from the data access layers during semiconductor testing.

According to the present invention there is further provided, a computer program product comprising a computer useable medium having computer readable program code embodied therein for creating a rule set relating to semiconductor testing, the computer program product comprising: computer readable program code for causing a computer to compare a rule relating to semiconductor testing with at least one other rule relating to semiconductor testing, according to at least one predetermined criterion; computer readable program code for causing a computer to resolve any problematic relationship determined by the comparator between the rule and the at least one other rule; and computer readable program code for causing a computer to prepare a rule set including the rule for actualization after any problematic relationship has been resolved.

According to the present invention there is further provided, a computer program product comprising a computer useable medium having computer readable program code embodied therein for creating a rule relating to semiconductor testing, the computer program product comprising: computer readable program code for causing a computer to receive a specification of a parameter for a rule relating to semiconductor testing, wherein the specification does not provide the parameter with a definitive value; and computer readable program code for causing a computer to simulate the rule a plurality of times with different values for the parameter in order to quantify a definitive value for the parameter.

According to the present invention there is still further provided, a computer program product comprising a computer useable medium having computer readable program code embodied therein for creating a rule relating to semiconductor testing, the computer program product comprising: computer readable program code for causing a computer to provide at least one parameter for a semiconductor rule; wherein the at least one parameter defines a condition for actualization of the rule; and computer readable program code for causing a computer to assume whether the condition exists and to simulate actualization or non actualization of the semiconductor rule accordingly.

According to the present invention there is provided, a computer program product comprising a computer useable medium having computer readable program code embodied therein for semiconductor testing, the computer program product comprising: computer readable program code for causing a first actualization module to actualize a first rule relating to semiconductor testing; and computer readable program code for causing a second actualization module to actualize a second rule relating to semiconductor testing, wherein the second rule refers to the first rule.

According to the present invention there is also provided, a computer program product comprising a computer useable medium having computer readable program code embodied therein for semiconductor testing, the computer program product comprising: computer readable program code for causing a computer to define a rule relating to semiconductor testing; computer readable program code for causing a computer to validate the rule; computer readable program code for causing a computer to bundle the rule with other rules; computer readable program code for causing a computer to correlate the rule with other rules; computer readable program code for causing a computer to publish the rule; and computer readable program code for causing a computer to actualize the rule.

According to the present invention there is further provided, a computer program product comprising a computer useable medium having computer readable program code embodied therein for creating rules relating to semiconductor testing, the computer program product comprising: computer readable program code for causing a computer to provide a hierarchy of categories relating to semiconductor testing rules to a user; computer readable program code for causing a computer to receive from the user a position of a new rule relating to semiconductor testing within the hierarchy; and computer readable program code for causing a computer to determine and provide to the user for specification a plurality of parameters relating to the rule, based on the position.

According to the present invention there is still further provided, a computer program product comprising a computer useable medium having computer readable program code embodied therein for semiconductor testing, the computer program product comprising: computer readable program code for causing a computer to provide a data access layers which comprises at least one layer of information in a format of a wafer map; and computer readable program code for causing a computer to access the information from the data access layers during semiconductor testing.

DESCRIPTION OF THE DRAWING FIGURES

These and other objects, features and advantages of the present invention will be apparent from a consideration of the following Detailed Description of the Invention when considered with the drawing Figures, in which:

FIG. 17 is a schematic illustration various examples of layers in a data access layers, according to an embodiment of the present invention;

FIG. 22 is a graphical user interface illustrating the rules types for other families, according to an embodiment of the present invention;

FIG. 25 is another graphical user interface for defining a consecutive bin limit rule, according to an embodiment of the present invention;

FIG. 26 is another graphical user interface for defining a consecutive bin limit rule, according to an embodiment of the present invention;

FIG. 27 is another graphical user interface for defining a consecutive bin limit rule, according to an embodiment of the present invention;

FIG. 28 is another graphical user interface for defining a consecutive bin limit rule, according to an embodiment of the present invention;

FIG. 29 is another graphical user interface for defining a consecutive bin limit rule, according to an embodiment of the present invention;

FIG. 30 is another graphical user interface for defining a consecutive bin limit rule, according to an embodiment of the present invention;

FIG. 31 is another graphical user interface for defining a consecutive bin limit rule, according to an embodiment of the present invention;

FIG. 32 is a graphical user interface illustrating a consecutive bin limit rule in grid form, according to an embodiment of the present invention;

FIG. 33 is a graphical user interface illustrating a technique in rule definition, according to an embodiment of the present invention;

FIG. 36 is another graphical user interface for defining an optimization rule, according to an embodiment of the present invention;

FIG. 37 is another graphical user interface for defining an optimization rule, according to an embodiment of the present invention;

FIG. 38 is another graphical user interface for defining an optimization rule, according to an embodiment of the present invention;

FIG. 39 is another graphical user interface for defining an optimization rule, according to an embodiment of the present invention;

FIG. 40 is a graphical user interface illustrating an optimization rule in grid mode, according to an embodiment of the present invention;

FIG. 41 is a graphical user interface illustrating an optimization rule as a new leaf in the hierarchy, according to an embodiment of the present invention;

FIG. 42 is a graphical user interface illustrating a technique in rule definition, according to an embodiment of the invention;

FIG. 43 is a graphical user interface illustrating the technique of FIG. 42 but at a higher level in the hierarchy, according to an embodiment of the present invention.

DETAILED DESCRIPTION OF THE INVENTION

Described herein are embodiments of the current invention for semiconductor testing.

As used herein, the phrase "for example," "such as" and variants thereof describing exemplary implementations of the present invention are exemplary in nature and not limiting.

Figure 1:
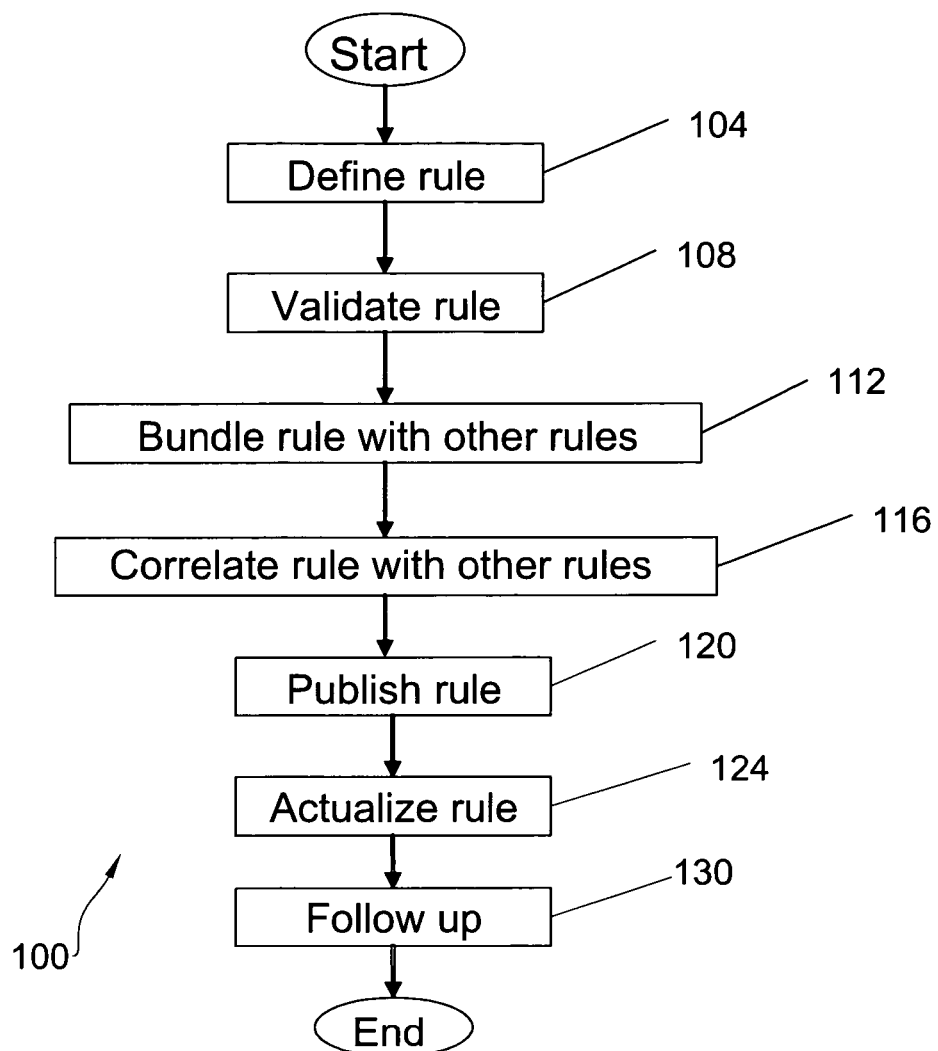
FIG. 1 is a flowchart of a method of semiconductor testing, according to an embodiment of the present invention.

Referring now to the drawings, FIG. 1 is a flowchart of a method 100 of semiconductor testing, according to an embodiment of the invention. In other embodiments of the invention, fewer, more, or different stages than those shown in FIG. 1 may be executed. The stages may be executed in a different order than shown in FIG. 1, and/or in some embodiments one or more stages may be executed simultaneously. Each of the stages of method 100 may be executed automatically (without user intervention), semi-automatically and/or manually.

Figure 2:
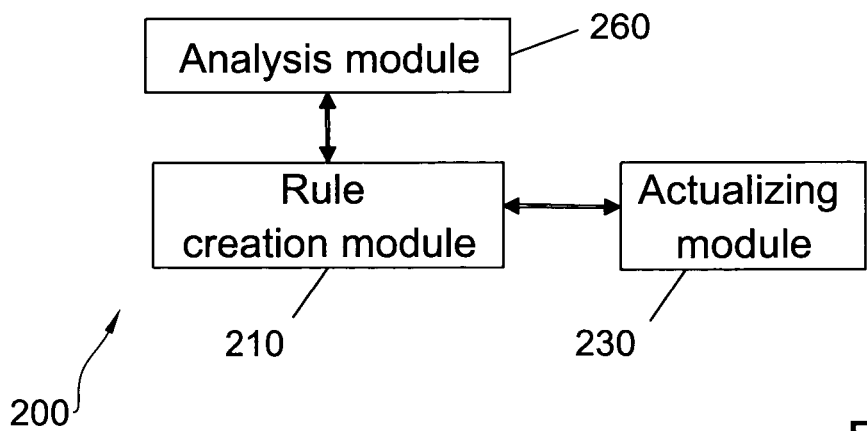
FIG. 2 is a block diagram of a system for semiconductor testing according to an embodiment of the present invention.

FIG. 1 will be described in conjunction with FIG. 2. FIG. 2 is a block diagram of a semiconductor testing system 200 for executing method 100, comprising a rule creation module 210 and/or one or more types of actualizing module(s) 230 and/or an analysis module 260, according to an embodiment of the present invention. For ease of explanation, actualizing module 230 will be referred to in the single form here and below, but the reference should be understood to include both the cases of single and plural actualizing modules 230 in system 200, as appropriate. Each module of system 200 can be made up of any combination of software, hardware and/or firmware that performs the functions as defined and explained herein. The modules of system 200 may be centralized in one location or dispersed over more than one location. For example in one embodiment, the functionality of one or more modules in system 200 is located in the same enclosure, for example on one server. As another example, in one embodiment, one or more modules of system 200 are connected by a local area network LAN or any other appropriate network.

In other embodiments of the invention, system 200 may comprise fewer, more, and/or different modules than those shown in FIG. 2. For example in one embodiment only rule creation module 210 may be present in system 200, for example if actualization of rules occurs elsewhere than in system 200. In another embodiment, only actualizing module 230 may be present in system 200, for example if rules are created elsewhere than in system 200. In another embodiment, analysis module 260 may be omitted if rules are defined in rule creation module 210 and/or elsewhere but not using analysis module 260.

In stage 104, a semiconductor testing rule (referred to below also as a testing algorithm) is defined. As will become clearer to the reader further below, a semiconductor testing rule specifies a test, a part of a test, an if-then scenario, a test sequence, an action as a result of a test or as a result of a test sequence, and/or specifies any aspect having to do with semiconductor testing. In one embodiment, the rule is defined by a rule creation module 210, with or without input from a user. Although the single form of user is used here and below, it should be evident to the reader that in some cases more than one user can participate in the generation of a rule.

In other embodiments, rule definition 104 of some or all of the rules occurs outside of rule creation module 210. For example in one of these embodiments the rule definition 104 occurs in analysis module 260, but in a format supported by rule creation module 210. In this embodiment, using historic testing results, analysis module 260 defines a rule. For example, analysis module 260 can analyze which tests historically had low fallout and define a rule in stage 104 to remove the low fallout tests. The rule defined by analysis module 260 can then be provided to rule creation module 210, for example for validation (stage 108), bundling (stage 112), correlation (stage 116) and/or publishing (stage 120) using rule creation module 210, or the defined rule can be provided directly to a rule actualizing module 230. The analysis performed by module 260 during rule definition 104 can in some embodiments include various sub steps for example, performing more than one analysis, viewing results at more than one point during the analysis, making decisions at various points during the analysis, etc.

In one embodiment, defined rules are tagged as relating to real-time production or as relating to other situations, for example offline. Offline should be understood as :not in real time", meaning that actualization of rules when performed offline does not impact on the tested product in real time. For example, offline rules are not be executed on the test module. In this embodiment, both rules tagged as real time or relating to other situations may be actualized through simulation. In another embodiment, some or all rules may be more flexibly defined in terms of whether the rules relate to real time production or not.

In stage 108, the rule defined in stage 104 is validated by rule creation module 210. Validation ensures that the defined rule is appropriate for system 200 as will be explained in more detail further below. For example only bins relevant to a product, only actions (clean, resort, retest amount, etc.) supported by a test module, etc., may be valid.

In some cases stages 104 and 108 occur together, for example a user may only be allowed to input parameters into rule creation module 210 during rule definition which are valid for system 200. In stage 112, rule creation module 210 bundles the defined rule into a rule set together with other rules which have been defined using rule creation module 210 or through other means. As used here and below a rule set includes a plurality of semiconductor testing rules. In stage 116, the rule is correlated by rule creation module 210 with respect to one or more other rules, for example against some or all of the other rules in a bundled rule set which includes the rule. In stage 120, the defined rule is published by rule creation module 210, in some cases as part of the bundled rule set. For the purposes of the description below, publishing should be understood as preparing the defined rule for actualization. In stage 124, the rule is actualized by actualizing module 230. As will be explained further below, for some rules actualization may in some cases be dependent on other factors which may or may not prevent actualization of those rules in some or all cases. In another embodiment, rule actualization stage 124 can occur after rule 108, i.e. prior to being bundled into a rule set. In stage 130, there is follow up on the actualization of the rules. Follow up 130 can include any one or more of the following inter-alia: analysis of the actualization, doing nothing/ending method 100, adapting the rule, tagging the rule, discarding the rule, reporting on the rule, optimizing the rule, continuing to actualize the rule or an adapted version of the rule using the same type of actualizing module 230, actualizing the rule or an adapted version of the rule on a different type of actualizing module 230, monitoring results of the rule, or any other appropriate action. Follow up 130 can be performed by rule creation module 210, actualizing module 230, and/or analyzing module 260 depending on the embodiment. In one embodiment, follow up stage 130 includes repeating one or more stages of method 100.

Now will be described more details of some embodiments of rule definition (stage 104) and the inter-relationship with other stages. In one embodiment of the invention, a testing rule is characterized by a hierarchy of categories to which the rule belongs. In this embodiment the hierarchy can help inter-alia in defining the rule (stage 104), bundling the rule (stage 112) and/or correlating the rule with respect to other rules (stage 116).

In some embodiments, a hierarchy of categories may be based on the product. Typically although not necessarily, units or devices that are substantially similar are considered the same product. In the one embodiment, the hierarchy includes (from top level downwards) the following categories: product, area, operation (socket), test program (version), rule set (version), family, rule type and single entity (rule). In this example if the user wants to take advantage of the hierarchy, a user can define a rule in stage 104 by first specifying the product. Next the user specifies the area. Next, the user specifies the socket/operation. As the reader is aware a socket defines the place and type of test. Examples of sockets include one or more of the following inter-, E-test, sort (1, 2, 3, etc) burn in, final test (1, 2, 3, etc), and system validation. Next the user specifies the test program version. As the reader is aware, test programs are programs which run on testers. Next the user specifies the rule set version. Next the user specifies the family and rule type. Next the user specifies the (single entity) rule itself as will be explained in more detail below. Specification by the user can occur in any suitable manner, for example selection from menus, free-mode input, etc. In another embodiment, some or all of the categories in the hierarchy are specified automatically, without user input. In one embodiment, the tree hierarchy includes descriptions, characteristics and/or attributes for some or all of the categories. Examples for these descriptions, characteristics and/or attributes include inter-alia: active/inactive, old/current/development, test type, temperature, etc. In one embodiment, the tree has a "filter" mechanism or "group by" capability that is performed according to one or more of the various descriptions, characteristics and/or attributes. In one embodiment, the operation will describe and define all the necessary criteria of the test socket, for example—Test Type (Functional, Structural, Optical), Temperature (Hot, Cold, Exact Temperature), etc.

As mentioned above, all examples provided in the description are for the sake of illustration and should not be considered binding. In this spirit some examples of rules families and rules types within those families are now provided, Examples of rule families include inter-alia: Bin SPC (Statistical Process Control), Parametric SPC (Statistical Process Control), Test Time Reduction (TTR), Quality & Reliability and Post Processing & Disposition.

The examples of rule families and rule types are described with the Sort operation in mind but in a similar fashion (with minor modifications, for example no "wafer" at final test) similar examples can be used in any test socket/operation (E-test, burn-in, Final Test, System Validation, etc).

Bin SPC rules may include rules such as CBL's (consecutive bin limit), TBL's (total bin limit) and SBL's (statistical bin limit). One type of consecutive bin limit rule is executed in real-time and is "triggered" if there is a consecutive amount of units that received a particular failing signature (for example, the same bin). If this occurs, the rule will cause a corrective action to be performed for example command the prober to clean the probe-card and re-test the last X consecutive bins that triggered the rule. An additional type of action is to pause testing and give an alarm to the technician. Additional, CBL related rules may include monitoring and comparing the amount of CBL occurrences per equipment entity (an entity may be the tester, probe-card or a combination of tester and probe card). This rule provides an indication of "outlier" equipments (ones with significantly more CBL occurrences) and is typically although not necessarily executed offline. During offline execution, comparisons can be performed across individual test equipment. CBL rules are not limited to single testing but can be performed in parallel testing as well. In this case a "consecutive occurrence" can be across units or across touchdowns.

A statistical bin limit rule is executed at the end of the wafer or at the end of a lot and checks if a specific fail signature (bin, for example) is higher than normal. If the rule is triggered, it can trigger an alarm to perform various actions such as retest the wafer on a different test system (aka resort), hold the wafer for engineering disposition, scrap the wafer, "tag" it for future reference, etc.

A total bin limit rule is similar to a statistical bin limit rule but does not require an "end of wafer/lot event". This rule is typically although not necessarily executed in real-time and is "triggered" if the amount of dice (not consecutive) with the same fail signature (bin, for example) is higher than normal during the test of a certain amount of material (for example, a window size of 50 units). Additional statistical process control rules that are triggered by bins may include checking for bin-switching or more accurately, for die gain, that result from either retest or resort actions.

Parametric SPC rules may include rules such as alarming for outliers, trends, marginalities and freezes on parametric tests. Parametric test results are normally characterized by values of "float" type and can be monitored using an SPC chart.

Figure 3:
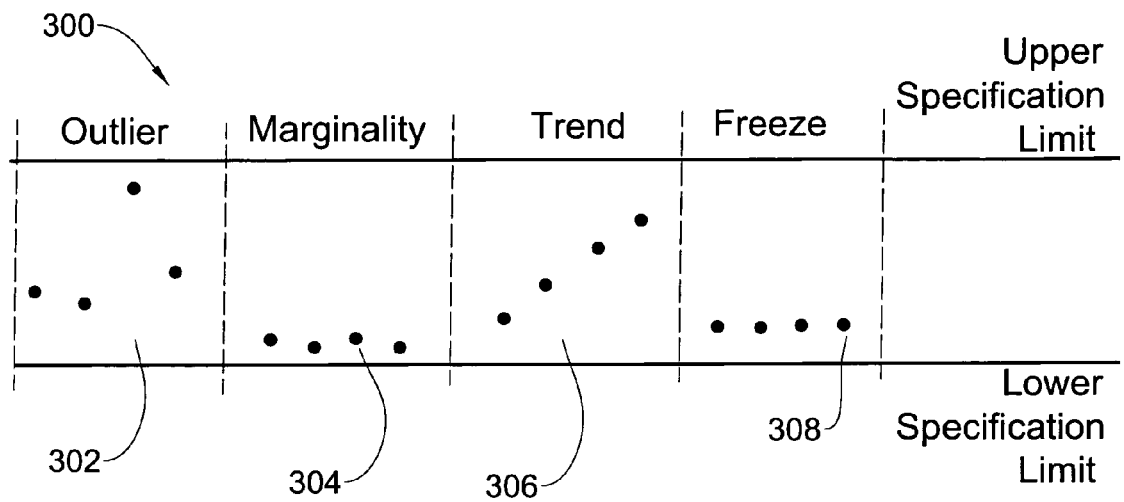
FIG. 3 is a statistical process control chart, according to an embodiment of the present invention.

FIG. 3 shows an SPC chart, according to an embodiment of the present invention. Identifying outliers 302, marginalities 304 or trends 306 can be done at unit, wafer or lot level. A freeze 308 is normally done at unit level. The "corrective action", at unit level if the rule is executed in real time, can be to alarm, retest the device, re-stress the device or "kill" it. Just like in Bin SPC, a rule executed offline can check & compare for the amount of outlier, trend, marginality or freeze occurrences per test equipment.

Test Time Reduction (TTR) may include rules such as skip die, skip test, optimize search limits, etc. Skipping a die without testing the die and assigning a bin based on conditions such as previous knowledge is a good example of a test time reduction technique. Another example is to skip a test (but not the entire test flow) based on conditions. Another example is to optimize the search window of a search test based on conditions. See further below in the description on how conditions can be examined when deciding whether and/or how to actualize rules.

Quality & Reliability improvement rules may include adding tests to the test flow, changing the stress characteristics for a stress test, changing the force value for a parametric test or changing the kill limits for a parametric test all based on previous knowledge. Controlling, via rules, the amount of retest allowed per unit or the amount of cleaning events allowed per probe-card during a specific timeframe are other examples of process quality control rules.

Post Processing & Disposition rules may include modifying the bin information for a specific device. For example, if a good unit is in an area where all other units are bad, the good unit can be "inked" and changed to bad. Additional rules may include modifying any unit attributes for next socket purposes (for example from Sort to assembly or from Sort to Burn-in).

In one embodiment some rules execute the test program as is while other rules modify test program parameters prior to execution if necessary as will be explained further below.

In other embodiments there may be other hierarchies beginning with the product.

In other embodiments, there may be a hierarchy of rules based on the test module, for example based on the tester, prober/handler or a combination of the tester and prober/handler. For example in one of these embodiments, the hierarchy may comprise (from top level downwards) the test module followed by the type of rule followed by the single entity (rule). Types of rules in this hierarchy can include inter-alia one or more of the following: temperature, alignment, vacuum, and clean counter.

In other embodiments, the hierarchy may be cross module and/or cross product, for example for offline production use. For example in one of these embodiments, the hierarchy may comprise (from top level downwards): socket/operation, followed by type of rule, followed by single entity (rule). Types of rules in this hierarchy can include inter-alia one or more of the following: yield, fleet, and operational.

In some embodiments a hierarchy structure may facilitate rule bundling stage 112. In one of these embodiments, rules which share at least one same category in a hierarchy of categories used to characterize the rules may be bundled together. In one embodiment rules for the same test program are bundled together. In other embodiments rules for the same product, for the same test module, for the same socket/operation, for the same rule-type, for the same family, for the same rule set version, etc., may be bundled together.

In one embodiment of the invention, correlation in stage 116 may be facilitated by a hierarchy structure. For example, in one embodiment only rules in a rule set which belong to the same family are checked for possible conflict and/or redundancy. As another example, in one embodiment, only rules which have been bundled together in the same rule set based on the hierarchy structure may be correlated against one another.

Unrelated to whether there is a hierarchy or not, the parameters of a rule may be defined in stage 104, through user input and/or automatically.

In some embodiments of the invention, the combination of parameters for a particular rule may or may not define an all or nothing rule. For example, the parameters of a rule may define conditions when a rule is to be actualized in stage 124 or not. In one of these embodiments, the conditions for actualizing a particular rule at a given point in time may include leveraging information including inter-alia past test results (for that particular rule and/or for other rules), fabrication "Fab" measurements, and/or the status of one or more other rules. Examples of past test results include inter-alia, etest test results (inline and end of line), other test socket results, other test results, previous lots and wafers, neighbors of various types (proximity, geography, lithography exposure, touchdown (parallel exposure), etc), and/or current die. For example, the leveraged information can include in one embodiment data relating to the same material from different operation(s) (lithography, defects and particles, etest (or parametric electrical testing), sort (or wafer probe test), burn-in, final Test, and System Validation, etc). As another example, the leveraged information can include in one embodiment data relating to different material (previous lot(s), wafer(s), die/dice, etc) from the same operation. In some cases invented assumptions may be leveraged as a substitute for actual test results, measurements and/or statuses, for example for simulation. For example, the repercussions of actions defined by a rule may be assumed (invented). In another of these embodiments, the conditions may instead or also include other aspects defined by the parameters (for example, population, entry conditions, action, validity conditions, run point, end point, scope, algorithm object, rule states, etc see below for more details). Below are given some examples of what can be leveraged, solely to aid the understanding of the reader. The examples should therefore not be construed as all-encompassing.

For example, Fab measurements that can be leveraged include one or more of the following inter-alia:

1. lithography—This defines the lithography exposure map per layer. Layers are divided into critical, semi-critical and non-critical. Depending on the fabrication process, there could be a few dozen layers.
   i. Usage: This information enables to define lithography related neighbors. These dice exhibit similar characteristics. For example, assume that there are nine dice in a lithography exposure (3×3) and there are maximum frequency (Fmax) measurements for five of them. The remaining four will generally have measurements very close to the five dice.
2. Defects & Particles—These are not test results per se but measurements that reflect the amount/density of defects/particles per wafer or per lithography exposure.
    i. Usage: A "cleaner" area on the wafer can be tested less aggressively whereas a "dirtier" area that is prone to defects will be tested more.

For example Etest results that can be leveraged include one or more of the following inter-alia:
1. In-line & End-of-line—These are test results. Electrical testing is performed on the scribe lines of the wafers (between the dice). The main purpose of this test socket is to check the health of the process and not the logic of each die. In-line Etest is performed inside the Fab during wafer fabrication before the wafer is completely fabricated (executed between various layers) whereas End-of-line Etest is performed after the wafer completed fabrication.
    i. Usage: Various Etest parameters correlate vary well to test parameters tested at Sort/Final Test. This (Etest) information can be leveraged to "fine tune" the tests at later sockets For example, other test socket results can include one or more of the following inter-alia:
1. Sort—Test socket executed while the wafer is still "intact". Sort may include multiple sockets or operations
2. Burn-in—Test socket executed after packaging that targets the reduction/elimination of infant mortality by inducing an elevated voltage & temperature at a given duration for the parts.
3. Final Test—Test socket executed after all units (or dice or devices) have been packaged. Final test may include multiple sockets or operations
4. System Validation—Test socket executed at system-level. The devices are put in "real systems" (motherboards, for example)

It should be noted that not all material must necessarily go through each socket (for example, System Validation in some cases is only executed on an X % of all material as an additional monitor)

Figure 44:
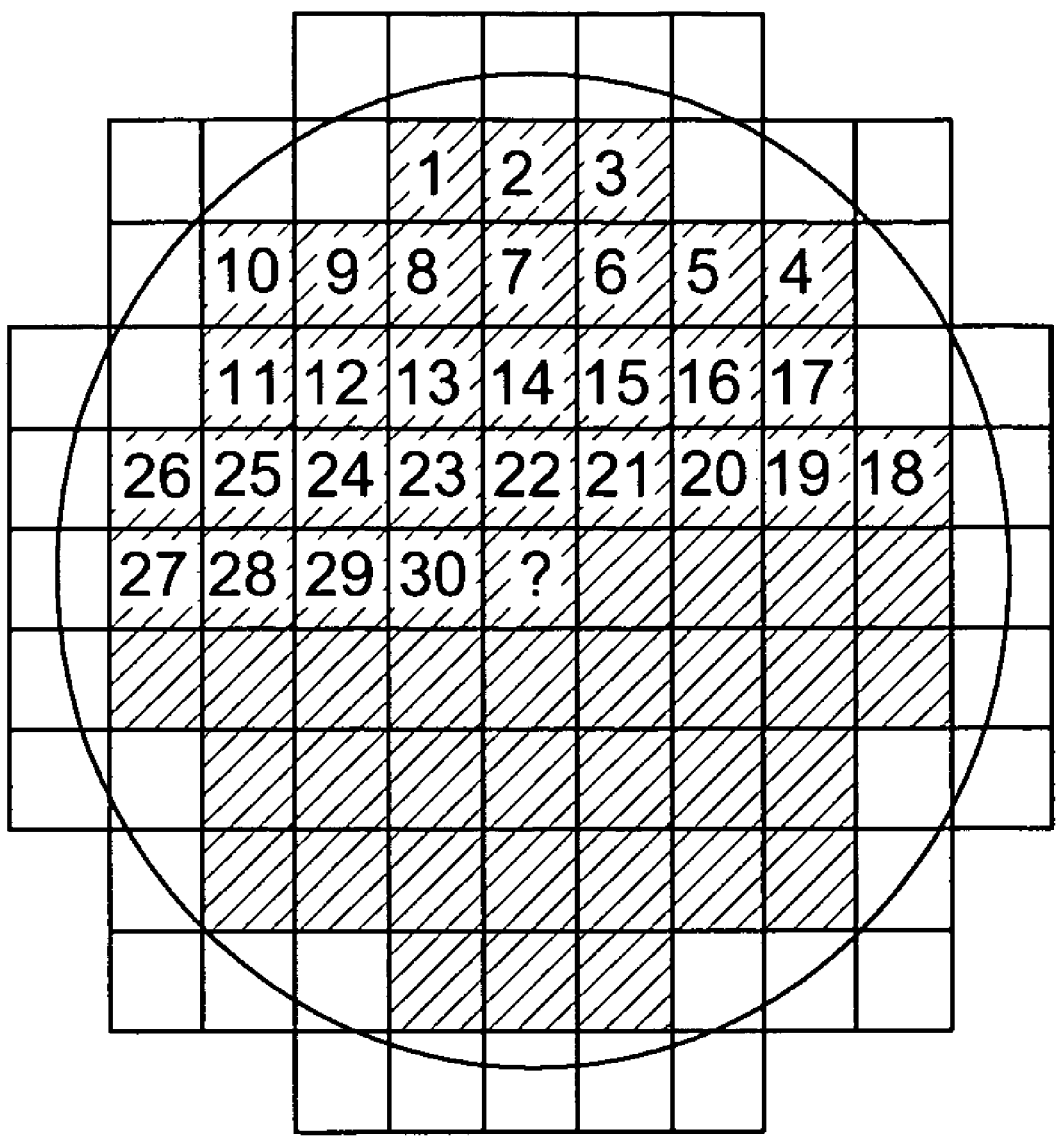
FIG. 44 is an illustration of shows the probing sequence on a wafer under test, according to an embodiment of the present invention.

Additional information (non-specific socket/operation related) which may be leveraged include one or more of the following inter-alia:
1. Test results that can be used include results from a previous test socket on the current material or from the same socket on previous material (or a combination)
    i. During Sort socket n of wafer x, the test results from Sort socket n−1 of wafer x can be leveraged.
        a. Data is leveraged for the "current die"
    ii. During Sort socket n of wafer x, the test results from Sort socket n (same socket) of wafer x−1 can be leveraged. For example, there are 25 wafers per lot and during Sort, the first 5 wafers are "zero yield", we can stop testing the remaining 20 wafers
    iii. Previous material may include lots, wafers or various types of neighbors
2. Neighbor types
    i. Proximity neighbors (with level of proximity—one die, two die, AKA radius)
    ii. Touchdown neighbors (parallel test)
        a. Dice within a touchdown
        b. Same die location in a touchdown across all touchdowns
        c. Proximity touchdowns—ones next to each other (same as die proximity)
    iii. Lithography exposure neighbors
        a. Dice within a exposure
        b. Same die location in an exposure across all exposures
        c. Proximity exposure—ones next to each other (same as die proximity)
    iv. "Z" neighbors—same X/Y location inside a wafer across wafers/lots in the same operation
        a. Can be added as an additional neighbor attribute to each of the above neighbor types: proximity, touchdown, lithography, etc.
    v. Checkerboard neighbors (with level—whole wafer, within a lithography exposure or within a touchdown)
    vi. Prediction neighbors (with two options). Refer to FIG. 44, which illustrates a probing sequence on a wafer under test, halfway through testing, according to an embodiment of the present invention. In this probing sequence, information from dice tested is used to define the testing for a die which has not been tested. In this example dice marked as 21, 22, 23 & 30 are prediction neighbors for the die in question.
        a. Prediction neighbor—right
            XXX
            ?X
        b. Prediction neighbor—left
            XXX
            X?
3. Geography Types
    i. May include rings, doughnuts, etc
    ii. Dice at fixed locations are typically although not necessarily not considered neighbors, this is a layer.
    iii. Different operations in some embodiments produce different layers.

It should be evident to the user that because system 200 allows definition of a rule so that actualization is conditional, customized (i.e. adaptive) rule actualization can occur if so desired. For example, in one embodiment, a rule is defined as an "if-then" statement so the rule will only be actualized when the "if" statement is satisfied.

The reader will understand that the reservoir of possible rules can be large, if so desired, without sacrificing the efficiency of the testing, because customization of the rules is possible with the invention.

The reader will also understand that a rule can be applied at any level, for example, to a particular test module, to a particular product type, to a particular lot, to a particular wafer, to a particular die, to a particular area within the die, etc. A rule may also or instead be applied to more than one of any of the following: module, product type, lot, wafer, die, area within a die, etc. A rule may also or instead be applied across products and/or modules.

Figure 4:
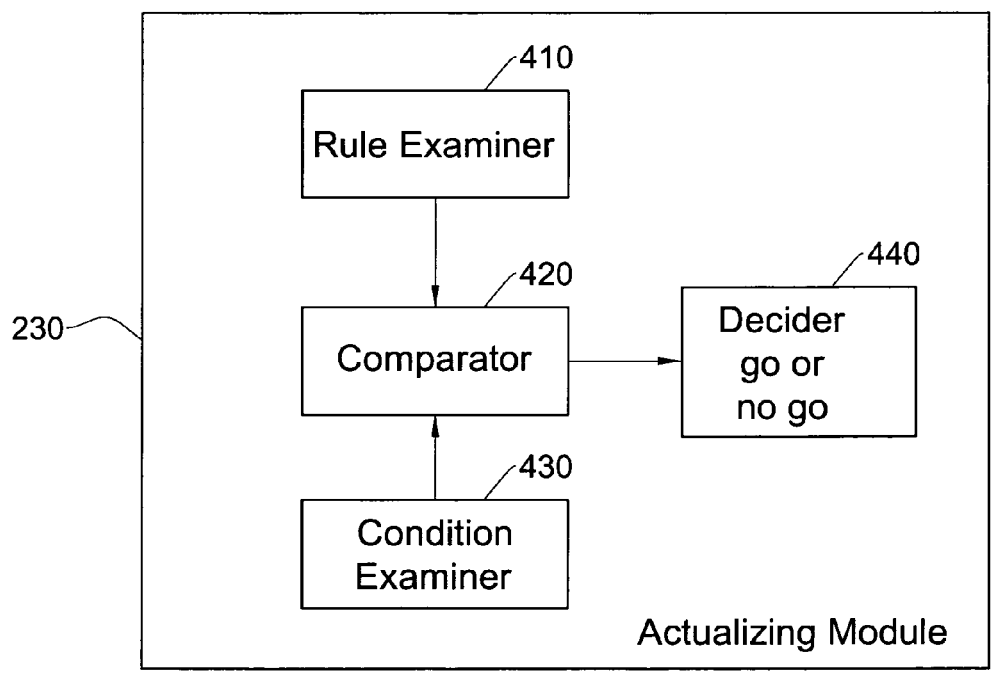
FIG. 4 is a block diagram of some components of an actualizing module, according to an embodiment of the present invention.

FIG. 4 illustrates a block diagram of some components of actualizing module 230, according to an embodiment of the present invention, configured to actualize a rule whose combination of parameters defined (in stage 104) a rule whose actualization is condition dependent. For simplicity purposes only those modules in actualizing module 230 relating to the condition dependency are shown in FIG. 4. The modules shown in FIG. 4 may comprise any combination of software, hardware and firmware that performs the functions as defined and explained herein. In other embodiments of the invention, the functionality of FIG. 4 may be provided by fewer, more and/or different modules than those shown in FIG. 4.

A rule examiner 410 examines a particular rule to see if there are any conditions which constrain the actualization of the rule. A comparator 420 determines if the condition(s) specified in the rule match the existing condition(s) determined by a condition examiner 430. If there is a match then decider 440 decides not to actualize the rule in stage 124 (or conversely if the rules define conditions when actualization should take place and there is a match then decider decides to actualize the rule in stage 124).

As an example of a rule whose actualization is conditional on the status of another rule (performed by the same actualization module 230), assume a first rule that performs a clean every time there is a CBL for a specific bin. The same rule also re-tests the string after the cleaning is performed. Assume also a second rule executed on the same actualizing module 230 (for example in real time) which states that the clean amount allowed per wafer or per lot is X. This second rule, triggered by the first rule counts the "clean" occurrences on each tester. In this example, rule examiner 410 when examining the second rule would see that the rule is conditional on the occurrence of the first rule, comparator 420 would determine if the first rule has occurred, and if yes, decider 440 would execute the second rule.

As an example of a rule whose actualization is conditional on the status of another rule (performed by a different actualization module 230), assume a first rule, executed in real time by a first actualization module, which checks for a consecutive bin string and performs appropriate actions, for example, retest or clean and retest. A second actualization module 230 receives data relating to the first rule and may perform a second rule for monitoring and comparing the amount of CBL occurrences per equipment entity, In this example, rule examiner 410 in the second actualization module when examining the second rule would see that the rule is conditional on the occurrence of the first rule, comparator 420 would determine if the first rule had occurred, and if yes, decider 440 would execute the second rule.

Figure 5:
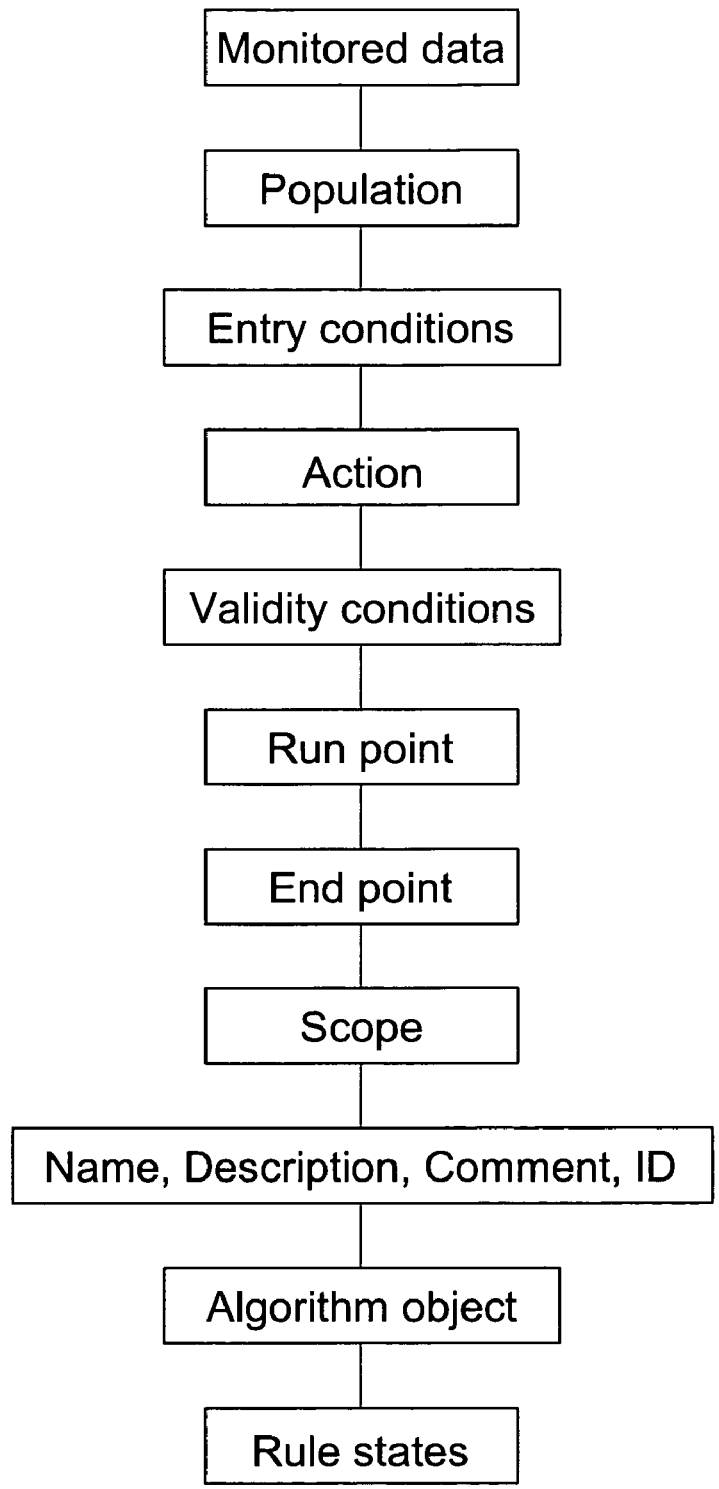
FIG. 5 is a list of possible parameters to be defined for a rule, according to an embodiment of the present invention.

Refer to FIG. 5 which shows possible parameters, inter-alia to be defined for a rule in stage 104, according to an embodiment of the invention.

The parameters may be considered building blocks of the rule. Depending on the embodiment some or all of the parameter names may or may not be visible to the user. In some embodiments some or all of the parameters are internal components. For example in one of these embodiments, the algorithm object and the rule states are invisible to the user, Some rules may include all parameters whereas other rules may include only a portion of the parameters. The parameters do not necessarily need to be entered in the order of the sequence illustrated and described here. All parameters are stated in the single form but should be understood to include the single or the plural form, as appropriate. The parameters illustrated in FIG. 5 are described here:

1. The monitored data—The information, if any that is being leveraged. For example, the monitored data can be defect density (Fab measurement), an Etest parameter, a bin result in the current operation (CBL case) or any other leverageable information described here and/or known to the reader. Additional description of possible leverageable information was provided above.
2. The population—The population includes the material set and level for which the rule is executed upon. The population can be an entire product, a given lot, wafer, die, area within a die, neighborhood, geography or any other set that can be predefined.
3. The entry condition—The entry condition may include exception conditions and can also be called include/exclude criteria for a given scenario and for the given population.
4. Rule action—The rule action defines what to perform if the rule criteria are met. Actions types include inter-alia actions performed during online production, during offline production, or outside of production (for example during simulation). Examples include inter-alia: Retest, Clean, Retest+clean, Alarm (Station Control and/or Engineering), Exclude Material/Area, Skip Die, Assign Bin, Assign Parameter, Test Program Related (Bypass/Execute a test, Change Upper/Lower Test Limit, Change Upper/Lower Search Limit, Change Force Value, Turn the Datalog On/Off, Update Global Variable, etc), Workflow Related (Resort, Hold, Scrap, "Tag", etc)
5. The validity condition—The validity condition is basically the condition that is checked between the rule calculation and rule action in order to validate that the rule is still applicable.
6. The run point—The run point is the event that triggers the rule. The rule will "calculate itself" when this event is raised. Examples include inter-alia: end of die, end of touchdown, end of wafer, end of lot, etc.
7. The end point—The end point is the event that the rule needs to be ready for. The rule must complete the "calculations" before this event is reached and must provide the instructions by the time the event is reached. Examples include inter-alia: start of die, start of touchdown, start of wafer, start of lot, etc
8. The scope of the rule—The scope is basically an "event timeframe" for the rule. The rule is "applicable" for this timeframe. Once the timeframe is completed, the rule will re-initialize itself (counters are reset). Examples include inter-alia: wafer, lot, etc.
9. The name, description, comment and rule ID
10. The algorithm object, which is basically the black box algorithm that is per rule type
11. The rule state—The rule state includes various internal flags (Rule States: Not entered, Invalid, Alltestpassed, Sometestpassed, Alltestfailed, Disabled, Skipped, Enabled & Idle)

For example a rule can state that if CBL bin 15 is greater than 3, then should clean and retest unless the lot is an engineering lot and not regular production. In this example, in one embodiment the run point could be defined as the end of the die, the end point could be defined as the start of the die, the scope could be defined as the wafer, the population could be defined as all units within all lots of this product, the monitored data could be defined as Bin 15, the exception condition could be defined as the "unless the lot is an engineering lot", and the action could be defined as retest and clean.

In other embodiments, less, more and/or other parameters can be defined than those illustrated in FIG. 5. In other embodiments, the parameters may be called differently than the names used in FIG. 5 (see below description of FIGS. 23 through 42). Depending on the embodiment the values of the parameters may be defined by user input, automatically or through a combination of user input and automatic assignment.

In some embodiments of the invention, not all parameters of a rule are specified conclusively in stage 104. For example in one of these embodiments, one or more parameters may be undefined and/or defined by a range of values. In one of these embodiments, the values of the parameters that were not defined or defined by a range of values is determined during actualization of the rule, stage 128, for example through simulation.

Figure 6:
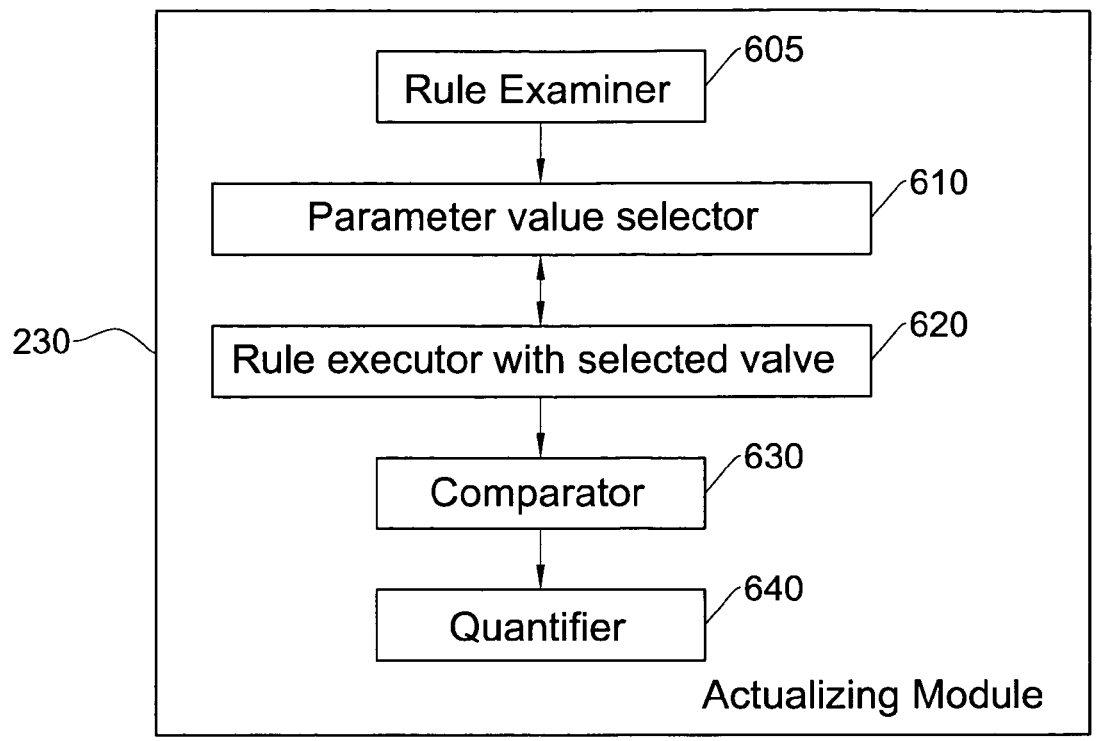
FIG. 6 is a block diagram of some components of an actualizing module, according to an embodiment of the present invention.

FIG. 6 illustrates a block diagram of some components of actualizing module 230, according to an embodiment of the present invention, configured to quantify one or more parameters in a rule which were undefined or defined by a range in stage 104. For simplicity purposes only those modules in actualizing module 230 relating to the quantification are shown in FIG. 6. The modules shown in FIG. 6 may comprise any combination of software, hardware and firmware that performs the functions as defined and explained herein. In other embodiments of the invention, the functionality of FIG. 6 may be provided by fewer, more and/or different modules than those shown in FIG. 6. In stage 124, once rule examiner 605 has identified the rule as having one or more unidentified parameters and/or parameters defined by a range, selector 610 selects one of the possible parameter values for each parameter which was undefined or defined by a range, where the selection can be of default values or using any suitable criteria. An executor 620 executes the rule with the selected parameter value(s). In some cases, there is a feedback from executor 620 to parameter value selector 610, for example if execution influences future selections. The feedback may be based for example on actual repercussions from the execution, or on assumed repercussions from the execution. In stage 130, a comparator 630 compares the results of the rule for executions with different selected values and a quantifier 640 quantifies the value for each parameter based on the comparisons, where the quantification can be in accordance with any suitable criteria. In another embodiment, the results of the rule using different values are stored and comparison and quantification occur outside of module 230, for example in rule creation module 210 or analysis module 260 (i.e. comparator 630 and quantifier 640 are separated from selector and executor 620). In one embodiment, the quantification of one or more parameters in a rule which were undefined or defined by a range occurs in an actualization module 230 configured for simulation.

In one embodiment of the invention where user input defines part or all of a rule, a user can choose a wizard which takes the user step by step through all possible rule categories and parameters. In another embodiment where user input defines part or all of a rule, a user can choose the order to fill out the rule categories and parameters.

In one embodiment, the user may sometimes during rule definition stage 104, define validation related criteria and/or correlation related criteria for a rule. For example, a user may tag a rule as being of high importance, so that in cases of conflict the rule will be prioritized if possible.

As mentioned above, some or all categories and/or parameters of a rule may be specified automatically rather than by the user. For example there may be rule categories and/or parameters which are standard to all testing environments and/or standard to the testing environment of system 200. In this case, there may be an embodiment where user input is not considered necessary for some or all categories and/or parameters and those categories and/or parameters for the rule may be defined automatically.

As another example, assume that a rule has been previously defined through user input and/or automatically and that based on follow up stage 130 of the rule, adaptation is considered desirable. In this example follow up stage 130 may include redefining rule (re-execution of stage 104), in some cases automatically.

As mentioned above, analysis module 260 can be used in stage 104 to define a rule in a format supported by rule set generator 210

In one embodiment of the invention, stage 104 (rule definition) may be skipped, for example if the rule has already been previously defined. The previously defined rule for example may be included in a rule library which comprises rules that were previously defined specifically for system 200 and/or generically (i.e. best known methods). Rule libraries can be public or private. In one embodiment, there may be separate rule libraries for different types of actualizing modules 230. As another example the definition of the rule may have been made during a previous run of stage 104 and therefore only one or more subsequent stages of method 100 need to be performed during this run of method 100 (using the previously defined rule).

Now will be described more details on some embodiments of rule validation stage 108 and the inter-relationship with other stages. In some embodiments rule validation may occur subsequent to rule definition stage 104. For example, defined rules may be checked for validity right after definition, or later, for example during rule correlation with respect to other rules (stage 116) or during rule actualization (stage 124). In other embodiments rule validation may occur at the same time as rule definition stage 104, for example by automatically defining valid rules and/or by constraining a user to define a rule which is valid. Depending on the embodiment, a valid rule may be a rule which is valid for at least one semiconductor test, or a valid rule may be a rule which is valid for a semiconductor test that can be performed in system 200. Depending on the embodiment, invalid rules may be prevented from being created (for example if stage 108 occurs at the same time as stage 104), may be corrected, may be discarded, may be reported, and/or may be treated in any way appropriate to system 200.

Figure 7:
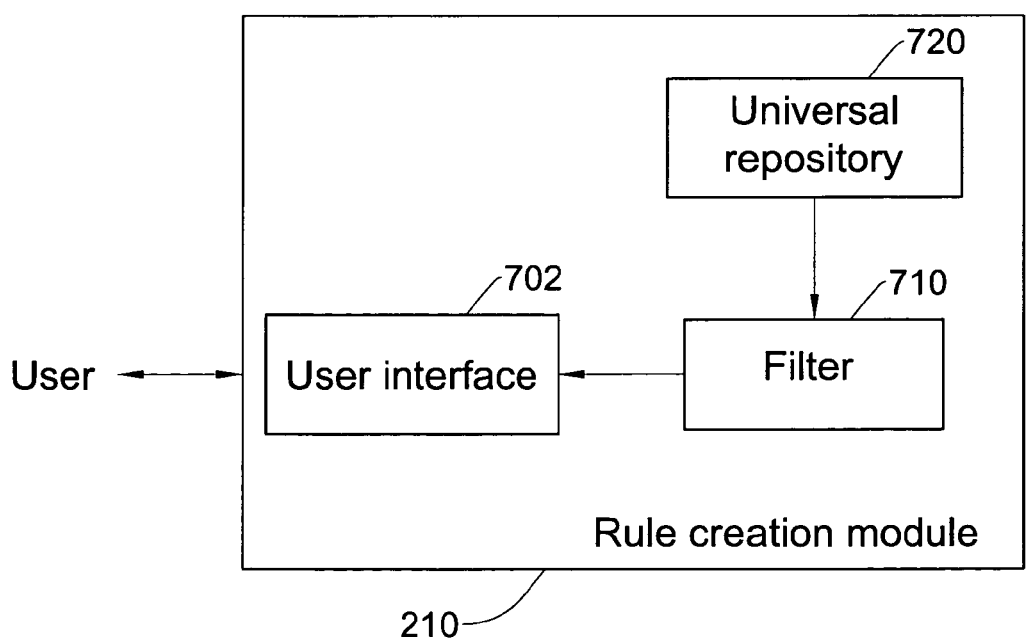
FIG. 7 is a block diagram of some components of a rule creation module, according to an embodiment of the present invention.
Figure 8:
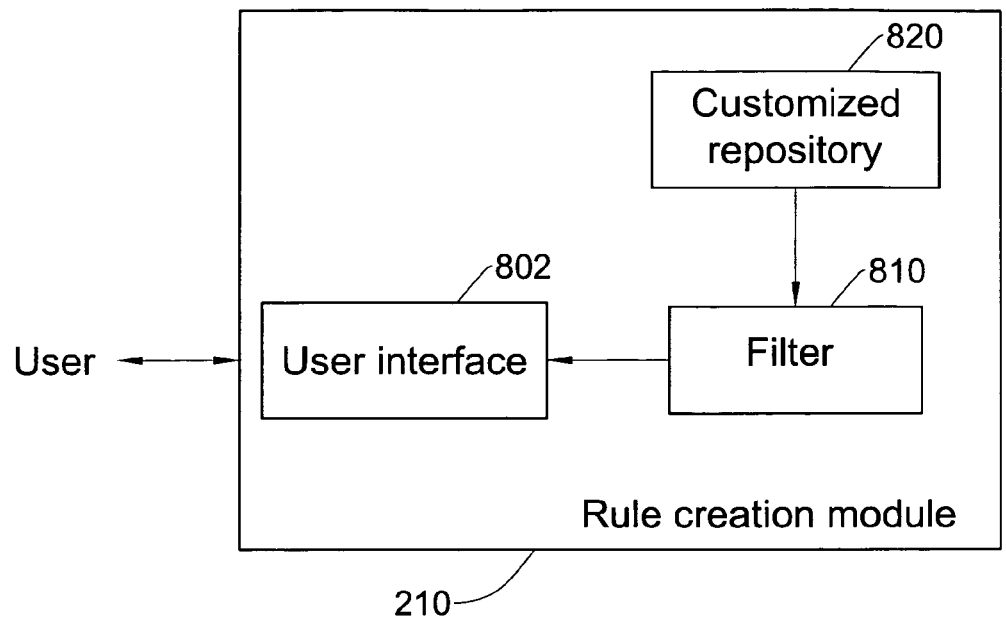
FIG. 8 is a block diagram of some components of a rule creation module, according to another embodiment of the present invention.

Assume for the purposes of further illustration through FIGS. 7 and 8, embodiments where stage 108, validation of a rule, occurs at the same time as stage 104, rule definition, and that a user is constrained to define a rule which is valid.

Refer to FIG. 7, which illustrates some components of rule creation module 210, according to an embodiment of the present invention. Only those modules in module 210 which illustrate the rule validation functionality described here are shown for simplicity sake. The modules shown in FIG. 7 may comprise any combination of software, hardware and firmware that performs the functions as defined and explained herein. In other embodiments of the invention, the functionality of FIG. 7 may be provided by fewer, more and/or different modules than those shown in FIG. 7. In the illustrated embodiment, a user is presented through user interface 702 with a predefined list of choices when defining a rule in stage 104. For example the choices can be related to the allowed values of categories in a hierarchy and/or to the allowed parameters for the rule itself. In the illustrated embodiment, a universal settings repository 720 includes, inter-alia, all known category values and/or parameters. For example repository 720 can include inter-alia: Products (Name, ID, Type), Test Socket (Name, ID, Type), Test Programs (Name, ID, revision, parent product, test module), Bins (Name, ID, group), Parameters (Name, ID, type), Test Modules (Names, ID's of Tester types, Prober types, Handler types), Geographic layers (Name, ID, data type (value or Boolean), layer type (test or non-test), parameter), Lot flags (engineering, excursion), and Actions (per module type)

An optional filter 710, filters the choices from repository 720 presented to the user based on previous choices made by the user. For example assuming a hierarchy as in FIG. 3, if the user had previously selected a particular product then only those sockets valid for the previously selected particular product are presented as choices to the user. As another example, if the user is defining parameters of a particular rule, only those parameters which are valid to the particular rule are presented as choices to the user. If only one choice is available, for example there is only one allowed value for a particular category and/or parameter, in one embodiment the sole allowed value may be pre-selected (without requiring user verification) or may be presented to the user for verification.

Refer to FIG. 8, which illustrates some components of rule creation module 210, according to another embodiment of the present invention. Only those modules in module 210 which illustrate the rule validation functionality described here are shown for simplicity sake. The modules shown in FIG. 8 may comprise any combination of software, hardware and firmware that performs the functions as defined and explained herein. In other embodiments of the invention, the functionality of FIG. 8 may be provided by fewer, more and/or different modules than those shown in FIG. 8. In the illustrated embodiment, a user is presented through user interface 802 with a predefined list of choices when defining a rule in stage 104. For example the choices can be related to the allowed values of categories in a hierarchy and/or to the allowed parameters for the rule itself. In contrast with the embodiment illustrated in FIG. 7, in FIG. 8 a customized settings repository 820 includes category values and/or parameters customized to system 200. For example, the category values and/or parameters in repository 820 may vary depending on the characteristics of actualizing module 230. For example repository 820 can include: Products (Name, ID, Type), Test Socket (Name, ID, Type), Test Programs (Name, ID, revision, parent product, test module), Bins (Name, ID, group), Parameters (Name, ID, type), Test Modules (Names, ID's of Tester types, Prober types, Handler types), Geographic layers (Name, ID, data type (value or Boolean), layer type (test or non-test), parameter). Lot flags (engineering, excursion), and Actions (per module type).

An optional filter 810, filters the choices from repository 820 presented to the user based on previous choices made by the user. For example assuming a hierarchy as in FIG. 3, if the user had previously selected a particular product then only those sockets valid for the previously selected particular product and the particular system 200 are presented as choices to the user. As another example, if the user is defining parameters of a particular rule, only those parameters which are valid to the particular rule for that particular system 200 are presented as choices to the user. If only one choice is available, for example there is only one allowed value for a particular category and/or parameter, in one embodiment the sole allowed value may be pre-selected (without requiring user verification) or may be presented to the user for verification.

In other embodiments, rule validation 108 may be skipped, for example if a-priori it is known that the rule is valid. As another example the discovery and resolution of invalid rules may be deferred to stages 124 and/or 130 (actualizing, and/or follow up)

Some embodiments of stage 112, bundling together the rules, will now be discussed. As mentioned above, in embodiments with a hierarchy, rule bundling may be facilitated. In one of these embodiments, rules which share at least one category in the hierarchy may be bundled together in one of these embodiments. For example, bundling may be based on the test program in a product hierarchy, and/or based on the test module in a module hierarchy. As another example, rules sharing the same product and/or test module may be bundled together.

In one embodiment, rule bundling 112 may instead or also be dependent on the (destination) type of actualizing module 230. For example, if the rule is to be actualized in real time production, the rule may be bundled with rules also to be actualized in real time production. As another example, if the rule is to be actualized in offline production, the rule may be bundled together with rules also to be actualized in offline production.

In one embodiment, rule bundling 112 may instead or also be based on the trigger of the rule. For example, all rules which relate to the same monitored data may be bundled together.

In some embodiment rule bundling stage 112 may be skipped, for example if only a single rule is to be actualized, for example by simulation.

Some embodiments of stage 116, correlation of the rule with respect to other rules, will now be elaborated on in conjunction with other inter-related stages. The rule can be analyzed in conjunction with one or more other rules ("correlation rule set") to determine redundancy, priority, conflicts between actions, conflicts between rule types, other conflict, inconsistency, inter-dependence, validation with repositories, validation with other limitations, timing execution, or any other relationship with other rules.

Figure 9:
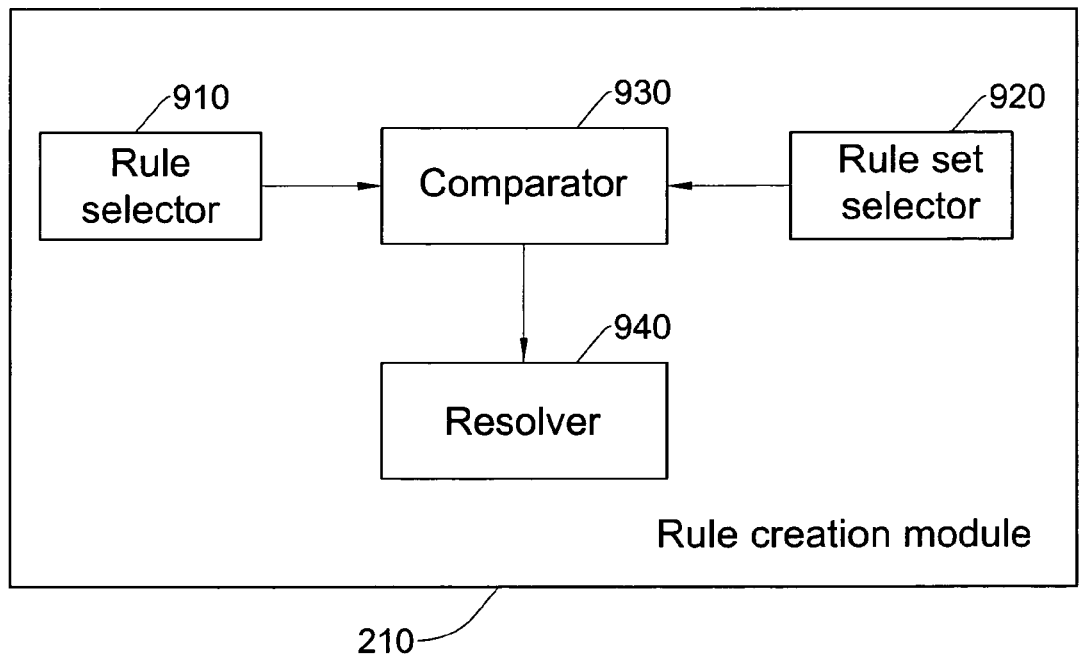
FIG. 9 is a block diagram of some components of rule creation module, according to an embodiment of the present invention.

FIG. 9 illustrates some components of rule creation module 210 having correlation functionality, according to an embodiment of the present invention. Only those modules in module 210 which illustrate the correlation functionality described here are shown for simplicity sake. The modules shown in FIG. 9 may comprise any combination of software, hardware and firmware that performs the functions as defined and explained herein. In other embodiments of the invention, the functionality of FIG. 9 may be provided by fewer, more and/or different modules than those shown in FIG. 9.

A rule selector module 910 selects a rule to be correlated against one or more other rules. Depending on the embodiment, a single rule may be correlated against a single other rule, a single rule may be correlated against a plurality of other rules, a plurality of rules may be correlated against a single other rule, a plurality of rules may be correlated against a plurality of other rules, etc. In the description below, it is assumed that the correlation is against a correlation rule set which includes at least one rule. Depending on the embodiment all rules may be correlated against other rules or only certain rules which satisfy predetermined criteria may be correlated against other rules. A rule set selector 920 selects the correlation rule set against which the selected rule will be correlated. Depending on the embodiment, the correlation rule set against which the analysis is performed for the rule can be for example: some or all of the other rules in the bundled rule set including the rule, some or all of the rules (which relate to the rule) but which are comprised in a bundled rule set destined for a different actualization module than the rule, some or all of the rules in one or more rule libraries, some or all of the rules which share one or more of the same categories as the rule, and/or any other group of rules. For example, in one embodiment, the correlation rule set for a rule to be actualized in real time production/simulation may include some or all of the rules in the bundled rule set including that rule as well as rules in a bundled rule set for offline production which relate to that rule.

In some embodiments, there is a fixed correlation rule set meaning that each rule in the correlated rule set is correlated only against each other rule in the correlated rule set, whereas in other embodiments the correlation rule set is determined separately for each rule. A comparator 930 compares the selected rule against the correlation rule set for one or more specific criteria and a resolver 940 resolves any issues relating to the relationship of a rule with one or more rules in the correlated rule set.

For example, in one embodiment, comparator 930 may examine the selected rule against the correlation rule set for one or more criteria, inter-alia, which are listed below and illustrated with more examples in the following paragraphs:
1. Redundancy
2. Priority
3. Conflicts between actions—rule types
   a. Machine rules
   b. Statistical process control rules
   c. Test time reduction rules
4. Conflicts with types
   a. Per "strength"—"Critical" (protect hardware), "Backward actions" and "Forward actions"
5. Other Conflicts
6. Inconsistency
7. Interdependency
8. Timing execution (kill rule at next event, kill rule and reset the counters, continue and finish calculation)

In order to aid the reader in further understanding the above listed criteria, and how resolver 940 in some embodiments resolves issues relating to the above criteria, further examples are now provided.

For example assume there are at least two rules, at least one of which is redundant, for example because the rules are identical or because one rule encompasses the other(s). Continuing with this example the two rules can refer to CBL greater than 3 and CBL greater than 5 respectively so the latter CBL greater than 5 rule would be redundant because the latter rule would never be triggered. In this case, resolver 940 may resolve to discard the redundant rule(s), report the redundant rule(s), or perform any other appropriate action.

In one embodiment in stage 116, resolver 940 determines priority criteria for resolving conflicts among correlated rules. In some cases, priority is driven by actions and/or by rule type. For example, actions to stop testing (the test module) may in some cases be prioritized over actions to continue testing and/or over any other actions. As another example, rules that have backwards actions that require going back to retest a device may be in some cases prioritized over rules that have forward actions that require going on to the next device, because the former rules may change the entry criteria for other rules. As another example, SPC rules may in some cases be prioritized over TTR rules (if not prioritized already) because SPC rules may impact on process health. In another embodiment, priority criteria may have also or instead been defined by a user during rule generation in stage 104, as mentioned above.

Other conflicts between rules (not necessarily among rule actions and/or rule types) may also be resolved by resolver 940.

Resolver 940 may also resolve any inconsistency between a rule and the correlated rule set. For example, assume an embodiment where the correlated rule set includes the rules with which the rule had been bundled in stage 112, and where the rule is targeted towards one type of actualizing module 230 while the other rules with which the rule has been bundled relate to a different type of actualizing module 230. In this embodiment, resolver 940 may rebundle the rules according to type of actualizing module, may eliminate the inconsistent rule, may report the inconsistent rule, or may perform any action suited for the inconsistency. In another embodiment, rule creation module 210 would not allow a bundling together in stage 112 of rules relating to different types of actualizing modules 230.

As another example, assume there is an inconsistency between a rule and one or more other rules, which does not allow the rules to all be executed. For example, one rule may provide an opposite action to the same event. Continuing with this example one rule may provide for the action of skipping to the next die and a second rule may provide for the action of retesting the previous die. In this case, resolver 940 may resolve to select among the conflicting rules according to predetermined criteria (which can be system defined and/or user defined), to prioritize among the inconsistent rules, to report the inconsistency, or to perform any other appropriate action.

In some cases, rules may be inter-dependent in that one rule may require information from other rules. For example the CBL occurrences per entity rule requires information from the CBL rule. As another example there may be a dependency tree of rules so that rules which are dependent on other rules are executed after those other rules. For example, control rules may in some cases be tagged by resolver 940 (if not tagged already) so as to be actualized before the rules which reference the control rules so that the result of the control rules will be ready when needed.

As an example of timing execution, if a rule calculation takes more time than the time allowed, the rule may in one embodiment be removed by resolver 940. Continuing with the example, assume during sort test, some rules are calculated between the testing of dice during what is called the "indexing time", the time it takes the prober to "go to" and "touch" the next die. The indexing time frame is fixed and some rules need to complete calculation before the actions need to be made.

In one embodiment, rule correlation stage 116 may be skipped, for example if the discovery and resolution of issues regarding relationships among rules are instead deferred to stages 124 and/or 130 (i.e. actualizing and/or follow up).

Some embodiments of publication, stage 120, will now be discussed. In one embodiment, rule publication includes the preparation for transfer of the rule, for example as part of a rule set, to the targeted actualizing module 230.

The reader will understand that as part of the preparation for transfer of the rule, the rule may be required to undergo changes so as to be executable by the targeted actualizing module 230. The targeted actualizing module 230 should be able to understand the rule so as to provide the rule with services and relevant data and to execute the rule.

As another example assume that rule creation module 210 includes templates which are rule descriptors bound to a user interface. For example the templates can be written using dynamic link library dll. These templates can be translated into code, rule or xml format prior to being passed to actualizer module 230. In one embodiment it is advantageous that perl-like post processing scripts executed on datalogs do not need to be used. Further below some examples of GUIs which show templates of rules will be elaborated on.

In one embodiment of the invention, in publication stage 120, the confidence level of publishing is enhanced through a process which may be universal or customized to system 200. The process can include procedures such as buddy-check, documentation, change control process, etc.

In some embodiments, rule publishing stage 120 may be skipped, for example if no preparation for transfer to the particular type actualizing module 230 is required.

In some embodiments, method 100 ends and actualizing (stage 124) and follow up (stage 130) occur elsewhere than in system 200. In other embodiments, actualizing stage 124 occurs elsewhere than in system 200 and method 100 picks up with follow up stage 130.

In some embodiments, definition stage 104 through rule publication stage 120 occur elsewhere than in system 200 and method 100 for system 200 begins with actualizing stage 124.

Some embodiments of rule actualization, stage 124, will now be elaborated upon.

Figure 10:
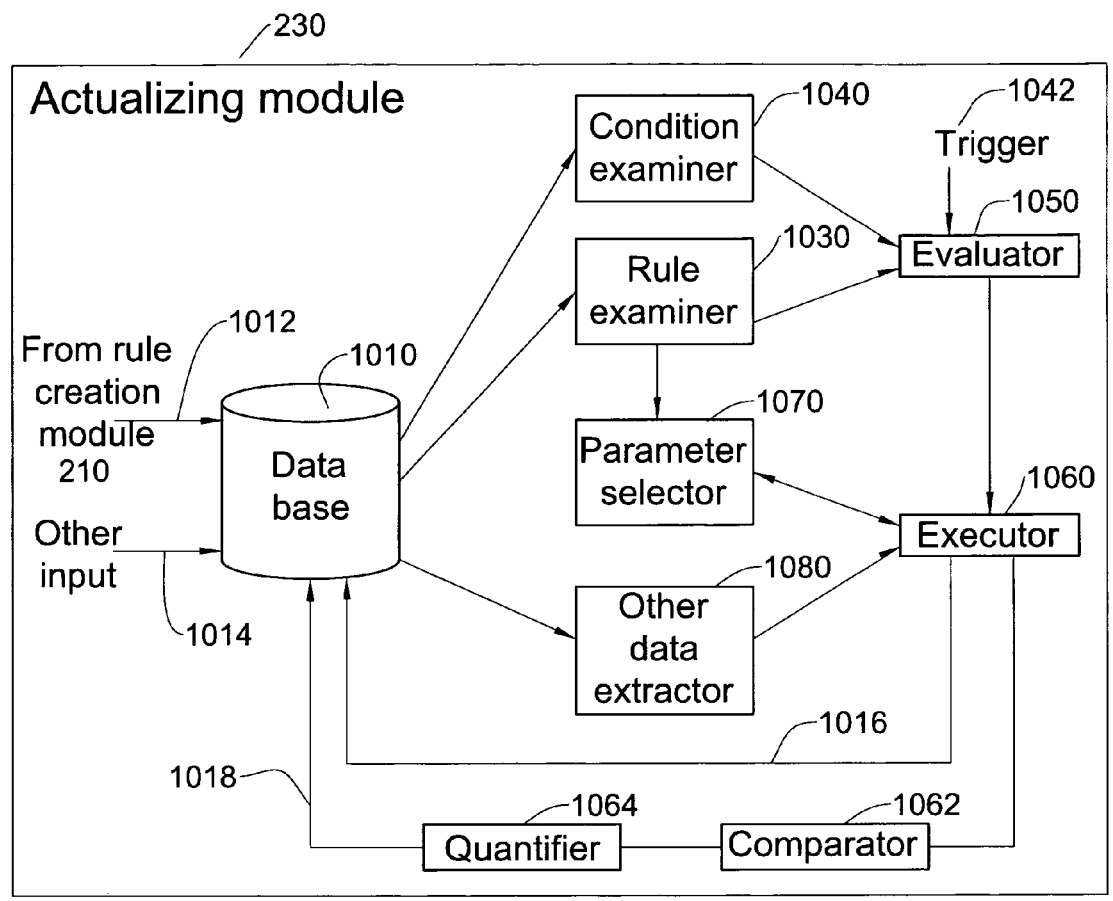
FIG. 10 is a block diagram of an actualizing module, according to an embodiment of the present invention.

FIG. 10 illustrates actualizing module 230, according to an embodiment of the present invention. The modules shown in FIG. 10 may comprise any combination of software, hardware and firmware that performs the functions as defined and explained herein. In other embodiments of the invention, the functionality of FIG. 10 may be provided by fewer, more and/or different modules than those shown in FIG. 10. In addition or instead, depending on the type of actualizing module 230 used, less, more and/or different functionality may be provided than the functionality provided by the modules shown in FIG. 10. For example, in one embodiment in some types of actualizing modules 230, parameter selector 1070, comparator 1062 and quantifier 1064 may be omitted.

Database 1010 includes information 1012 received from rule creation module 210. Information 1012 from module 210 can include for example, the published rule or rule set, settings from universal repository 720 or customized repository 820, or a subset of the settings from universal repository 720 or customized repository 820, parameter value range where the optimal value has not been defined for a rule, etc. Some or all of information 1012 may have been received subsequent to publication stage 120 and/or at an earlier point of time. For example, in one embodiment, settings and/or other data that have been previously transferred to actualizing module 230 are not necessarily re-transferred whenever a new rule set is published.

Depending on the embodiment (and/or the type of actualizing module 230), database 1010, information 1012 from creation module 210 can include less or more information. For example in one embodiment, information 1012 includes all the information to which rule creation module 210 has access. In another embodiment, information 1012 includes all the information to which rule creation module 210 has access, which relate to products for which rules are actualized by actualizing module 230. In another embodiment, information 1012 includes all the information to which rule creation module 210 has access, which relate to the published rule set/rule. In another embodiment, information 1012 may include less information than listed above. For example, in some of these embodiments, when actualizing module 230 is used in real time production less data is stored within actualizing module 230 in order to increase the speed of real time testing. In one of these embodiments, for example, for each current lot database 1010 may receive from rule creation module 210 only the information 1012 related to the current lot and the previous lot which is necessary to execute the current rule set/rule in real time production.

Database 1010 can also include instead or in addition any other information which is useful for actualization of rules, for example leverageable data (actual or invented), data related to parameters, etc. As explained above, conditions for actualizing a particular rule at a given point in time may be defined inter-alia in terms of the leverageable data and/or other data related to parameters. This other information stored in database 1010, may have been inputted as information 1012, other input 1014, output 1016 from an executor, and/or output 1018 from a quantifier 1064, depending on the source of the other information. For example, in one embodiment test results from previous execution of one or more rules by actualizing module 230 may be received as other output 1016, whereas test results from previous executions by a different actualizing module 230, FAB measurement, analysis and offline algorithm results may be received as other input 1014 and/or as information 1012 from rule creation module 210. As another example, in one embodiment, input 1014 can include assumptions (inventions) of test results, measurements and/or statuses, which are provided for example when actualizing module 230 is a simulator. Continuing with the example input 1014 can include in one embodiment assumptions (inventions) of repercussions of actions. (In another embodiment, actualizing module 230 may instead or in addition be provided with invented assumptions which are not inputted, for example through generation of the assumptions within the actualizing module 230). As another example, in one embodiment stored parameter values may be received as information 1012 from rule creation module 210 and/or as output 1018 from quantifier 1018 (if the parameter had been undefined or defined by a range by rule creation module 210).

In one embodiment, database 1010 or a part thereof is in the form of a data access layers DAL, details of which are provided further below with reference to FIGS. 15 to 17.

Inputs 1012, 1014, 1016 and/or 1018 1016 may in some cases have undergone loading and converting prior to being stored in database 1010, as appropriate to the particular structure of database 1010.

In the illustrated embodiment, a rule for which actualization is desired is extracted from database 1010, for example by a rule examiner 1030 (which in some embodiments may include the functionality of rule examiner 410). If actualization of the rule is condition dependent, then a condition examiner 1040 (which in some embodiments may be identical to condition examiner 430) extracts from the database the relevant conditions. An evaluator 1050 (which in some embodiments may be identical to comparator 420) evaluates the rule in relation to the conditions examined by condition examiner 1040. The results of the evaluation are used by an executor 1060 (which in some embodiment may include the functionality of decider 440) in execution. For example, assuming there are conditions which define when a rule can be executed, based on the evaluation of whether the conditions required for the rule are present, executor 1060 may decide whether to execute the rule or not. In addition or instead, evaluator 1050 may receive triggers 1042 occurring during real time production or offline production or which are assumed (during simulation). Examples of triggers 1042 include inter-alia: start/end of die, start/end of touchdown, start/end of wafer, start/end of lot, start/end of test, time schedule. Based on an evaluation by evaluator 1050 relating to the trigger 1042, for example regarding how trigger 1042 affects the rule, executor 1060 may or may not execute an appropriate action.

In one embodiment, executor 1060 may execute one or more of the following actions inter-alia based on the evaluation by evaluator 1050: Retest, Clean, Retest+clean, Alarm (Station Control and/or Engineering), Exclude Material/Area, Skip Die, Assign Bin, Assign Parameter, Test Program Related (Bypass/Execute a test, Change Upper/Lower Test Limit, Change Upper/Lower Search Limit, Change Force Value, Turn the Datalog On/Off, Update Global Variable, etc), Workflow Related (Resort, Hold, Scrap, "Tag", etc).

If the rule is not condition dependent and there is no trigger 1042, then the rule may in some cases be passed directly to executor 1060, bypassing evaluator 1050.

Executor 1060 may also or instead receive other data extracted by an extractor 1080 which allows proper execution of the rule, for example settings necessary for correct execution. In one embodiment for example a setting indicating the number of dice per wafer for the product to be tested may be provided to executor 1060.

In some embodiments, executor 1060 is configured to perform on line calculations as needed for executing a rule.

In some embodiments of actualizing module 230, actualizing module 230 may actualize a rule with undefined parameter values or a range of values, for example during simulation. In one of these embodiments rule examiner 1030 (which in some cases may include the functionality of rule examiner 605) may also be configured to identify a particular rule as having undefined parameter values or parameters defined by a possible range of values. In this case, parameter selector 1070 (which in some embodiments may be identical to parameter value selector 610), selects one of the possible parameter values for each parameter which was undefined or defined by a range, where the selection can be of default values or using any suitable criteria. Executor 1060 (which in some embodiment may include the functionality of executor 620) executes the rule with the selected parameter value(s). In some cases, there is a feedback from executor 1060 to parameter value selector 1070, for example if execution influences future selections. In one embodiment, comparator 1062 and quantifier 1064 are separated from executor 1060 and the results 1016 of the rule using different values are stored in database 1010 with comparison and quantification occurring outside of the same module 230, for example in analysis module 260 or in rule creation module 210. In another embodiment, comparator 1062 (which in some cases may include the functionality of comparator 630) and quantifier 1064 (which in some cases may include the functionality of quantifier 640) are included in actualizing module 230. In this other embodiment comparator 1062 compares the results of the rule for executions with different selected values and quantifier 1064 quantifies the value for each parameter based on the comparisons, where the quantification can be in accordance with any suitable criteria and the quantified values 1018 are stored in database 1010.

As mentioned above, rule actualizing stage 124 may be skipped, for example if rule actualizing occurs elsewhere than in system 200.

Some embodiments of follow up stage 130 will now be discussed. As mentioned above, follow up stage 130 can include any of the following inter-alia: analysis of the actualization, doing nothing/ending method 100, adapting the rule, tagging the rule, discarding the rule, reporting on the rule, optimizing the rule, continuing to actualize the rule or an adapted version of the rule using the same type of actualizing module 230, actualizing the rule or an adapted version of the rule on a different type of actualizing module 230, monitoring results of the rule, repeating one or more stages of method 100, etc. The means for performing follow up stage 130 in any particular embodiment can comprise any combination of software, hardware and/or firmware capable of performing the follow up required in that particular embodiment. The means for performing follow up 130 can be comprised in rule creation module 210, analysis module 260 and/or actualizing module 230, depending on the embodiment.

In one embodiment, follow up stage 130 can be skipped and method 100 ends after actualization stage 124.

Figure 11:
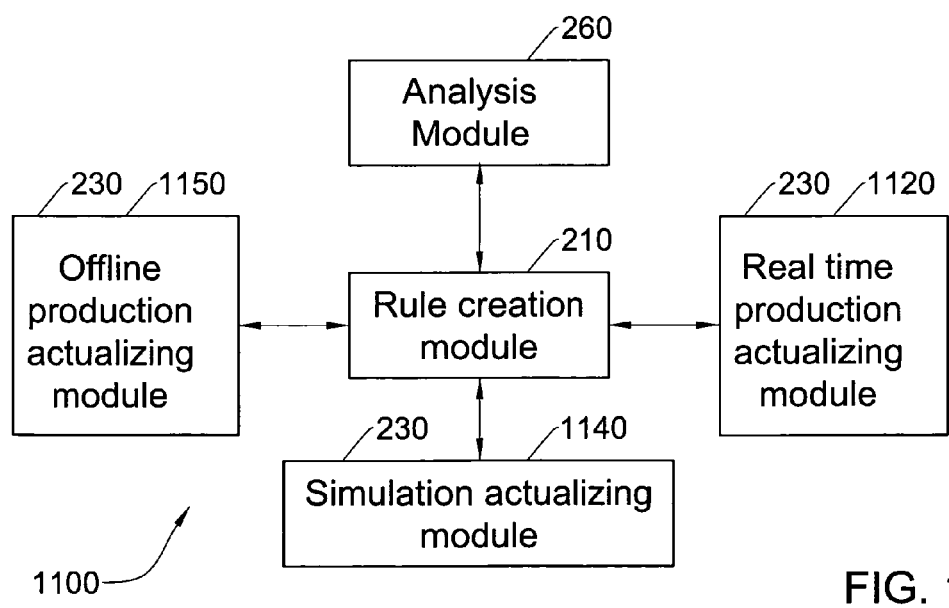
FIG. 11 is a block diagram of a system for semiconductor testing, according to an embodiment of the present invention.

In order to better understand, the different possibilities for follow up stage 130, refer to FIG. 11 which shows a system 1100 for semiconductor testing which is one possible example of system 200, according to an embodiment of the present invention. System 1100 includes rule creation module 210, analysis module 260 and one or more of the following actualizing modules 230: one or more offline production actualizing module 1150 where the rule is actualized offline in production, one or more real time production actualizing module 1120 where the rule is actualized in real time in production, one or more simulation actualizing module 1140 where the rule is simulated. In one embodiment rules created by rule creation module 210 are published to one or more of actualizing modules 1120, 1140 and/or 1150, for example in publishing stage 120 discussed above. For ease of description it is assumed below that at most one of each type of offline actualizing module 1150, real time production actualizing module 1120, and simulation actualizing module 1140 are present in system 1100, however it should be evident that in other embodiments more than one of one or more types may be present.

Each of the modules shown in FIG. 11 can be made up of any combination of software, hardware and/or firmware that performs the functions as defined and explained herein. In other embodiments of the invention, system 1100 may comprise fewer, more and/or different modules than those shown in FIG. 11. For example, depending on the embodiment, there may be zero, one, two, or all three types of actualizing modules 1120, 1140, and 1150. As another example, in one embodiment there may be one or more other types of actualizing modules in addition to or instead of actualizing module types 1120, 1140, and 1150. As another example, in some embodiments there may be no rule creation module 210 and one or more of actualizing module types 1120, 1140, and 1150 may actualize rules developed elsewhere and/or in analysis module 260. As another example, in one embodiment no analysis module 260 may be included and one or more of actualizing module types 1120, 1140, and 1150 may actualize rules developed by rule creation module 210 and/or elsewhere. The modules of system 1100 may be centralized in one location or dispersed over more than one location. In some embodiments, the functionality of one or more modules in system 1100 may be located in the same enclosure. For example in one of these embodiments the functionality of simulator 1140 and analysis module 260 may be integrated. As another example, in one of these embodiments the functionality of rule creation module 210, offline production module 1150, simulation actualizing module 1140 and analysis module 260 may be located on the same server.

In some embodiments, one or more modules of system 1100 are connected by a local area network LAN or through any other appropriate communication network. In one of these embodiments, communication between modules is via rule creation module 210. In another of these embodiments, communication between two or more modules of system 1100 may be direct without necessarily going through rule creation module 210.

As mentioned above follow up stage 130 can include in some cases analysis of actualization. (In other cases, analysis may be skipped, for example if analysis is deemed unnecessary because the results of the actualization are already known or can not be done.). The analysis can be of the rule and/or of a rule set including the rule. For simplicity of description, analysis of the rule is described here, but it should be understood that mutatis mutandis the description also applies to analysis of the rule set. In one embodiment the means for performing the analysis is comprised in analysis module 260. In other embodiments, analysis may be performed in module 210, 230 and/or outside system 200 may perform the analysis. Analysis can include determining any of the following inter-alia based on the actualization: whether the rule provides for a correct test(s), whether the rule provides for a necessary test(s), whether the rule provides for an optimal test(s), whether there a better rule that can replace the analyzed rule, the advantages of the rule, the disadvantages of the rule, the return on investment of the rule, the expected testing results using the rule, etc.

For example, if a test defined by a rule always is passed, in one embodiment the rule may be determined to be unnecessary. As another example, if a test defined by a rule always fails, in one embodiment the rule may be determined to be incorrect. As another example, in one embodiment more than one rule may have been simulated in stage 124 (using simulation actualizing module 1140) based on historic information and the optimal and/or better rule may be determined as part of an analysis in stage 130 based on predefined criteria. As another example, in one embodiment a rule may have been simulated in stage 124 using historic information, and as part of the analysis 130 one or more return on investment criteria may be developed which allows monitoring of quality and/or efficiency, and/or allows for continuous improvement. Still continuing with the example, later, after actualization 124 of the same rule during production has occurred, an analysis 130 may be made of the return on investment achieved using current results, comparing the achieved return on investment to the return on investment criteria developed during earlier simulation.

Examples of possible return on investment ROI criteria include inter-alia: yield loss prevention, test time reduction, quality improvement, reliability augmentation. test escape prevention, test fleet health, and statistical process control. To further illustrate the ROI concept, some possible examples inter-alia of the listed ROI are now provided.

In one embodiment yield loss prevention can include for example defining which dice should be re-tested (including in some cases resorting the dice) due to an xBL rule (i.e. CBL, TBL or SBL) so that the amount of "die gain" (dice that will switch from bad to good bins) can be calculated. The retesting may in some cases result in higher overall yields. Continuing with the example, the benefit from a CBL rule that re-tests certain bin strings and potentially gains back an X % of the retests provides a quantifiable ROI, where the ROI can be defined for example in yield gain percentage.

In one embodiment, test time reduction can be accomplished for example by removing tests on a specific population and/or by not testing certain units. The reduced test time may in some cases result in lower cost. The ROI may be defined for example in test time savings which can be translated, if necessary, into the reduction in number of testers needed to test a certain amount of material.

In one embodiment, the quality improvement ROI may be defined in dice per million. For example, a "freeze event" on a parametric test across a specific amount of consecutive units may be due to an equipment malfunction which caused the dice to be tested in an inaccurate fashion. The affected dice pose a quality issue whose impact can be quantified in die per million (DPM). The ROI may be defined for example as the number of units which would have been "saved" had the rule been implemented (or have been saved due to rule implementation).

In one embodiment, the reliability augmentation ROI may be defined in dice per million. For example, if tests are to be added to units that are suspected with reliability issues, the "impacted population" aka "affected dice" that would receive "special treatment" may be quantified. The ROI can be defined for example as the number of "affected dice".

In one embodiment, the test escape prevention ROI may be defined in dice per million. For example, if there is a rule that verifies that a certain lot was tested in an adequate test socket flow (for example, Sort1→Sort2→Sort3), the amount of lots/wafers/dice that did not go through this flow and that are potential escapes can be checked. The ROI is defined for example as the number of units that would have been "saved" (i.e. not able to escape) (or have been saved) due to implementation of the rule.

In one embodiment the test fleet health ROI may be defined as the number of equipment malfunctions caught in a specific timeframe. For example, if a certain tester is giving a higher re-test rate compared to the other testers in the test fleet, the rule may highlight this event. The ROI is defined for example as the number of malfunctions which would have "prevented" (or have been prevented) per time-frame or equipment amount due to implementation of the rule.

In one embodiment, statistical process control algorithms are used for one or more ROIs.

In another embodiment during analysis 130 after simulation there may be also or instead be comparative quantification of the potential benefits for various test scenarios, rules and algorithms.

Assuming analysis follows actualization 124, the analysis can occur once the rule has been actualized any appropriate number of times for the particular embodiment. For example in one embodiment, analysis for any particular rule can occur once the number of actualizations of the rule represent a significant population for analysis (where "significant" may be based on any appropriate predetermined criteria, and/or on common statistical practices). Continuing with this embodiment, analysis may then optionally be repeated for that particular rule after any suitable intervening period, for example after a predetermined number of additional actualizations, after a predetermined time period, etc.

To further explore aspects of follow up stage 130 in some embodiments, assume for example that actualization stage 124 for a particular rule occurs using one or more of production actualizing modules 1120 and/or 1150 (for example for a predetermined number of times) and there are no problems for that particular rule during actualization. Continuing with the example, in one embodiment, follow up stage 130 may include repeating actualizing stage 124 as needed, without first re-executing previous stages 104 to 120.

Continuing with the example, in some embodiments, follow up stage 130 may include analyzing the actualization so as to monitor a previously defined return on investment criterion. Assuming that based on the monitored return on investment and/or based on other analysis, the rule has been determined through analysis in stage 130 to be unnecessary/incorrect/suboptimal. In one embodiment, stage 130 may include reporting that the rule is unnecessary/incorrect/suboptimal. In another embodiment, in addition to or instead, the rule may be discarded, tagged, optimized or adapted (for example during a repetition of one or more stages of method 100) during follow up stage 130.

As another example, assume instead that actualization of the rule in stage 124 occurs in simulation actualizing module 1140, for example prior to being actualized in production by production type actualizing module 1120 and/or 1150. Assume further that the rule that had been simulated in stage 124 has been determined through analysis in stage 130 to be unnecessary or incorrect. For example, the rule may have been simulated along with one or more other rules, and one of the other rules may have been determined to be "better" than the rule. In one embodiment in follow up stage 130 this rule may be discarded, or tagged as unnecessary/incorrect by rule creation module 210 so that the rule will not be transferred to actualizing module 220 or 250 for production (i.e. through a repetition of one or more stages of method 100). In another embodiment the rule may be adapted in follow up stage 130 so that the improved rule would instead be transferred to actualizing module 1120 and/or 1150 for production actualization (i.e. through a repetition of one or more stages of method 100 including actualizing stage 124 by actualizing module 1120 and/or 1150). In addition to or instead, the discarding, tagging or adaptation of the rule may be reported in follow up stage 130.

Continuing with the same example, assume instead that through analysis in stage 130 of the simulation of stage 124, the rule has been determined to be a good rule. In one embodiment the rule may be transferred in follow up stage 130 to actualizing module 1120 and/or 1150 for production (i.e. there would be a repetition of one or more stages of method 100 including actualizing stage 124 by actualizing module 1120 and/or 1150). In addition or instead, the determination that the rule is good may be reported in follow up stage 130.

Continuing with the same example, assume instead that through simulation in simulation actualizing module 1140 in stage 124, and analysis in stage 130 an optimal rule has been determined. The optimal rule may be specified in follow up stage 130 so that the optimal rule would be transferred to actualizing module 1120 and/or 1150 for production (i.e. there would be a repetition of one or more stages of method 100 including actualizing stage 124 by actualizing module 1120 and/or 1150). In addition or instead, the selection of the optimal rule may be reported in follow up stage 130.

Continuing with the same example, assume instead, that a return on investment criterion has been determined through simulation of the rule in stage 124 and analysis in stage 130. The determined return on investment criterion in one embodiment can then be monitored using actual testing results from rule actualization in production by actualizing module 1120 and/or 1150.

Although analysis, monitoring, and reporting, has been presented as being a part of follow up stage 130, in other embodiments, analysis, monitoring and/or reporting may instead or in addition be included in one or more other stages of method 100.

Figure 12:
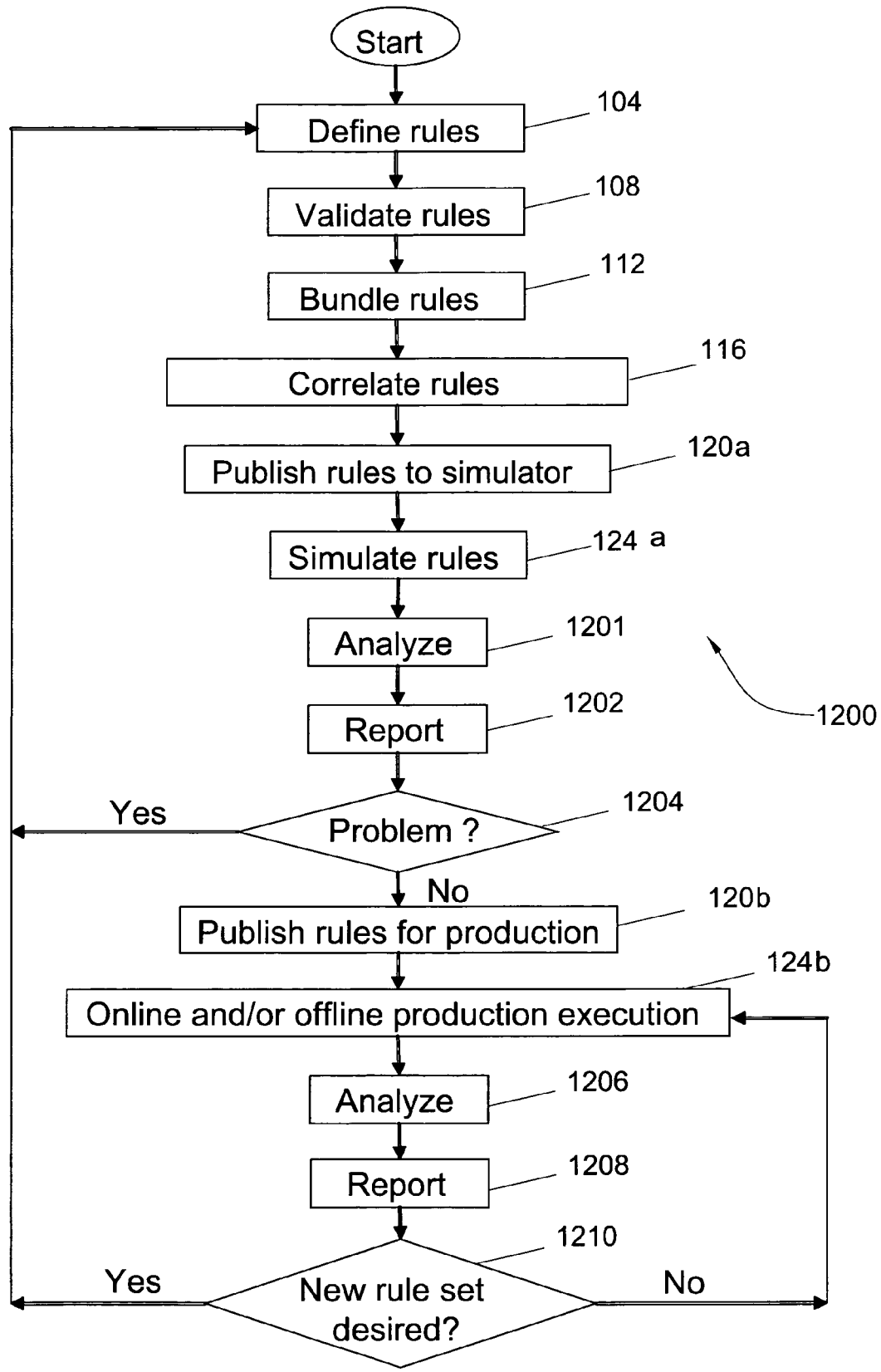
FIG. 12 is a flowchart of a method for semiconductor testing, according to an embodiment of the present invention.

FIG. 12 shows a method 1200 for semiconductor testing, according to an embodiment of the present invention. Method 1200 illustrates an example of how the different stages of method 100 can be executed and re-executed using the modules of system 1100. In other embodiments of the invention, fewer, more and/or different stages than those shown in FIG. 12 may be executed. The stages may be executed in a different order than shown in FIG. 12, and/or in some embodiments one or more stages may be executed simultaneously. In order to distinguish in the description below of FIG. 12 between re-executions of the same stages from method 100, consecutive lettering is used for any repeated stages of method 100. In addition, because follow up stage 130 is so broad, no stages in FIG. 12 have been identified as such, but it should be evident to the reader that one or more stages of FIG. 12 may be encompassed by follow up stage 130. Method 1200 is described with reference to a rule set ("rules"), however, the reader will understand that the description mutatis mutandis also applies to a single rule.

In the illustrated embodiment of FIG. 12, the rules are defined (stage 104), validated (stage 108), bundled together (stage 112), correlated (stage 116), and published to simulator actualizing module 1140 (stage 120*a*), for example using rule creation module 210 and/or analysis module 260. The rules are then simulated (stage 124*a*), for example using simulation actualizing module 1140. The simulations are then analyzed (stage 1201) for example by analysis module 260, and the results are reported in stage 1202. If there are problems with the rules (stage 1204), stages 104 through 1202 are repeated until the rule set is deemed ready for production. Once the rule set is ready for production, the rules are published in stage 120*b* for example by rule creation module 210 and transferred for production to actualizing module 1120 and/or 1150. In stage 124*b*, the rules are executed during online and/or offline production testing using real time actualizing module 1120 and/or offline actualizing module 1150 respectively. In stage 1206 the rules are analyzed, for example by analysis module 260, and the results are reported in stage 1208. Production execution (stage 124*b*), analysis (stage 1206) and reporting (stage 1208) are repeated until a new rule set is desired (stage 1210), upon which method 1200 is re-executed from the beginning.

In some embodiments, stage 124*b* may in some cases involve more than one rule set being actualized by actualizing module(s) 1120 and/or actualizing module(s) 1150 comprised in system 1100 simultaneously.

For example in one embodiment, if two real time actualizing modules 1120 in system 1100 are testing different products and/or testing on different types of test modules, then these two actualizing modules 1120 will probably be actualizing different rule sets in stage 124*b*. However in this embodiment, if the two real time actualizing modules 1120 are instead testing the same product on the same type of test module then the two actualizing modules 1120 will probably be actualizing the same rule set in stage 124*b*.

As another example, in one embodiment, during stage 124*b* one or more offline production modules 1150 actualize one or more rule set(s) that is/are related (refer) to the rule set(s) being actualized by one or more real time production modules 1120. Assume for the sake of example one offline production module 1150, a plurality of real time production modules 1120 (testing the same product on the same type of test module), and a CBL example. The basic rule, executed by each real time production module 1120 independently checks for a consecutive bin string and performs appropriate actions, for example, retest or clean and retest. The offline production module 1150 receives data relating to all the real time production modules 1120 and can thus identify if one of the testing systems connected to one of real time production module 1120 is statistically different than the other testing systems connected to the other real time production modules 1120. For example, offline production 1150 may perform a rule for monitoring and comparing the amount of CBL occurrences per equipment entity. An additional CBL related rule which may be performed by offline production module 1150 is a CBL event free window which checks the time that passed between two CBL strings on the real time modules in order for example to better understand how often the probe card needs to be cleaned.

For example, if offline production module 1150 discovers an outlier for CBL occurrences per equipment entity, offline production module 1150 may perform any appropriate action. For example, in one embodiment offline module 115 may provide an engineering alarm that there may be a possible equipment malfunction (pager, sms, email, etc). In another embodiment, offline module 115 may in addition or instead perform a workflow action (hold, resort, scrap, tag, etc), modify a bin/or parameter, otherwise modify database(s), etc.

Method 1200 is only one example of a possible life cycle of a rule set. For example, in one embodiment, once a rule or a rule set has been simulated in stage 124*a* and analyzed in stage 1201, the analysis may be used for other purposes without proceeding to publication of the rule or rule set for production (stage 120*b*). As another example, in one embodiment, simulation of one or more rules (stage 124*a*) may take place earlier on in method 1200. As another example, in one embodiment, simulation of the rules in stage 124*a* may be skipped and a rule set may be published for production (stage 120*b*) without first being simulated. As another example, in one embodiment, method 1200 may end with publication of the rules to a simulator (stage 120*a*) or with publication of the rules for production (stage 120*b*), and not proceed with simulation/production execution (stage 124), analysis and reporting). As another example, in one embodiment, method 1200 may begin with simulation of rules stage 124*a* and proceed with subsequent stages of method 1200 or begin with production execution stage 124*b* and proceed with subsequent stages of method 1200. As another example, once the results are analyzed in stage 1206, for example by monitoring a return on investment criterion, and possibly reported in stage 1208, it may be desirable or necessary to adjust one or more rules in a rule set rather than repeating execution in production (stage 124*b*)

For further illustration, FIGS. 13 through 16 illustrate some of the relevant components in rule creation module 210, simulation actualizing module 1140 combined with analysis module 260, real time production actualizing module 1120, and offline production actualizing module 1150, respectively according to an embodiment of the present invention.

Figure 13:
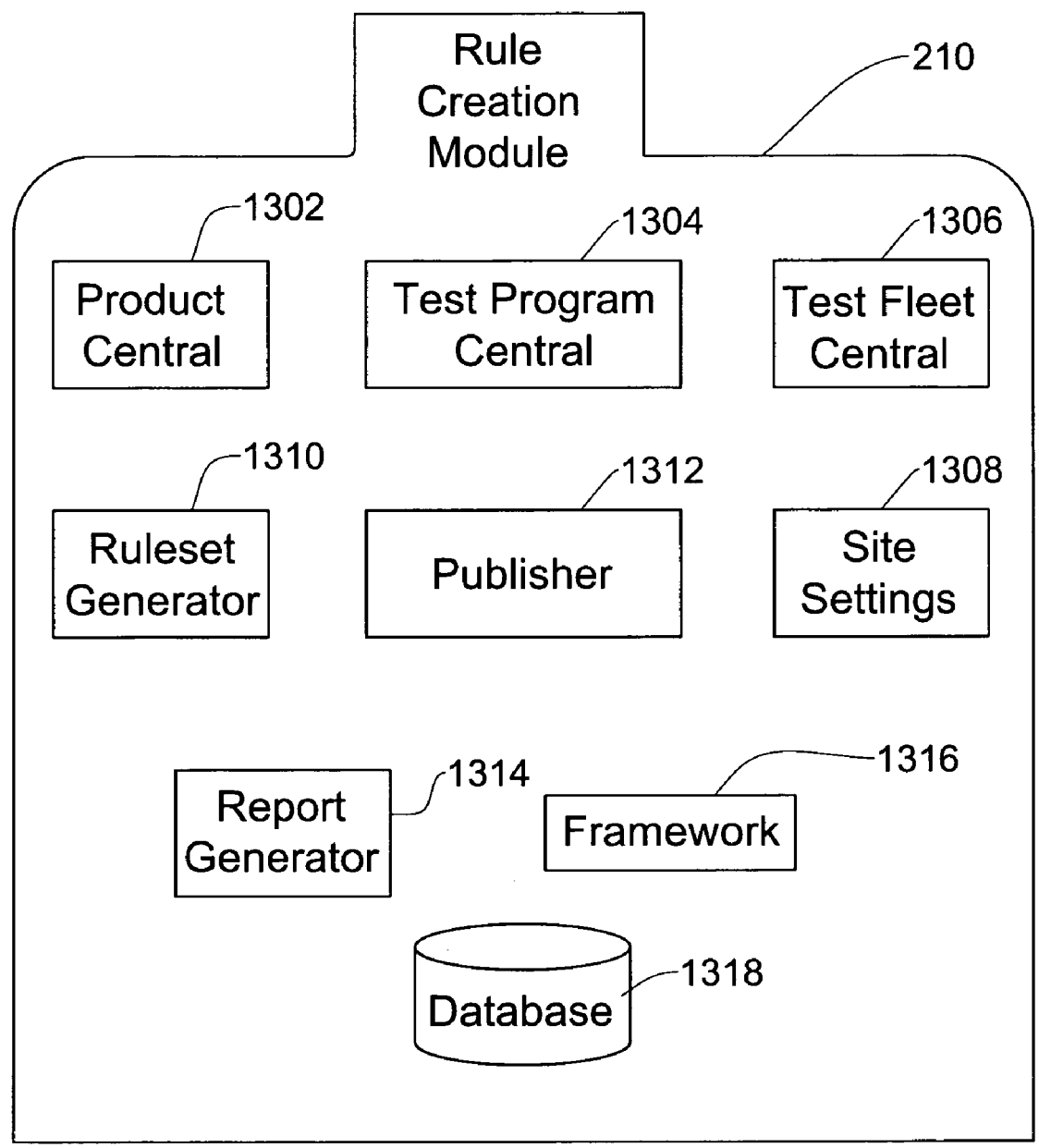
FIG. 13 is a block diagram of a rule creation module, according to an embodiment of the present invention.

FIG. 13 shows an example of rule creation module 210, according to an embodiment of the present invention. Each of the modules shown in FIG. 13 may comprise any combination of hardware, software and/or firmware that performs the functions as defined and explained herein. In other embodiments of the invention, the functionality of FIG. 13 may be provided by fewer, more and/or different modules than those shown in FIG. 13. In the embodiment illustrated in FIG. 13, module creation module 210 includes product central 1302 (data on products including inter-alia settings), test program central 1304 (data on test programs including inter-alia test program settings), test fleet central 1306 (data on test module including inter-alia test module settings), and site settings 1308. In one embodiment, the combination of product central 1302, test program central 1304, test fleet central 1306 and site settings 1308 corresponds to universal repository 720 and/or customized repository 820. In the embodiment illustrated in FIG. 13, rule creation module 210 also includes rule set generator 1310 which is used to create rules for real time, offline and/or simulation execution. As noted above, in one embodiment all rules created by rule set generator 1310 can be simulated but each rule is targeted for either real time or offline production. In another embodiment a particular rule may be targeted for both offline and real time production. For example, in one embodiment rule set generator 1310 can include inter-alia some or all of the functionality discussed above for one or more of the following: comparator 630, quantifier 640, user interface 702 and/or 802, filter 710 and/or 810, rule selector 910, comparator 930, rule set selector 920 and resolver 940. In the embodiment illustrated in FIG. 13, rule creation module 210 also includes a publisher 1312 which bundles rules together in a rule set and/or publishes settings and/or rule sets, and a report generator 1314 which provides basic reports of inter-alia raw data, testing results and/or system settings. In the embodiment illustrated in FIG. 13, rule creation module 210 also includes a framework 1316, for example providing generic services including inter-alia database connectivity to extract/update data and/or license and security management, and lot validation, and a database 1318 for storing the created rules and/or test results. For example database 1318 in one embodiment includes public, private, production, and simulation libraries of rules. Depending on the embodiment of the invention, the functionality of FIG. 13 may be provided by fewer, more and/or different modules than those shown in FIG. 13. The modules shown in FIG. 13 may be centralized in one location or dispersed over more than one location.

Figure 14:
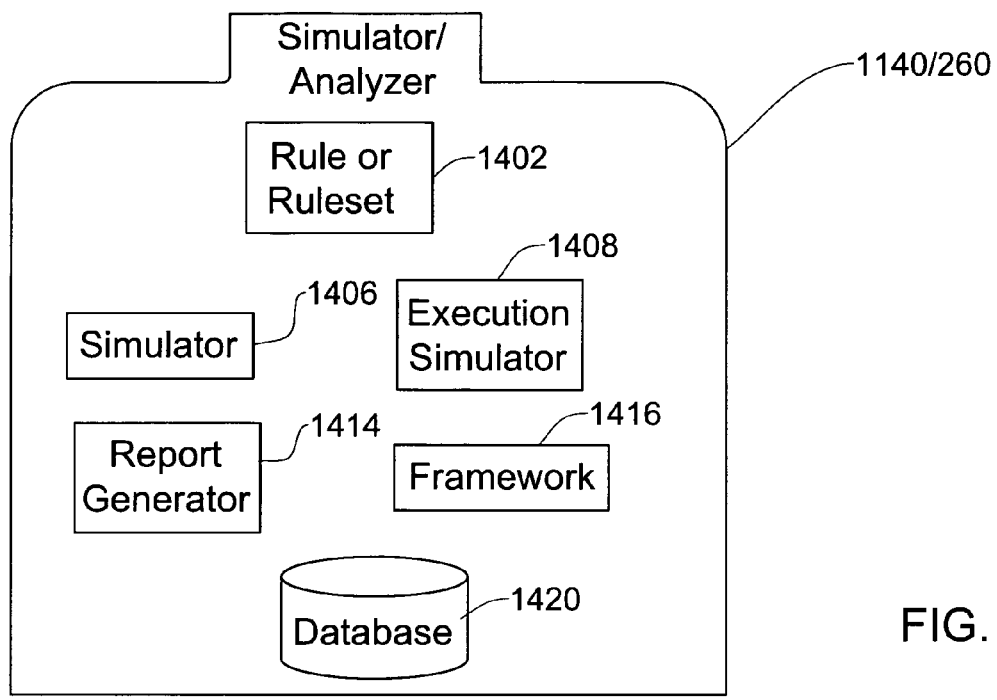
FIG. 14 is a block diagram of a simulation actualizing module coupled with an analysis module, according to an embodiment of the present invention.

FIG. 14 shows an example of a simulation actualizing module 1140 coupled with analysis module 260, according to an embodiment of the present invention. Each of the modules shown in FIG. 14 may comprise any combination of hardware, software and/or firmware that performs the functions as defined and explained herein. In the embodiment illustrated in FIG. 14, simulation/analysis module 1140/260 includes a rule or rule set 1402 for example generated by rule creation module 210 and/or by simulation/analysis module 1140/260. In the embodiment illustrated in FIG. 14, module 1140/260 includes a framework 1416, for example which provides generic services including inter-alia database connectivity to extract/update data and/or license and security management, and a report generator 1414, for example which provides basic reports of inter-alia raw data, testing results and/or system settings. Simulation/analysis module 1140/260 as illustrated in FIG. 14 includes simulator 1406 and/or execution simulator 1408 for executing actualization stage 124, rule definition stage 104 and/or analysis stage 130/1201/1206. In one embodiment each of simulator 1406 and/or execution simulator 1408, or in combination, includes inter-alia some or all of the functionality discussed above for one or more of the following: rule examiner 410, comparator 420, condition examiner 430, decider 440, rule examiner 605, parameter value selector 610, rule executor 620, comparator 630, quantifier 640, condition examiner 1040, rule examiner 1030, parameter selector 1070, evaluator 1050, executor 1060, other data extractor 1080, comparator 1062, and quantifier 1064. For example in one embodiment, simulator 1406 includes inter-alia one or more of the following: a rule set executor on historical results, results analysis tools, return on investment algorithms (for example one or more of the following, inter-alia: yield loss prevention, test time reduction, quality augmentation, reliability improvement, test escape prevention, statistical process control), algorithm impact assumptions, simulation execution scheduler, simulation results viewer, what if scenario, optimizations for rule settings. Continuing with the example, in this embodiment execution simulator 1408 provides a real time execution environment as if the rule or rule set was actually executed on the specified production module 1120 and/or 1150 including deterministic times. As illustrated in FIG. 14, simulation/analysis module 1140/260 also includes a database 1420, for example for storing results of simulation stage 124 and/or analysis results, and/or for storing data received from rule creation module 210 and/or other input. For example in some embodiments database 1420 stores inter-alia some or all of the information stored in database 1010. Continuing with the example, in one of these embodiments database 1420 includes inter-alia all information which is accessible to rule creation module 210.

Depending on the embodiment simulation/analysis module 1140/260 may be used during any one or more of the following stages, inter-alia: rule definition (stage 104), actualization stage (124), analysis stage (130, 1201, 1206), reporting (130, 1202, 1208) described above. Depending on the embodiment, simulation/analysis module 1140/260 may run a simulation on a single rule or on a rule set (a plurality of rules). In one embodiment, simulation/analysis module 1140/260 includes optimization techniques and what if capabilities (for example for editing ranges, incrementing etc). In one embodiment, simulations can be executed by schedule. The various executed types include inter-alia: user trigger (which in some cases may be the default option), scheduled trigger (run at X, run every Y, etc) and event trigger (run after Y lots, etc). In one embodiment, a simulation may include one or more of the following components/steps: population (raw and/or aggregated data), algorithms and formulas (for example exclude criteria, various exceptions, etc), success criteria, execution type (e.g. user trigger, scheduled trigger, event trigger, etc).

In other embodiments of the invention, the functionality of FIG. 14 may be provided by fewer, more and/or different modules than those shown in FIG. 14. For example in one embodiment, simulator 1406 and execution simulator 1408 may be combined. The modules shown in FIG. 14 may be centralized in one location or dispersed over more than one location. In one embodiment, the modules relating to analysis 260 may be separated from the modules relating to simulation module 1140.

Figure 15:
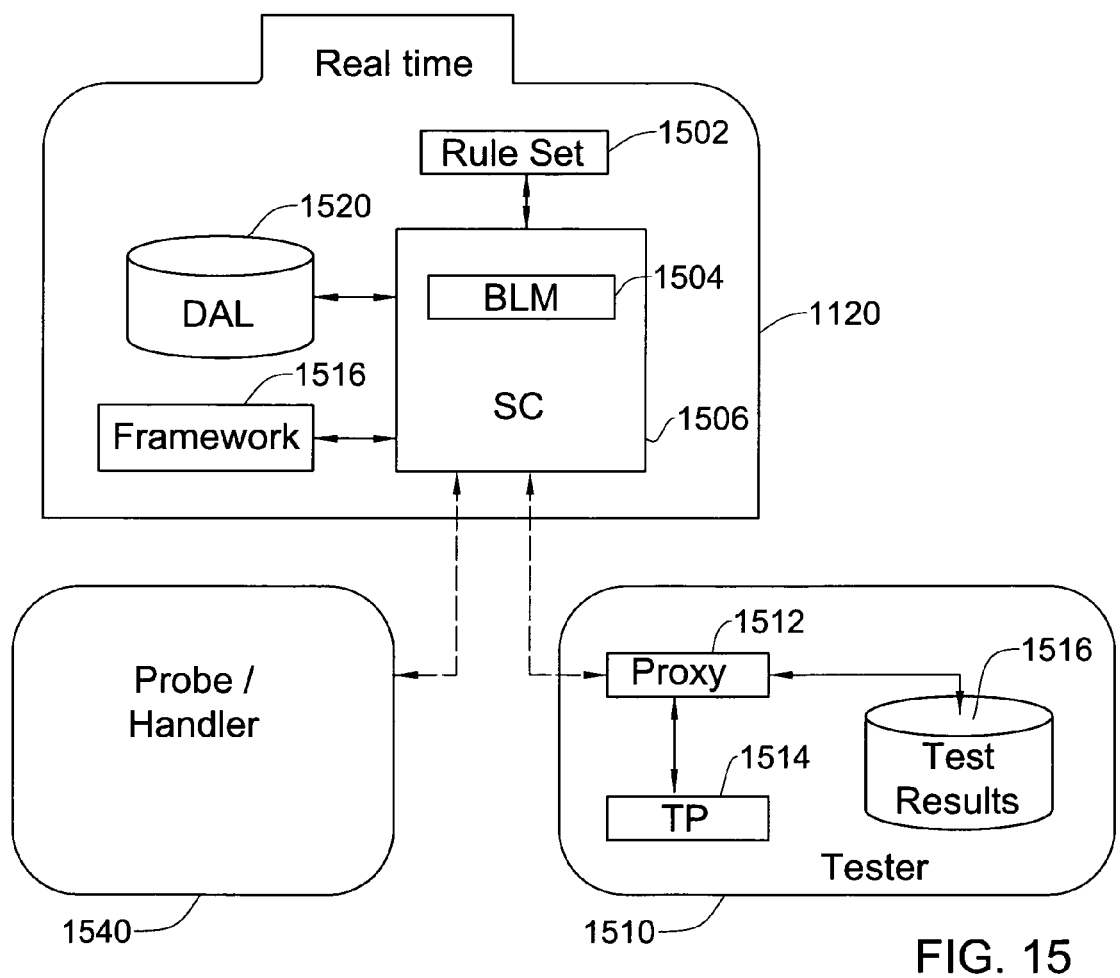
FIG. 15 is a block diagram of a real time production module with connectivity to a tester and prober or handler, according to an embodiment of the present invention.

FIG. 15 shows an example of a real time production module 1120, and connectivity of real time production module 1120 to tester 1510 and prober or handler 1540, according to an embodiment of the present invention. In one embodiment, communication between real time production module 1120 and prober/handler 1540 and/or between real time production module 1120 and tester 1510 is in accordance with IEEE communication standards. Each of the modules shown in FIG. 15 may comprise any combination of hardware, software and/or firmware that performs the functions as defined and explained herein. In the embodiment illustrated in FIG. 15, real time actualizing module 1120 includes a rule set 1502 and a data access layers DAL 1520, which stores an accumulated dataset managed as layers that includes inter-alia product settings, FAB historical results, Etest testing results, previous sort operation results, and/or analysis and offline algorithm results (for example baselines). For example in some embodiment DAL 1520 stores inter-alia some or all of the information stored in database 1010 which is useful for actualizing rule set 1502. In one of these embodiments, DAL 1520 receives from rule creation module 210, for each current lot only the data related to the current lot and the previous lot which is necessary to execute rule set 1502 in real time production. DAL 1520 will be discussed in more detail further below.

In the embodiment illustrated in FIG. 15, real time actualizing module 1120 includes a framework 1516, for example providing generic services including inter-alia database connectivity to extract/update data and/or license and security management, and lot validation. In the illustrated embodiment, real time actualizing module 1120 includes a station controller SC 1506 which control tester 1510 and prober/handler 1540 so that testing is performed in accordance with the rules. Included in SC 1506 is a business logic manager BLM 1504 for resolving conflicts among users, modules and rule sets that happen during production (for example due to triggers 1042 discussed above, due to unexpected occurrences, etc). For example BLM 1504 in one embodiment can include inter alia some or all of the functionality discussed above for evaluator 1050. Besides BLM 1504, SC 1506 includes all or some of the functionality discussed above for one or more of the following: rule examiner 410, comparator 420, condition examiner 430, decider 440, condition examiner 1040, rule examiner 1030, evaluator 1050, executor 1060, and other data extractor 1080.

In one embodiment, tester 1510 includes a proxy 1512, a test program 1014 and a database for test results 1516. Proxy 1512 may for example provide real time read/write connection to testing results, tester operating system OS, memory interception and test program TP connectivity. In one embodiment, database 1510 holds the results for the current testing on the current lot and once the results for a lot are finalized the test results (for example in a datalog) are transferred to rule creation module 210 so that database 1318 (and/or databases associated with other modules in system 1100) may be updated.

In one embodiment, test program 1514 includes a bundle of tests executed one after another in order to determine if the device under test is good or bad. In some cases, rules may change variables in the test program 1514, for example changing the test flow, the bins, the test conditions, etc, thereby changing how test program 1014 is executed. These changes can in some cases be on a unit to unit basis so that each unit gets tested differently. In one embodiment test program 1014 includes "switches" inside (test program 1014) which are accessible by SC 1506 so that the variables can be switched if necessary from default values. The rule set instructs SC 1506 which variables should be switched.

In other embodiments of the invention, the functionality of FIG. 15 may be provided by fewer, more and/or different modules than those shown in FIG. 15. The modules shown in FIG. 15 may be centralized in one location or dispersed over more than one location.

Figure 16:
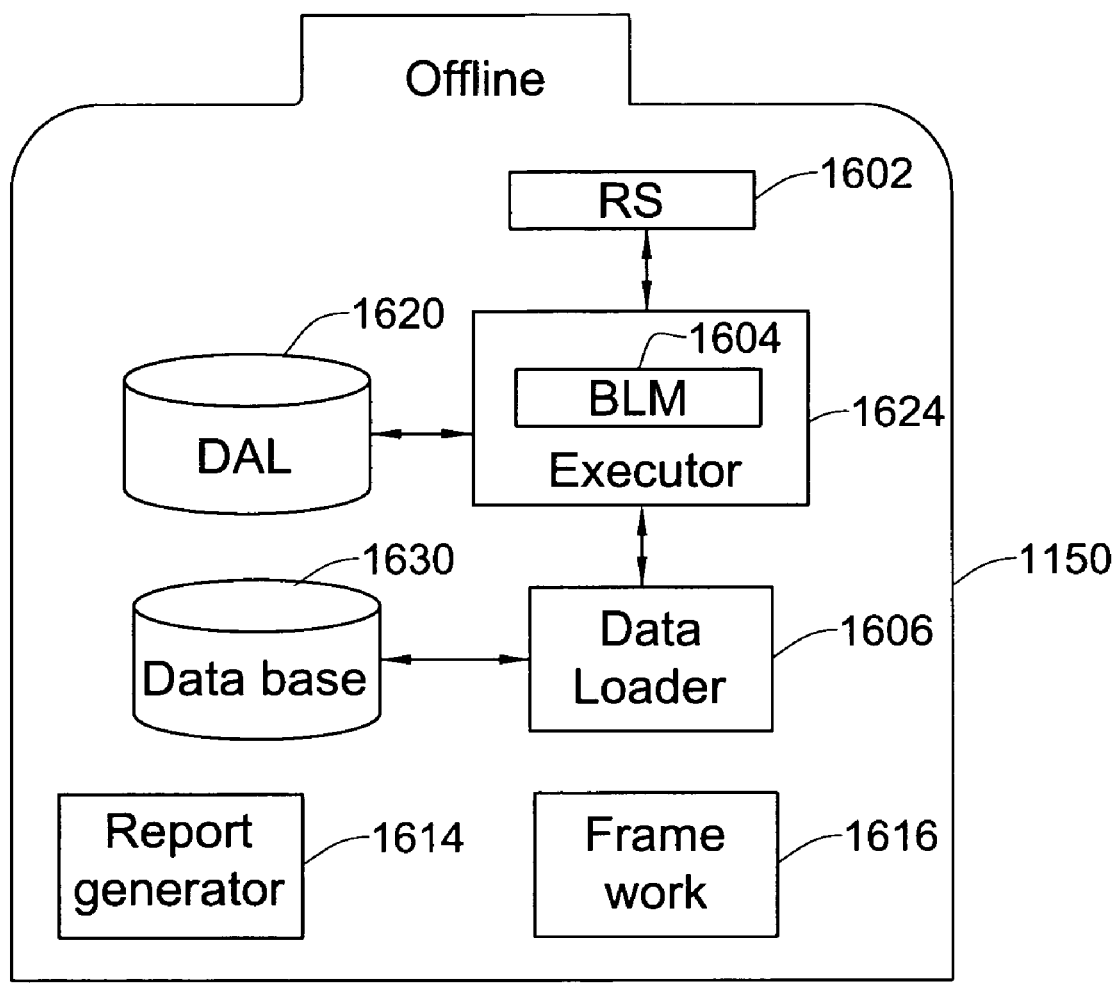
FIG. 16 is a block diagram of an offline production actualizing module, according to an embodiment of the present invention.

FIG. 16 shows an example of an offline production actualizing module 1150, according to an embodiment of the present invention. Each of the modules shown in FIG. 16 may comprise any combination of hardware, software and/or firmware that performs the functions as defined and explained herein. Offline production actualizing module 1150 includes a rule set 1602 or rule sets. For example, if offline module 1150 is observing production on multiple products and/or on multiple test modules, then offline module 1150 will probably be executing a plurality of rule sets simultaneously.

In some embodiments, offline production actualizing module 1150 includes a data access layers DAL 1620, which stores an accumulated dataset managed as layers that includes inter-alia product settings, FAB historical results, Etest testing results, previous sort operation results, and/or analysis and offline algorithm results (for example baselines). For example in some of these embodiments DAL 1620 stores inter-alia some or all of the information stored in database 1010 useful for actualizing rule set(s) 1602.

In one of these embodiments, DAL 1620 receives from rule creation module 210, data related to as many lots as necessary for executing rule set(s) 1602. DAL 1620 will be discussed in more detail further below.

In some embodiments, offline production actualizing module 1150 includes database 1630 instead of or in addition to DAL 1620. For example in some of these embodiments database 1630 stores inter-alia some or all of the information stored in database 1010. In one of these embodiments, database 1630 includes inter-alia all data accessible to rule creation module. In the embodiment illustrated in FIG. 16, offline actualizing module 1150 also includes an executor 1624 with a BLM 1604 for resolving conflicts among users, modules and rule sets that happen during production (for example due to triggers 1042 discussed above). For example BLM 1604 in one embodiment can include inter alia some or all of the functionality discussed above for evaluator 1050. Besides BLM 1604, executor 1624 includes all or some of the functionality discussed above for one or more of the following: rule examiner 410, comparator 420, condition examiner 430, decider 440, condition examiner 1040, rule examiner 1030, evaluator 1050, executor 1060, and other data extractor 1080. In one embodiment, offline actualizing module 1150 also includes a framework 1616, for example providing generic services including inter-alia database connectivity to extract/update data and/or license and security management, and lot validation, and a report generator 1614 for generating reports (for example during stage 1208 or at any other stage). In the embodiment illustrated in FIG. 16, offline actualizing module 1150 also includes a data loader and converter 1606 of historical testing results including all semi STDF formats, datalogs, etc, and workflow settings including hold, lot owner (engineering/production), etc. In one embodiment data loader and converter 1606 may allow loading of information from systems external to system 200. For example, data such as lot attributes (e.g. owner, etc) can be loaded from a workflow system that manages lots in the fabrication test facility. As another example, if a lot is or needs to be held for engineering review, the data loader can interface to that system.

In one embodiment data loader 1606 receives results of production testing executed by one or more real time actualizing modules 1120. For example, one offline actualizing module 1150 may receive the results of one or more real time actualizing modules 1120, for example directly, via rule creation module 210, or via another module. Offline actualizing module 1150 may then actualize one or more rule sets which allows the testing of the fleet health (i.e. checking the performance of all testing stations). During follow up stage 130, the results of the actualization may be analyzed, reported, and if necessary corrective action may be caused to be performed by one or more real time actualizing modules 1120.

In other embodiments of the invention, the functionality of FIG. 16 may be provided by fewer, more and/or different modules than those shown in FIG. 16. The modules shown in FIG. 16 may be centralized in one location or dispersed over more than one location.

The usage of DAL 1520 and/or 1620 in some embodiments of the invention is advantageous. DAL 1520 or 1620 includes information, data and results of lots, wafers, and dice in a special format, for example in a wafer map. In one embodiment DAL 1520 or 1620 is "built" and managed in layers where each layer is characterized by one operation and one parameter. In one embodiment DAL 1520 or 1620 includes all operations (past, current and future) and all parameters referenced by rules. In some embodiments the difference between DAL 1520 and DAL 1620 is the amount of lots accumulated in them. For example, in one of these embodiments DAL 1520 includes information for the current lot under test as well as the information from the previous lot tested. This structure allows rules that reference a previous wafer or a previous lot. In this embodiment, DAL 1620 includes significantly more lots in order to enable a larger baseline. In one embodiment DAL 1520 or 1620 is product and test program specific; meaning that DAL 1520 and DAL 1620 will include information on the product under test. In this embodiment, if offline actualizing module 1150 is observing production of than one product and/or on more than one test module simultaneously, there may be more than one DAL's 1620 that are managed in parallel. In one embodiment, offline actualizing module 1150 "supports" many testers, for example, each tester may be testing a different product corresponding to a different DAL 1620 and therefore actualizing module 1150 must have all relevant DAL's 1620 updated continuously. In another embodiment, a single DAL 1520 or 1620 may include information relating to more than one product and/or test program.

Refer to FIG. 17 which illustrates various examples of layers which may in some embodiments be included in DAL 1520 and/or 1620. In other embodiments, more, less and/or different layers may be included in DAL 1520 and/or 1620. The layers shown in FIG. 17 will now be described:

Layer 1.1
  Operation: Sort
  Parameter: Tested Dice
Layer 1.2
  Operation: Sort3
  Parameter: Touchdown Definition & Sequence
Layer 1.3
  Operation: Sort
  Parameter: Probing Sequence
Layer 1.4
  Operation: Sort2
  Parameter: Hard Bins
Layer 1.5
  Operation: Metal1 (Fab)
  Parameter: Lithography Exposure Definition
Layer 1.6
  Operation: Sort1
  Parameter: Vcc continuity Therefore, retrieval of information by actualizing module 1120 or 1150 may be facilitated by the usage of DAL 1520 or 1620 respectively. Since each layer represents a different operation and/or parameter, and the x-y coordinates of any die on a wafer is known, actualizing module 1120 or 1150 can retrieve the parameter/operation information relating to a specific die from the appropriate x-y position in the appropriate layer. In one embodiment, the x-y position in the DAL 1520 or 1620 layer is the same x-y position of the die in the wafer. In another embodiment the x-y position in the DAL 1520 or 1620 layer may be different than the x-y position of the die in the wafer, but the correspondence is known to actualizing module 1120 or 1150.

For example assume a rule which based on previous information decides to skip certain dice on a wafer. In this example the rule decision is already known prior to testing the wafer. Instead of calculating the rule for each die, the information can be stored in a layer in DAL 1520 comprising "0" s and "1"s. Actualizing module 1120 will know to skip any "0" die and perform the rule on each "1" die. The reader will understand that this type of storage is quite efficient.

As another example, assume a rule for monitoring bin data, where the results of the monitoring are stored in a datalog (for example test results 1516) created by tester 1510. The datalog is updated in very near real time, but not in real time since tester 1510 is writing to a file. The datalog can in some cases include a lot of data so that handling and parsing the data in real time may be difficult. If it is known a-priori that the results of the monitoring are needed, the results can be stored in DAL 1520 in the structure described above which is known to actualizing module 1120.

The examples above are for illustration purposes and in other embodiments any information may be stored in the wafer map format, including inter-alia: measurement results for a specific test, an identifier for the sequence in which a unit was tested, information associated with the operation in which the information was collected, etc.

One embodiment of the invention provides a common testing language for the semiconductor test industry which allows the development of testing scenarios in a user friendly manner. In order to further illustrate to the reader rule definition (stage 104) using rule creation module 210, FIGS. 18 through 42 illustrate graphical user interfaces GUIs, according to an embodiment of the present invention. The invention is not bound by the content or format of the GUIs shown in FIGS. 18 through 42 nor by the order described for the user inputting data.

Figure 18:
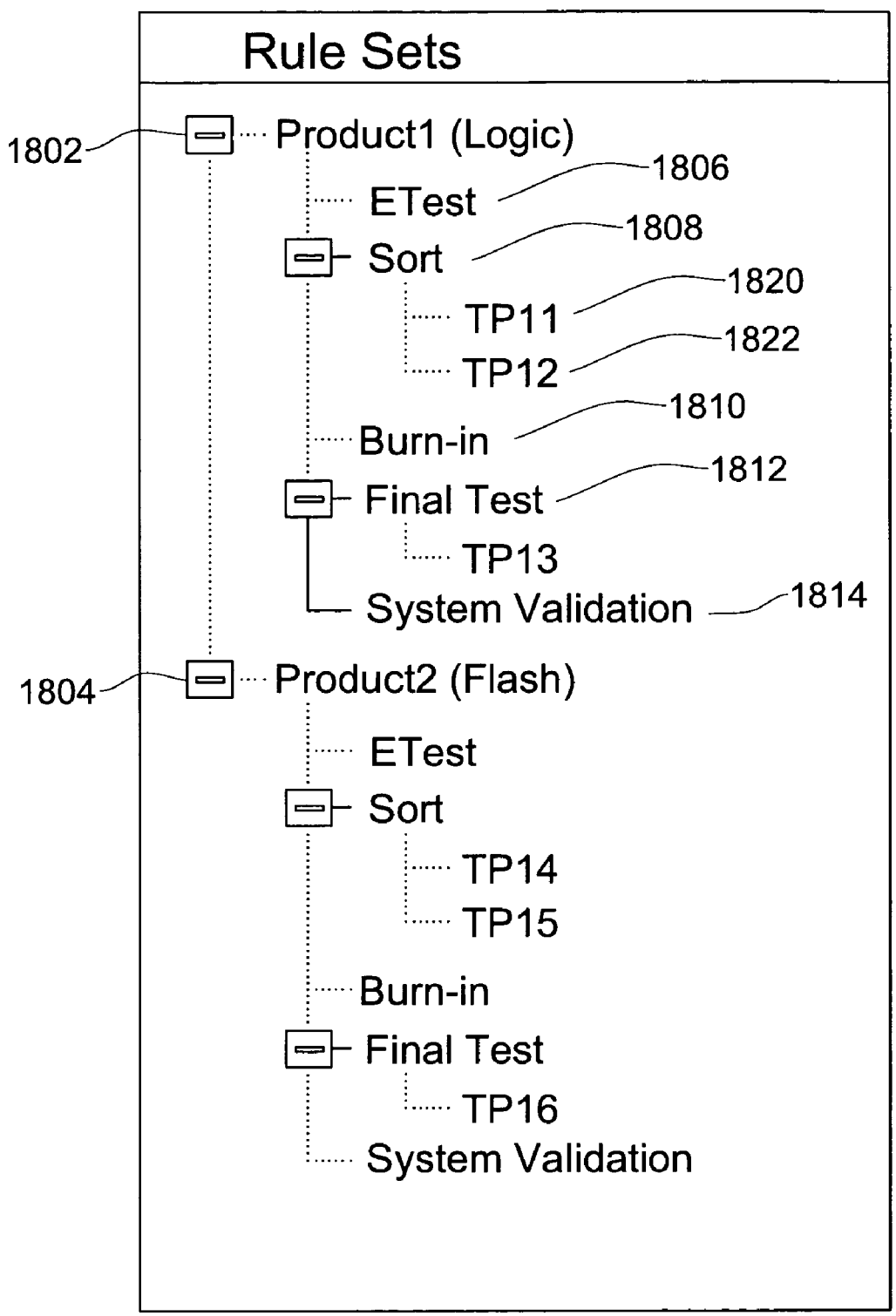
FIG. 18 is a graphical user interface illustrating a hierarchical tree structure for products, according to an embodiment of the present invention.

FIG. 18 illustrates a hierarchical tree structure of categories for product 1 1802 and product 2 1804, according to an embodiment of the present invention. Under each product 1802, 1804, the comprised areas/operations may be listed/hidden. For example under product 1 1802, Etest 1806, sort 1808, burn-in 1810, final test 1812 and system validation 1814 are listed as operations. Under each area, the test program may be listed/hidden. For example under sort 1808, test programs TP11 1820 and TP12 1822 are listed.

Figure 19:
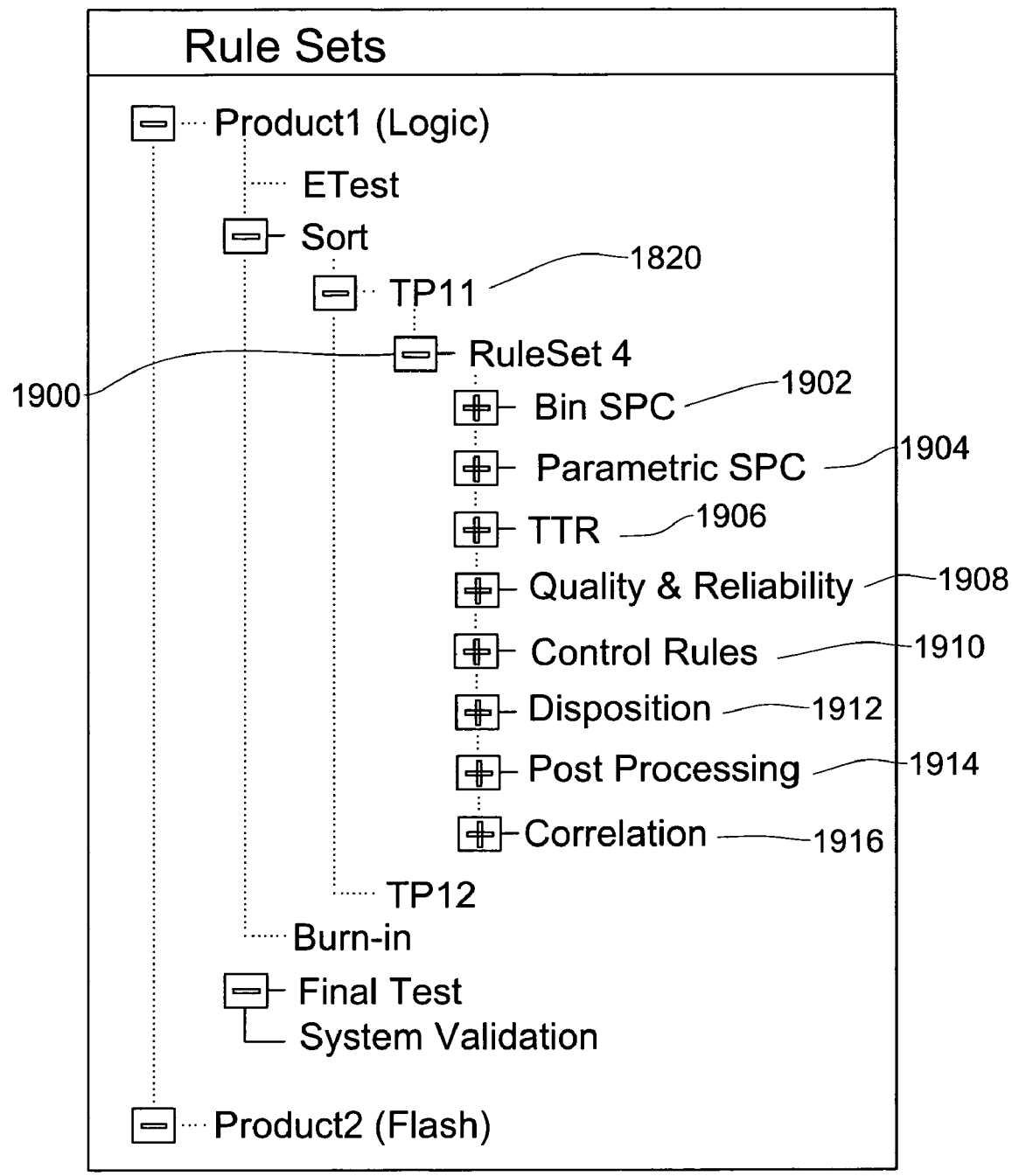
FIG. 19 is a graphical user interface illustrating a rule set of rule families for a test program, according to an embodiment of the present invention.

FIG. 19 illustrates a rule set of rule families for a specific test program, according to an embodiment of the present invention. Under each test program, the comprised rule sets may be listed/hidden. Under each rule set, the comprised rule families may be listed/hidden. Under TP11 1820, for rule set 4 1900, the rule families Bin SPC 1902, Parametric SPC 1904, TTR 1906, Quality and Reliability 1908, Control Rules 1910, Disposition 1912, Post Processing 1914, and Correlation 1916 are listed.

Figure 20:
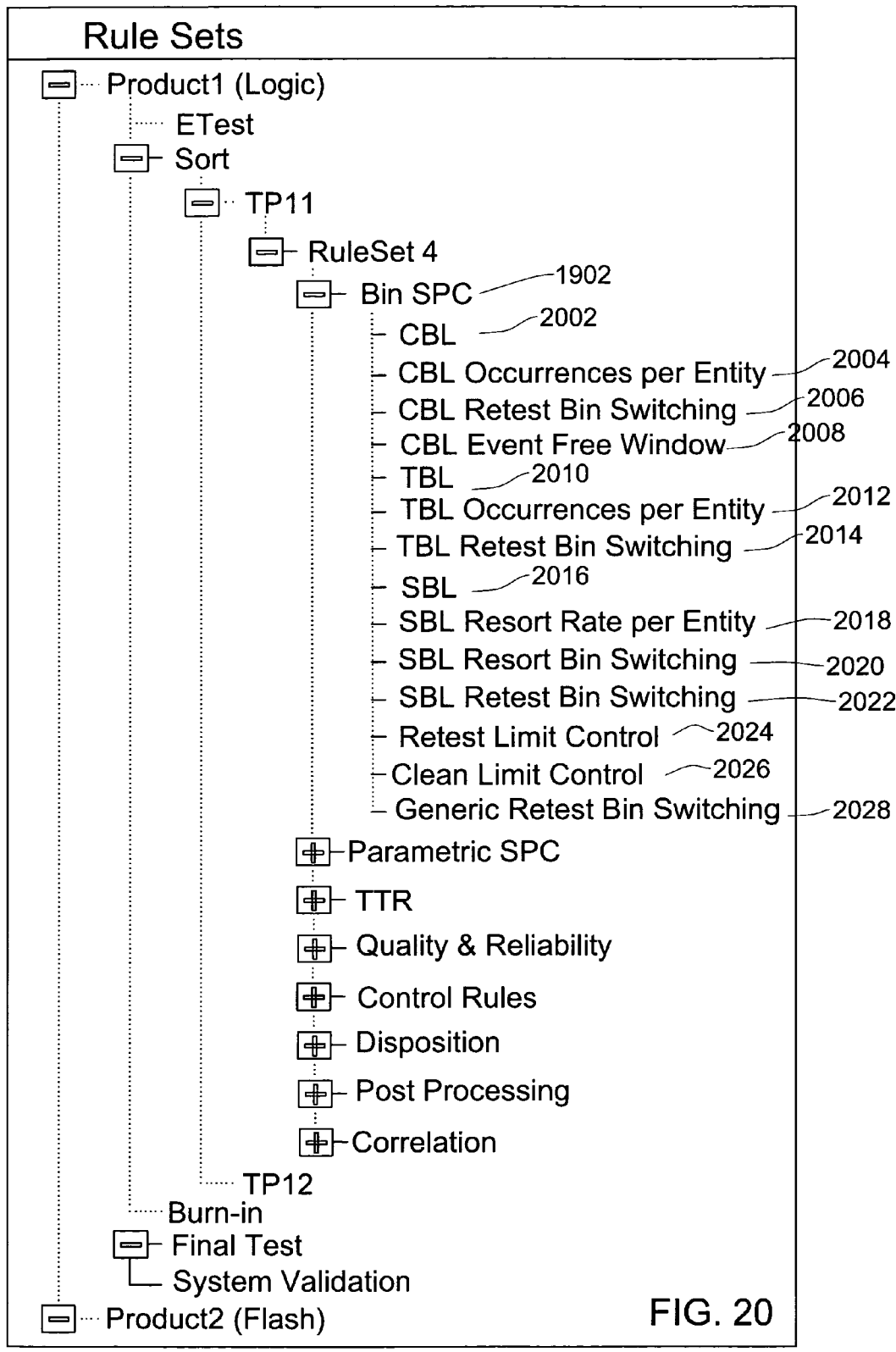
FIG. 20 is a graphical user interface illustrating the rules types for a rule family, according to an embodiment of the present invention.

FIG. 20 illustrates the rules types for a rule family, according to an embodiment of the present invention. Under each rule family, the comprised rule types may be listed/hidden. For example under Bin SPC 1902, the following rule types are listed: CBL 2002, CBL occurrences per entity 2004, CBL retest bin switching 2006, CBL event free window 2008, TBL 2010, TBL occurrences per entity 2012, TBL retest bin switching 2014, SBL 2016, SBL resort rate per entity 2018, SBL resort bin switching 2020, SBL retest bin switching 2022, retest limit control 2024, clean limit control 2026, and generic retest bin switching 2028.

Figure 21:
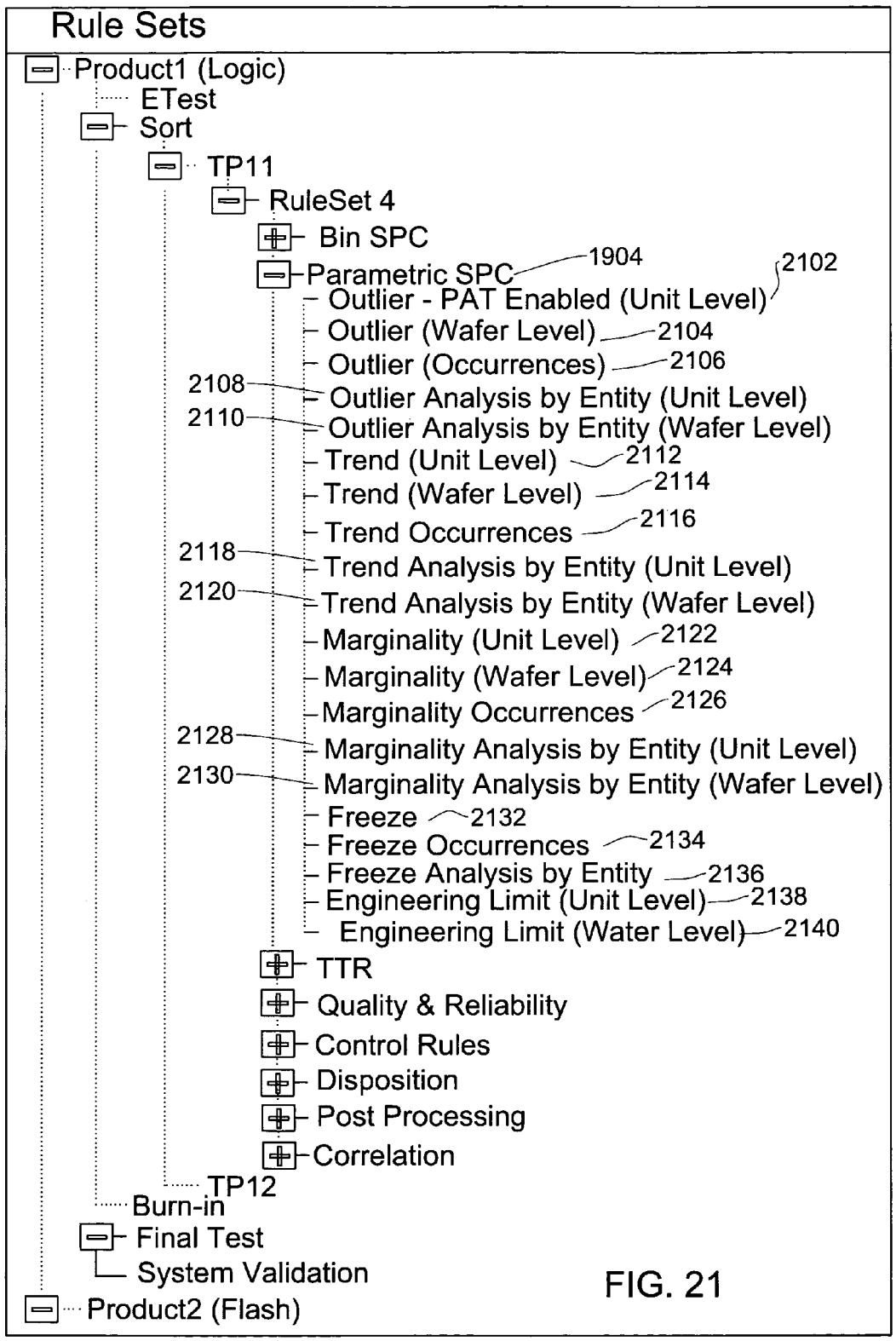
FIG. 21 is a graphical user interface illustrating the rules types for another rule family, according to an embodiment of the present invention.

FIG. 21 illustrates the rules types for another rule family, according to an embodiment of the present invention. Under each rule family, the comprised rule types may be listed/hidden. For example under Parametric SPC 1904, the following rule types are listed: outlier unit level 2102, outlier wafer level 2104, outlier occurrences 2106, outlier analysis by entity unit level 2108, outlier analysis by entity wafer level 2110, trend unit level 2112, trend wafer level 2114, trend occurrences 2116, trend analysis by entity unit level 2118, trend analysis by entity wafer level 2120, marginality unit level 2122, marginality wafer level 2124, marginality occurrences 2126, marginality analysis by entity unit level 2128, marginality analysis by entity wafer level 2130, freeze 2132, freeze occurrences 2134, freeze analysis by entity 2136, engineering limit unit level 2138, and engineering limit wafer level 2140.

FIG. 22 illustrates the rules types for other families, according to an embodiment of the present invention. Under each rule family, the comprised rule types may be listed/hidden. In FIG. 22, the rule types for rule families TTR 1906, quality and reliability 1908, control rules 1910, and disposition 1912 are listed. For brevity sake, the rules families shown in FIG. 22 are not repeated here.

FIGS. 23 through 43 are GUIs illustrating two examples of rule definition, according to an embodiment of the present invention. The GUIs in one embodiment are part of user interface 702 and/or 802 for rule creation module 210. The examples are provided to aid the understanding of the reader and should therefore not be construed as typical and/or limiting. The examples in some cases use different names for parameters (building blocks) of the rules and/or different order of parameters than those shown in FIG. 5 but cross reference is provided for the reader convenience.

The first example illustrated in FIGS. 23 through 33 relates to a CBL rule which monitors consecutive bins and acts accordingly.

In some embodiments, it is assumed that the user has specified the position of the new rule, by selecting CBL 2306 in the hierarchy of categories. Thereafter in some of these embodiments, parameters 2308 associated with this rule are presented to the user (Depending on the embodiment, there may or may not be other parameters associated with the rule which are not presented to the user, for example because those other parameters are defined automatically).

The population parameter (as defined in FIG. 5) is the current die under test and is invisible to the user (i.e. defined automatically by rule creation module 210). The rule is executed for all dice in the product.

Figure 23:
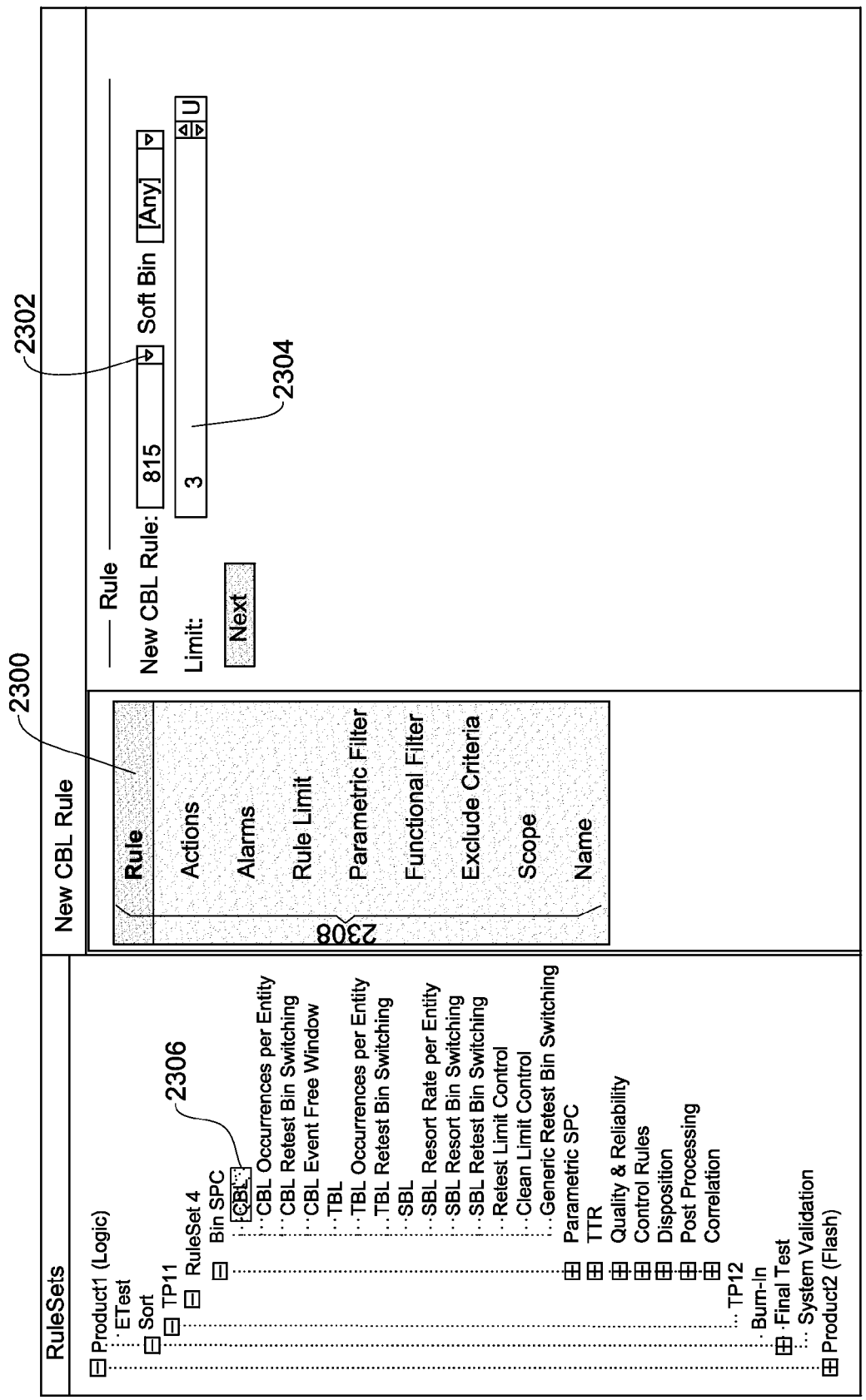
FIG. 23 is a graphical user interface for defining a consecutive bin limit rule, according to an embodiment of the present invention.

In step 2300 (rule parameter) illustrated in FIG. 23, the user specifies the monitored bin 2302 (here "bin 15"), and the consecutive limit 2304 (here "3"). Note that monitored bin 2302 in this example corresponds to the monitored data parameter described with reference to FIG. 5. In this example the rule will be triggered if a "string" of three consecutive bin 15's has occurred.

Figure 24:
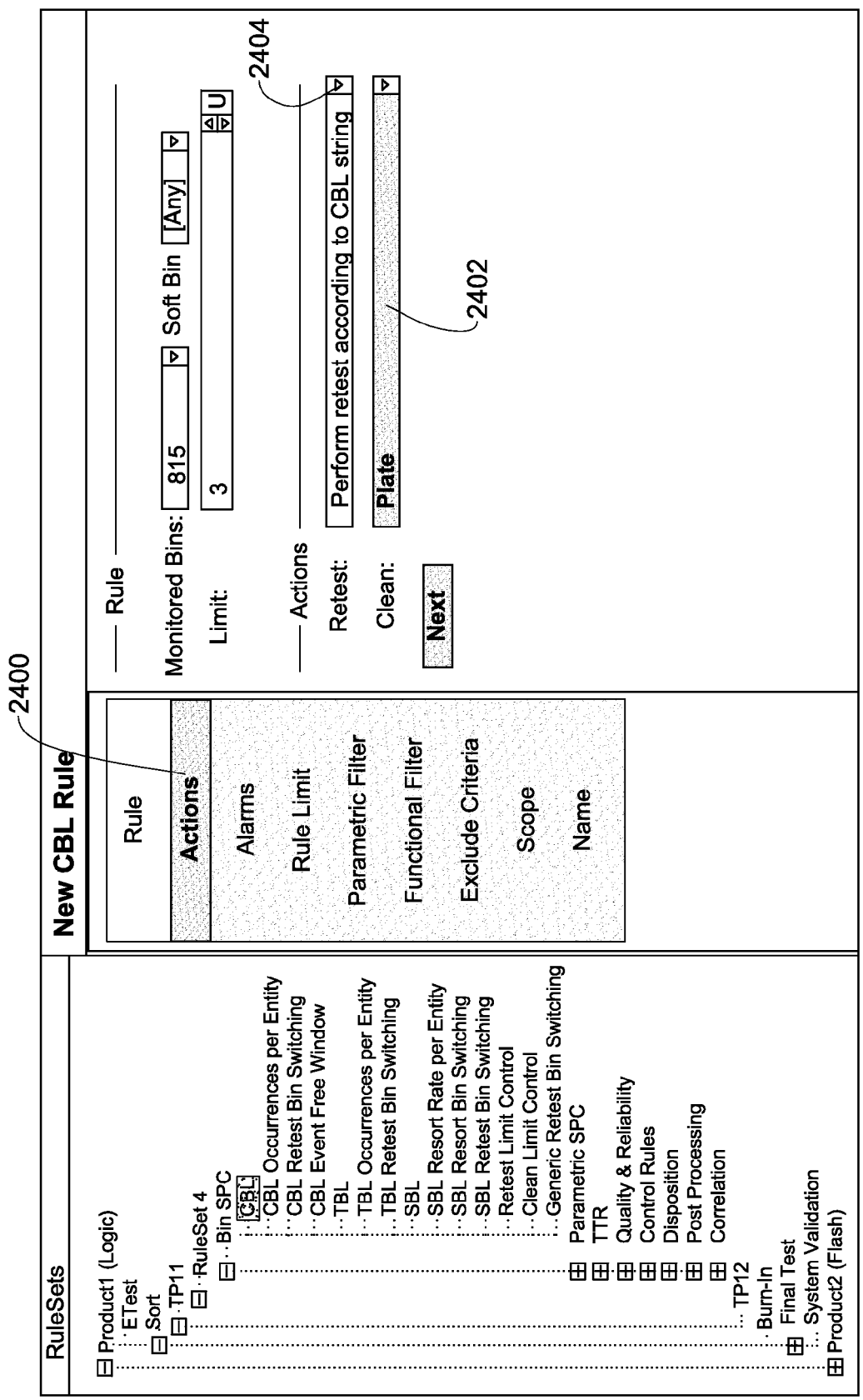
FIG. 24 is another graphical user interface for defining a consecutive bin limit rule, according to an embodiment of the present invention.

In step 2400 (actions parameter) illustrated in FIG. 24, the user defines the rule action which occurs if the rule is triggered. In this case, the actions will be to clean the probe card using the "plate" 2402, and to "retest the last dice per CBL string" (here "3") 2404. In one embodiment, the clean type 2402 is selected automatically based on the test module settings, whereas in another embodiment the user may make the selection.

Figure 25:
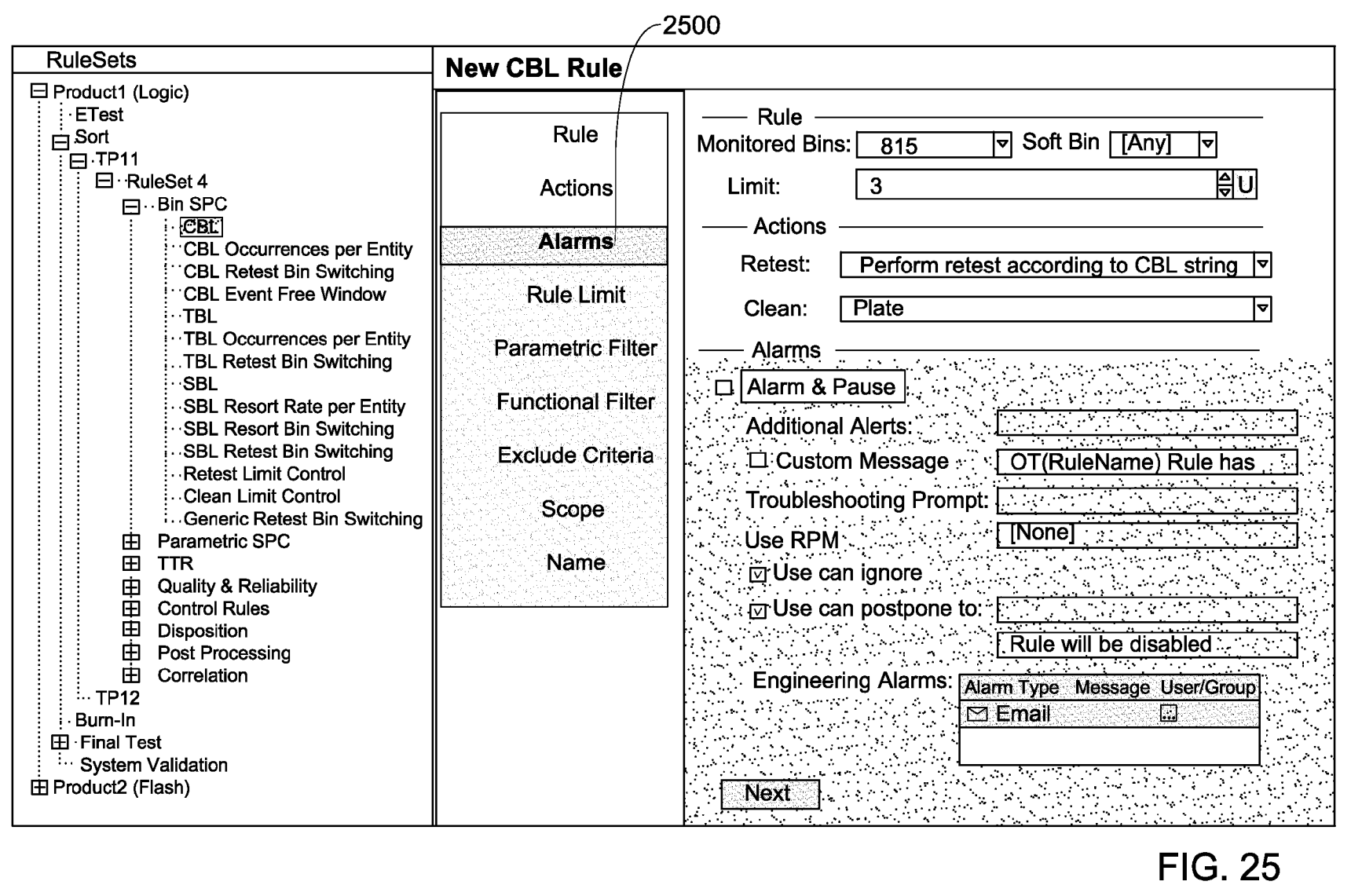

In step 2500 (alarms parameter) illustrated in FIG. 25, the user may select a rule alarm. In one embodiment, there are two types of alarms. The primary can happen on real-time actualization module 1120 and the secondary can happen on offline actualization module 1150. The primary alarm can for example provide a message to the technician and/or for example stop the test module. The message can prompt the technician to perform a corrective action. The secondary alarm (aka engineering alarm) can for example send a message via email, pager, etc to notify personal that are not on the test floor with critical messages. In the example illustrated in FIG. 25, no alarms are defined, for example since the user decided to automatically perform the actions in the previous step with no other intervention or notification.

Note that actions parameter 2400 and alarms parameter 2500 correspond to the rule action parameter discussed with reference to FIG. 5.

Figure 26:
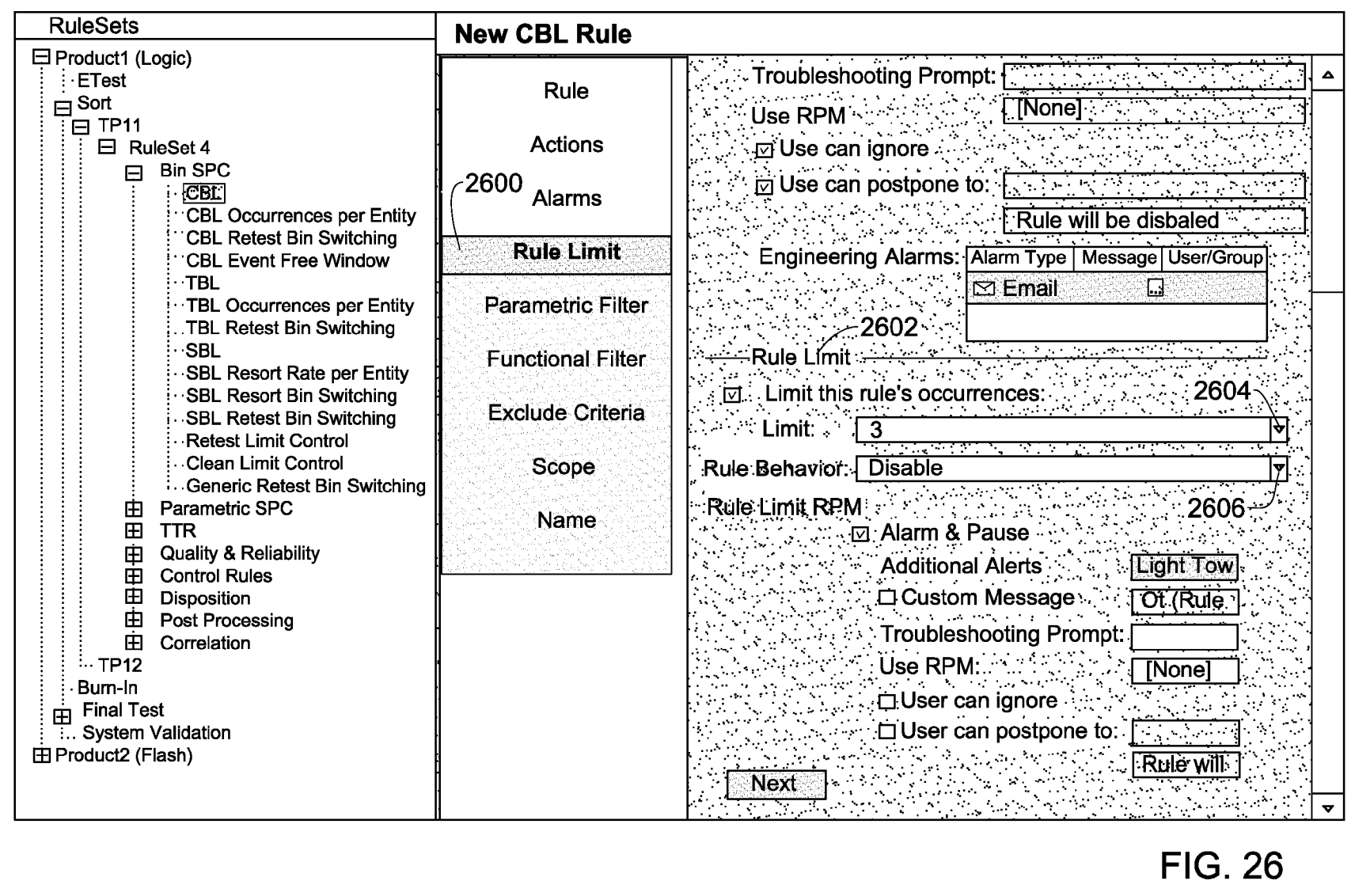

In step 2600 (rule limit parameter) illustrated in FIG. 26, the user may define a limit 2602 to the rule. Limit 2602 is with respect to the amount of time the rule occurs during a specific scope. In this case the rule limit is defined as "3" 2604. Therefore if there three times a CBL of 3 for bin 15, then a rule behavior 2606 is performed. In this case, rule behavior 2606 is "disable", i.e. the rule will be disabled and an alarm (distinguished from any alarm defined in step 2500) will be provided. The rationale for this step is to avoid over cleaning of the probe card in the case for example of an issue which is material related rather than equipment related. (Note that rule limit 2600 allows the definition of a counter for the number of occurrences of the rule and this counter partially corresponds to the validity conditions discussed above with reference to FIG. 5. The rest of the validity conditions is invisible to the user and relevant only during rule actualization).

In step 2700 (parametric filter parameter) illustrated in FIG. 27, an additional parametric filter may be defined. In essence, this step is an additional condition to the monitored bin. In this example, the trigger for the rule looks for three consecutive bin 15's that have a contact resistance "cres" measurement 2702 (parametric value) whose relationship 2704 is defined as being "greater than 1".

In step 2800 (functional filter parameter) illustrated in FIG. 28 an additional functional filter may be defined. This step is similar to the logic of the parametric filter of FIG. 27 but references failing channels that are part of functional data. In this example, no filtering was chosen.

Figure 29:
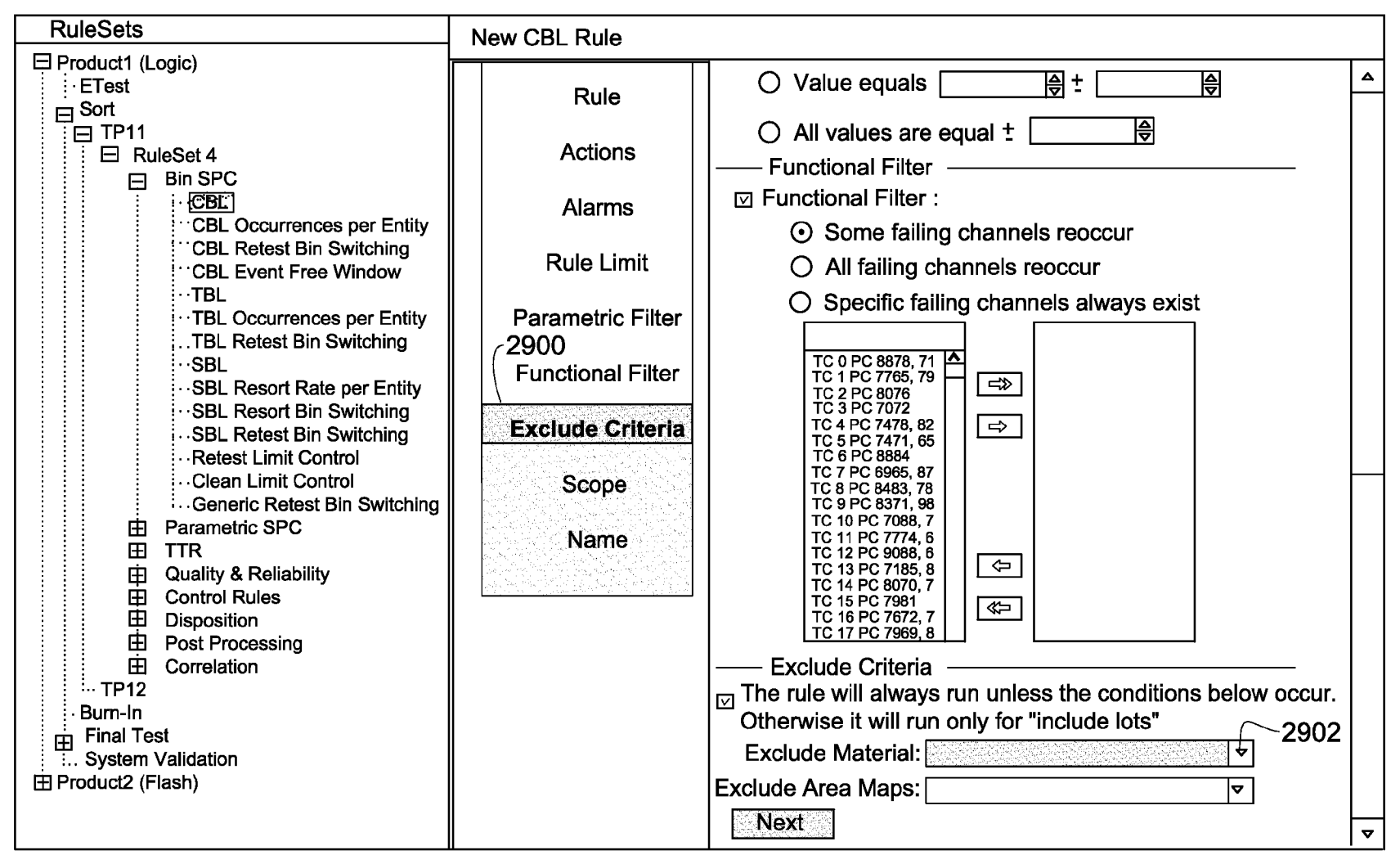

In step 2900 (exclude criteria parameter) illustrated in FIG. 29, exclude criteria can be defined. For example assuming the rule is based on an "if-then" statement, the exclude criteria would correspond to an "unless" statement associated with the rule. In this example no exclude criteria are defined and all material will be tested with the rule. (In another embodiment where exclude criteria are defined, the rule will not be triggered if the unit, wafer or lot is of specific material type 2902, for example engineering material, specific areas on the wafer etc.)

Note that parametric filter parameter 2700, functional filter parameter 2800 and exclude criteria parameter 2900 correspond to the entry condition parameter discussed above with reference to FIG. 5. In this example, there is a parametric filter on top of the bin.

Figure 30:
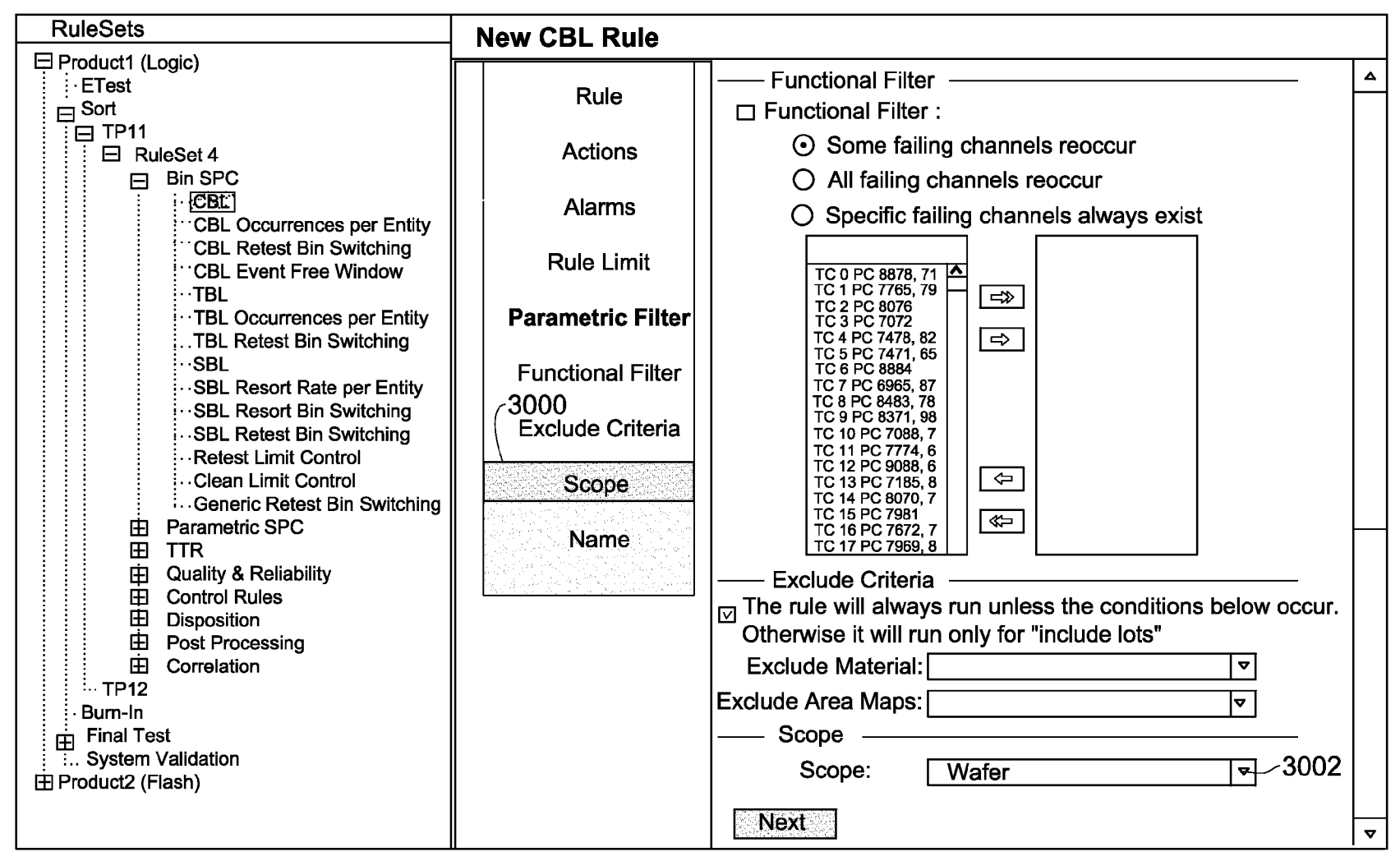

In step 3000 (scope parameter) illustrated in FIG. 30, the scope of the rule can be defined. The scope defines when the rule is initialized. In this example, the scope is defined as every "wafer" 3002, meaning that all counters are reset for every wafer. For example, the occurrences counter will be reset and the rule limit will be reset. In one embodiment, the rational behind resetting the counters every wafer is due to the fact that wafers inside a lot can be processed (fabricated) slightly differently and therefore their characteristics can be different. For example, if there are three CBL occurrences in a single wafer, it may be decide to stop the "clean & retest" since this is probably a real material issue and not an equipment issue. When testing is started on the next wafer, it is desirable to reset the occurrences counter because it is not known if a CBL occurring on the new wafer is due to the same material issues identified in the previous wafer or if it is a "regular" equipment issue. Scope parameter 3000 corresponds to the scope parameter discussed above with reference to FIG. 5.

Figure 31:
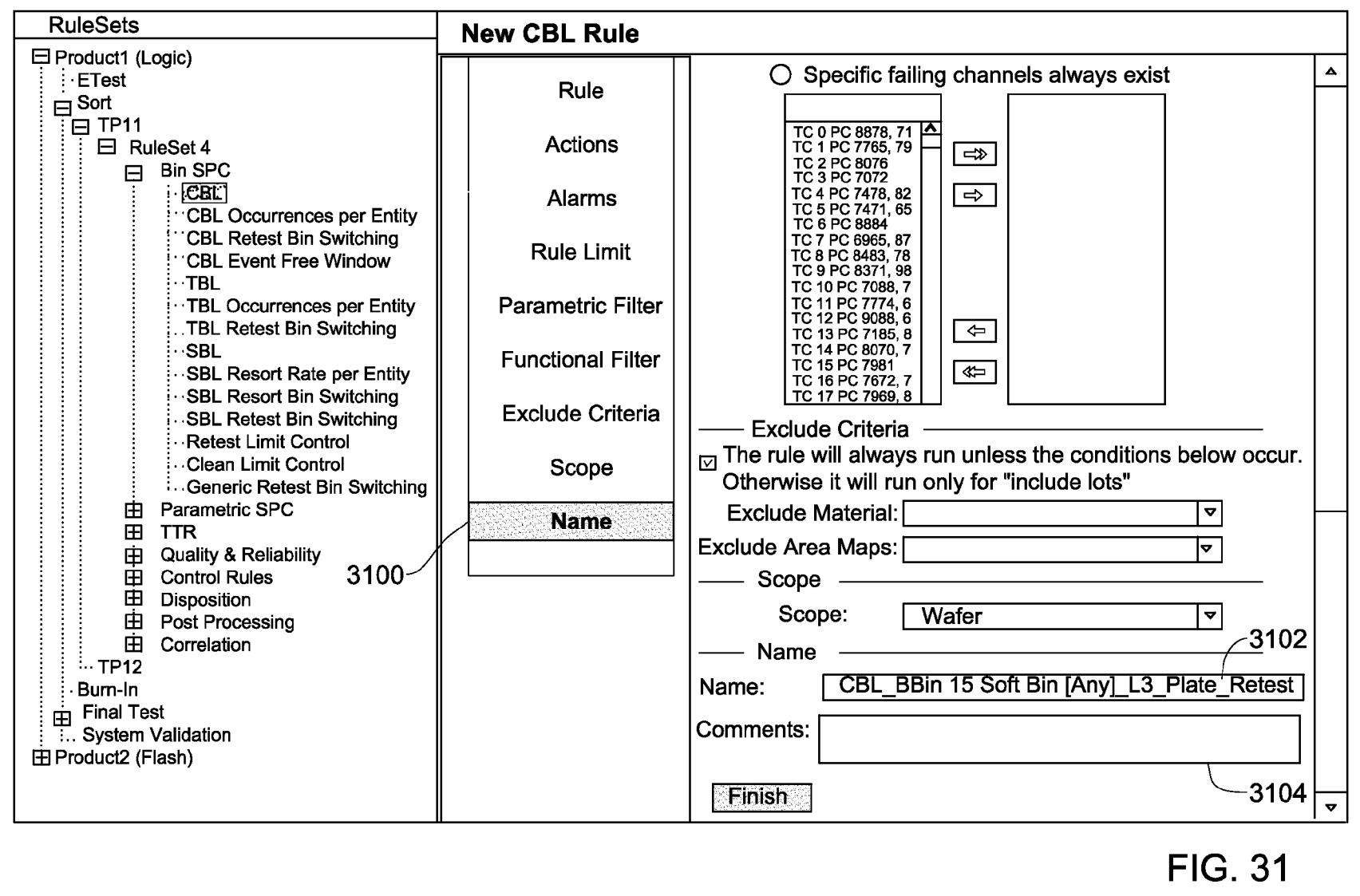

In the final step 3100 (name parameter) illustrated in FIG. 31, the rule is given a name 3102 and any comments 3104 are inputted. Name parameter 3100 corresponds to the name parameter discussed above with reference to FIG. 5.

Note that the run point, end point, and rule state parameters, as described with reference to FIG. 5 are invisible to the user (i.e. set automatically by rule creation module 210). In this example the run point is the end of the die and the end point is the start of the die. The algorithm object described with respect to FIG. 5 corresponds to the rule type "CBL" 2306 (FIG. 23) which was already chosen. The rule state is relevant only during actualization of the rule.

Figure 32:
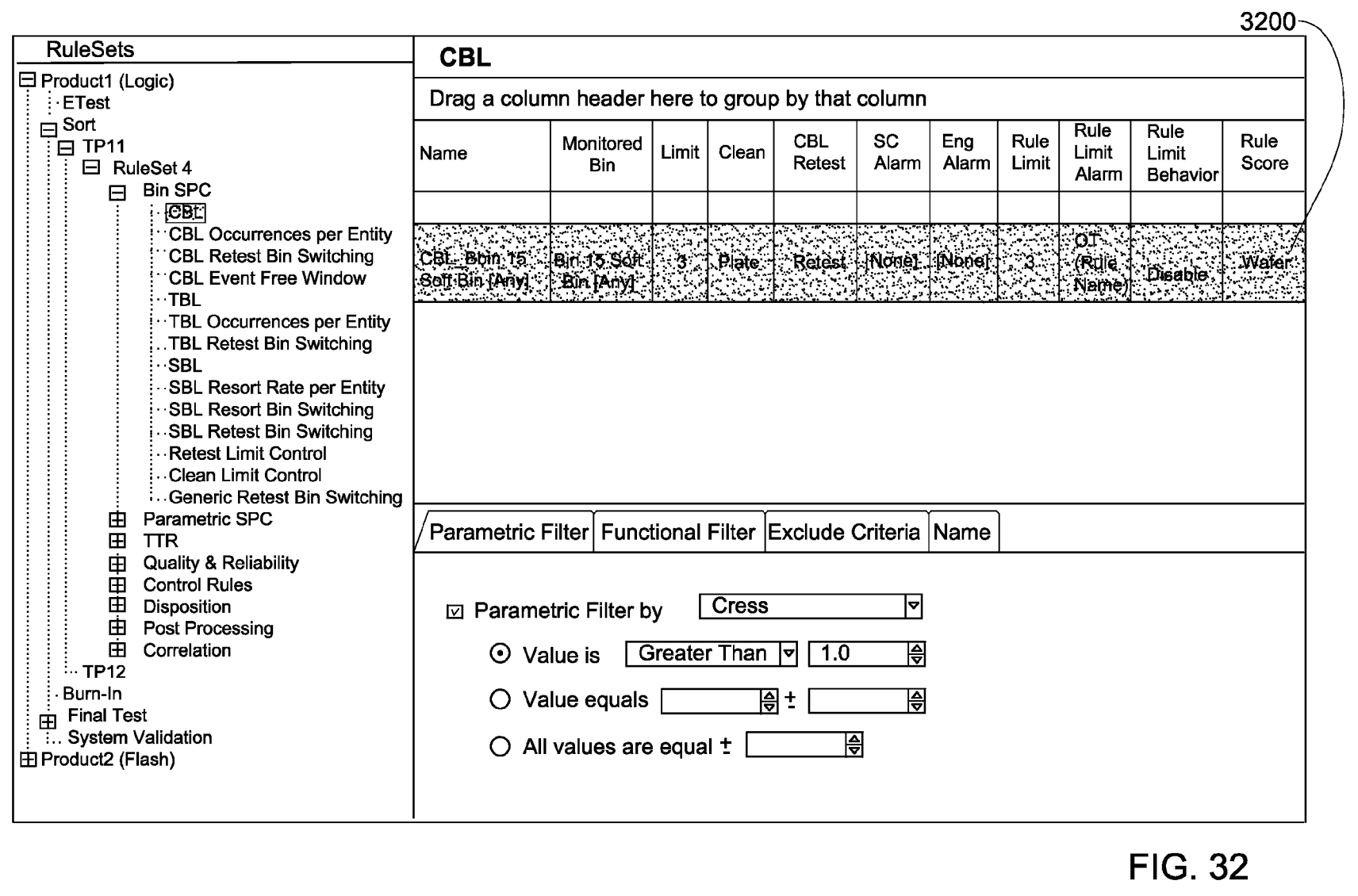

FIG. 32 illustrates the rule in grid form 3200 after the rule has been defined, according to an embodiment of the present invention. In an alternative embodiment, the grid form may instead or also be used when defining the rule (replacing FIGS. 23 through 31).

FIG. 33 illustrates another technique in rule definition, according to an embodiment of the present invention. Touching the hierarchy at a higher level, for example bin SPC 1902 provides a list of all rules defined for the touched element. In this example the CBL rule 3302 as defined above is listed.

The second example illustrated in FIGS. 34 through 42 relate to the generation of an optimization rule, i.e. a rule which updates test values in order to optimize tests.

In some embodiments, it is assumed that the user has specified the position of the new rule, by selecting search optimization 3406 in the hierarchy of categories. Thereafter in some of these embodiments, parameters 3408 associated with this rule are presented to the user. (Depending on the embodiment, there may or may not be other parameters associated with the rule which are not presented to the user, for example because those other parameters are defined automatically).

Figure 34:
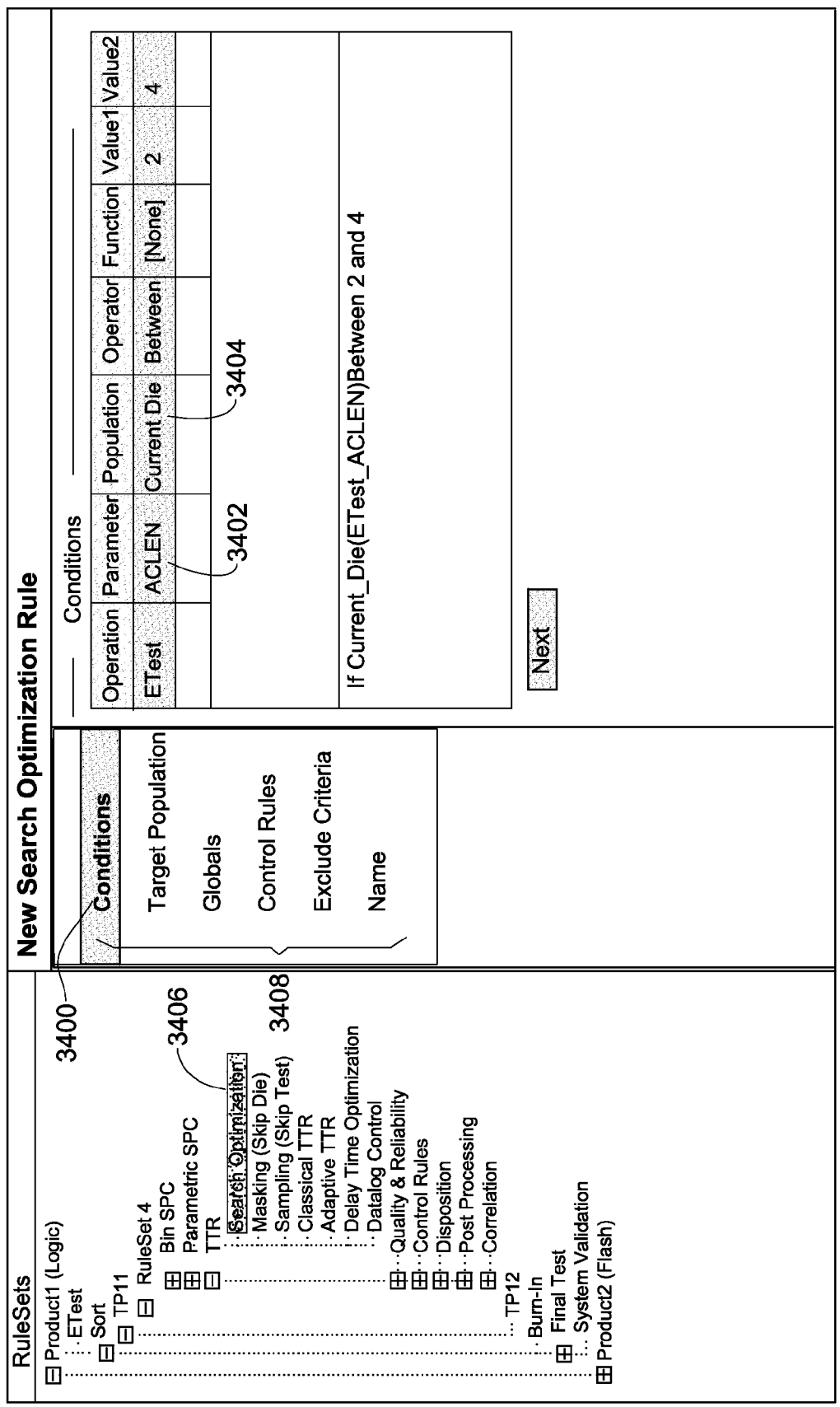
FIG. 34 is a graphical user interface for defining an optimization rule, according to an embodiment of the present invention.

In step 3400 (conditions parameter), illustrated in FIG. 34, entry conditions are defined. Entry conditions define the previous knowledge which the rule is going to leverage. The operation, the parameter from this operation and the logical conditions are defined. In this example if the "ACLEN" parameter 3402 (effective channel length for an N-MOS transistor) from the Etest operation of the current die 3404 is between 2 and 4 then the rule will be triggered. This step can also be considered as the "source information". The "ACLEN" parameter corresponds to the monitored data discussed above with reference to FIG. 5.

Figure 35:
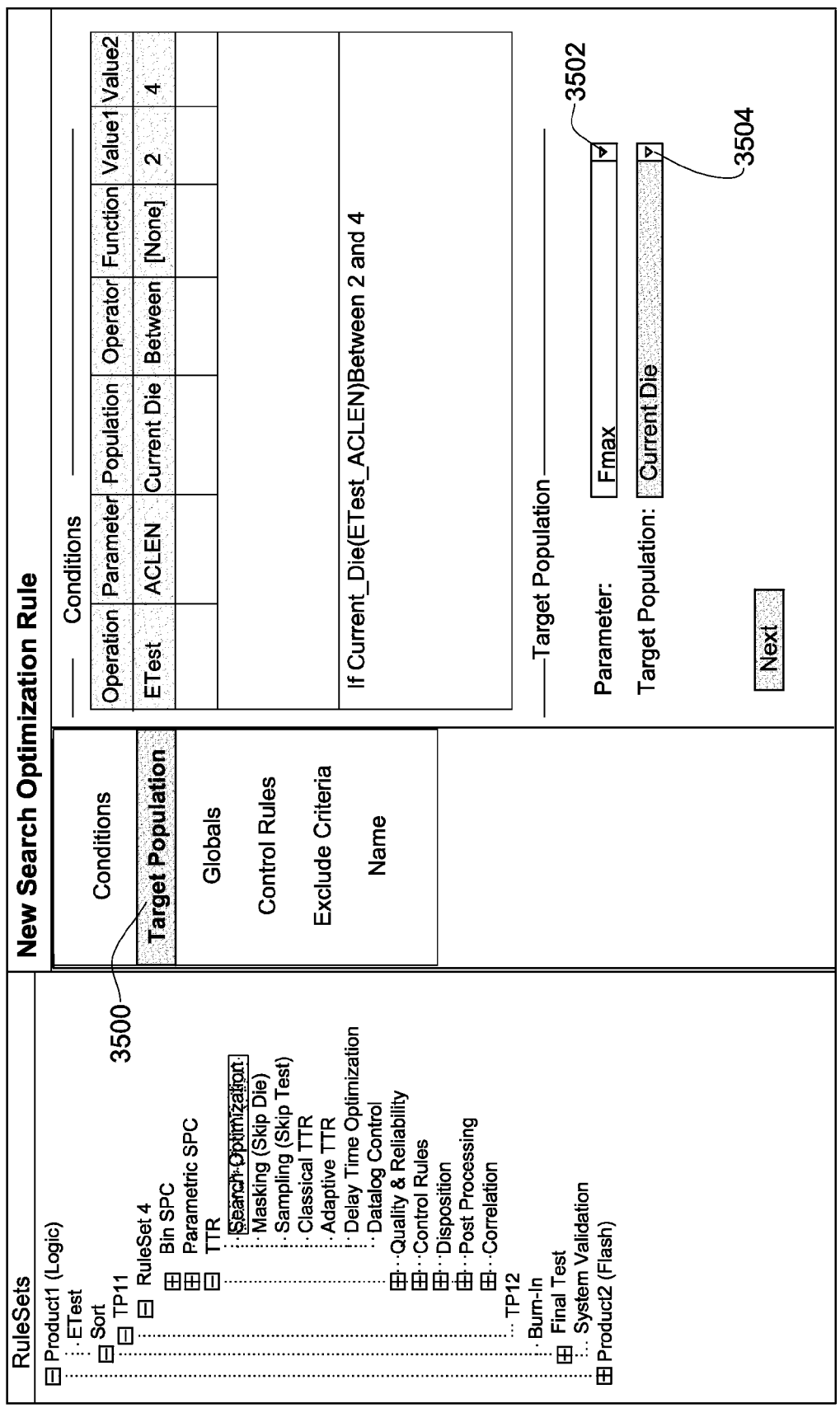
FIG. 35 is another graphical user interface for defining an optimization rule, according to an embodiment of the present invention.

In step 3500 (target population parameter) illustrated in FIG. 35, the target parameter 3502 and population 3504 are defined. This step allows the definition of whom and/or what will be impacted on, if the rule is triggered. In this example, if the rule entry criteria are met then the units impacted will be the current die 3504 (corresponding to the population parameter described in FIG. 5), and the parameter that requires modification is "Fmax" (speed at Sort) 3502. This step can also be considered as the "target information". Note that the rule is executed for all dice in the product.

Figure 36:
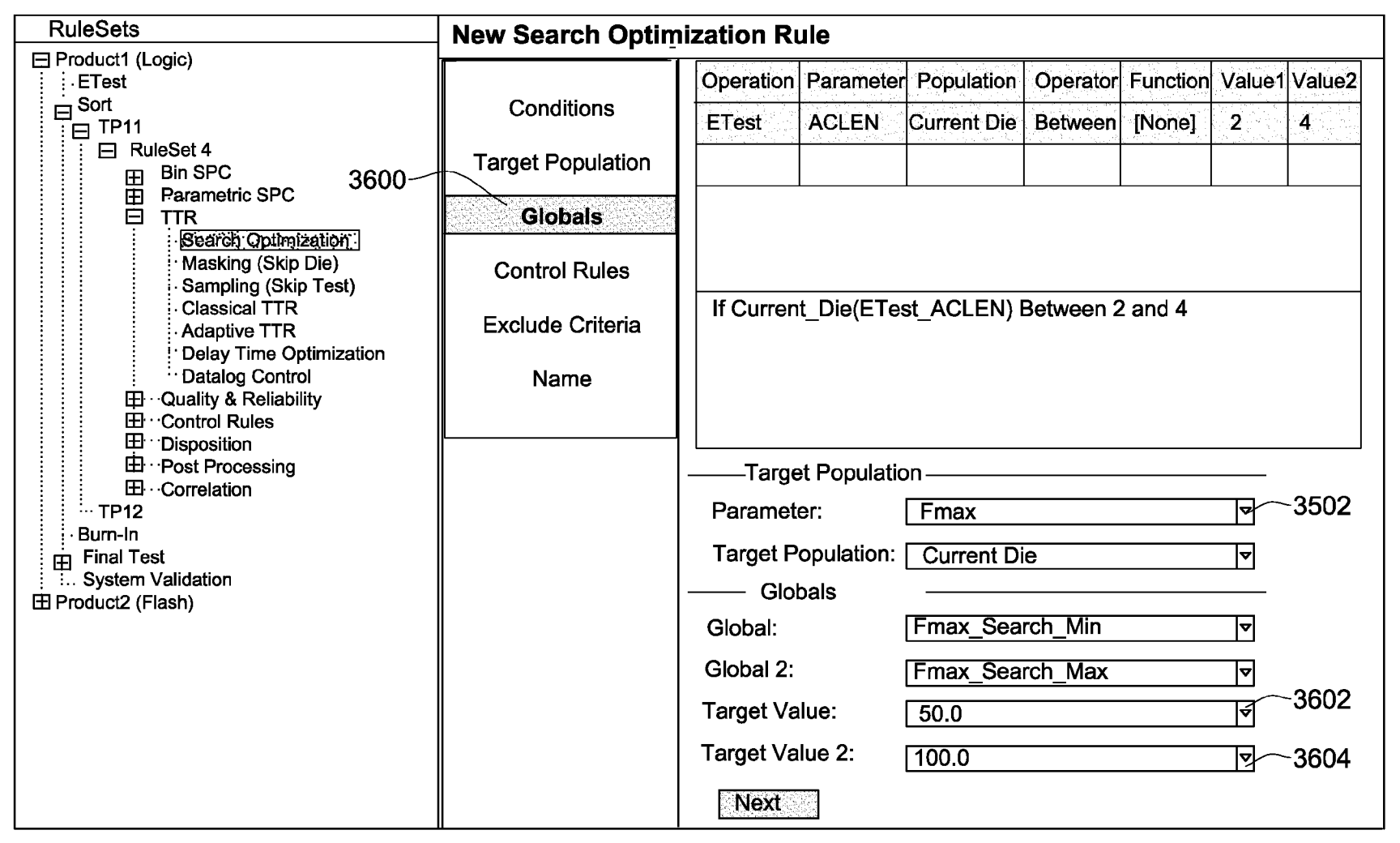

In step 3600 (globals parameter) illustrated in FIG. 36, the settings for the "Fmax" parameter 3502 are defined. In this case, the search window range for Fmax 3502 will be from the minimum value of "50" 3602 to the maximum value "100" 3604.

Note that the parameter to be modified 3502 and the globals parameter 3600 correspond to the rule action parameter discussed above with reference to FIG. 5.

In stage 3700 (control rules parameter) illustrated in FIG. 37, additional control rules can be defined. In some cases control rules can include additional rules which act as entry conditions. In this example if the "validation rule" 3702 occurs, the optimization rule currently being defined will be disabled.

Figure 38:
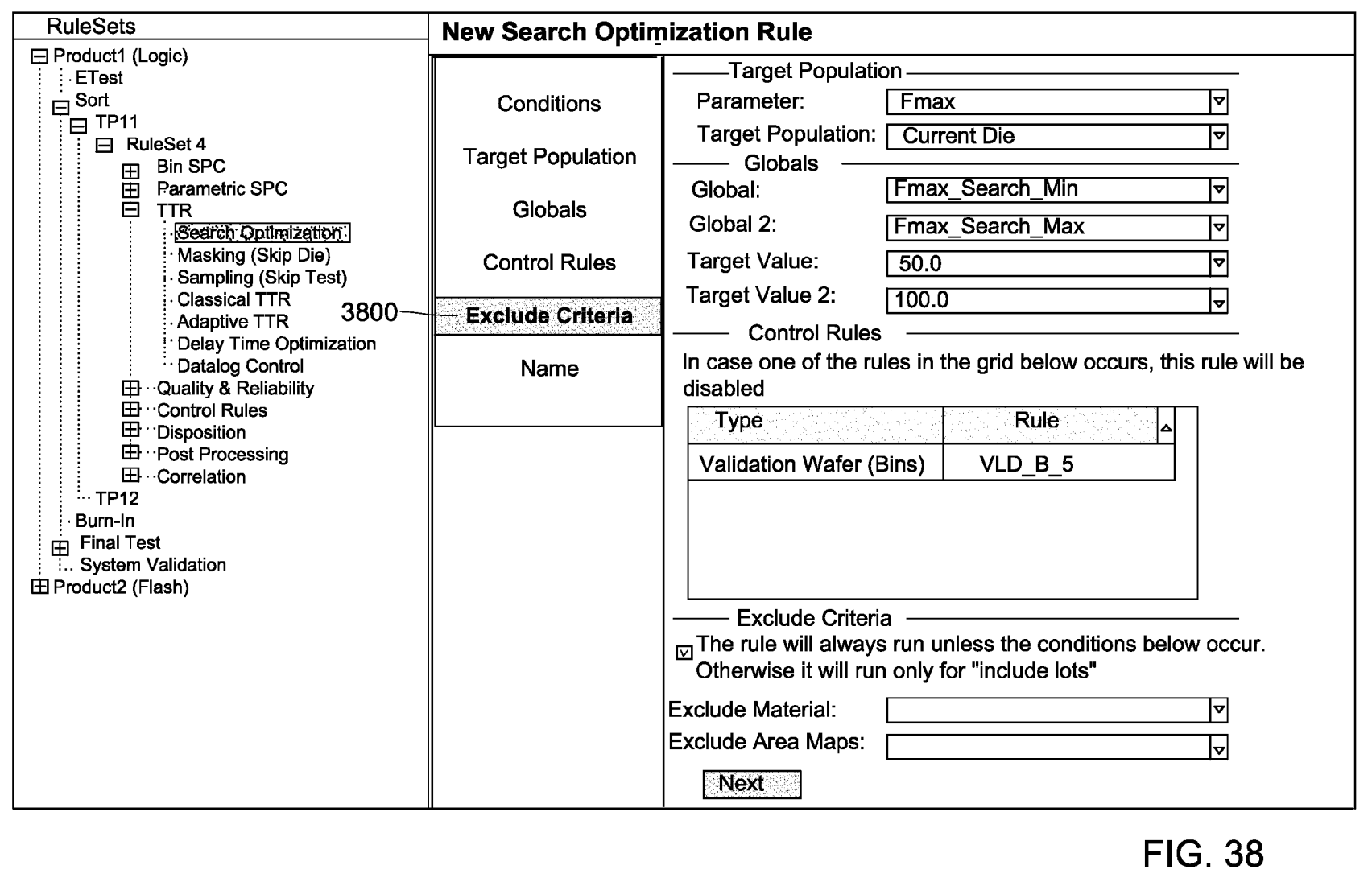

In stage 3800 (exclude criteria parameter) illustrated in FIG. 38, exclude criteria can be defined. For example assuming the rule is based on an "if-then" statement, the exclude criteria would correspond to an "unless" statement associated with the rule. In this example no exclude criteria are defined and all material will be tested with the rule. (In another embodiment where exclude criteria are defined, the rule will not be triggered if the unit, wafer or lot is of specific material type, for example engineering material, specific areas on the wafer etc.)

Note that control rules parameter 3700 and exclude criteria parameter 3800 correspond to the entry condition parameter discussed above with reference to FIG. 5.

In stage 3900 (name parameter) illustrated in FIG. 39, the rule is given a name 3902 and any comments 3904 are inputted. Name parameter 3900 corresponds to the name parameter discussed above with reference to FIG. 5.

Note that the validity condition, run point, end point, and rule state parameters (as described above with reference to FIG. 5) are invisible to the user (i.e. set automatically by rule creation module 210). In this example, the run point is the end of the die and the end point is the start of the die. The rule state is relevant only during actualization of the rule. The scope parameter discussed with reference to FIG. 5 is not relevant to this example. The algorithm object discussed with reference to FIG. 5 is the rule type "search optimization" 4002 (FIG. 40).

Figure 40:
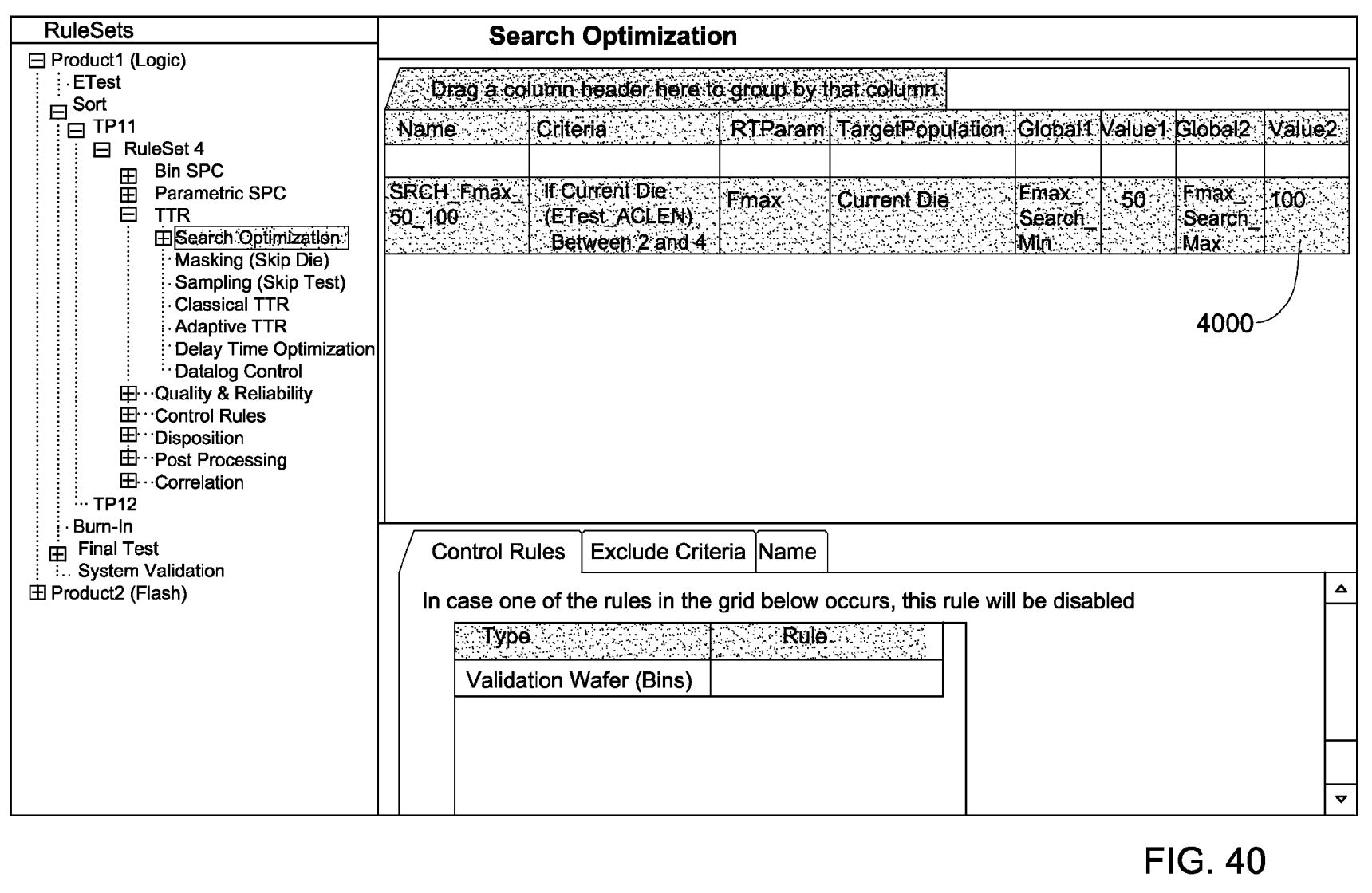

FIG. 40 illustrates the rule in grid mode 4000 after the rule has been defined, according to an embodiment of the present invention. In an alternative embodiment, the grid form may instead or also be used when defining the rule (replacing FIGS. 34 through 39).

Figure 41:
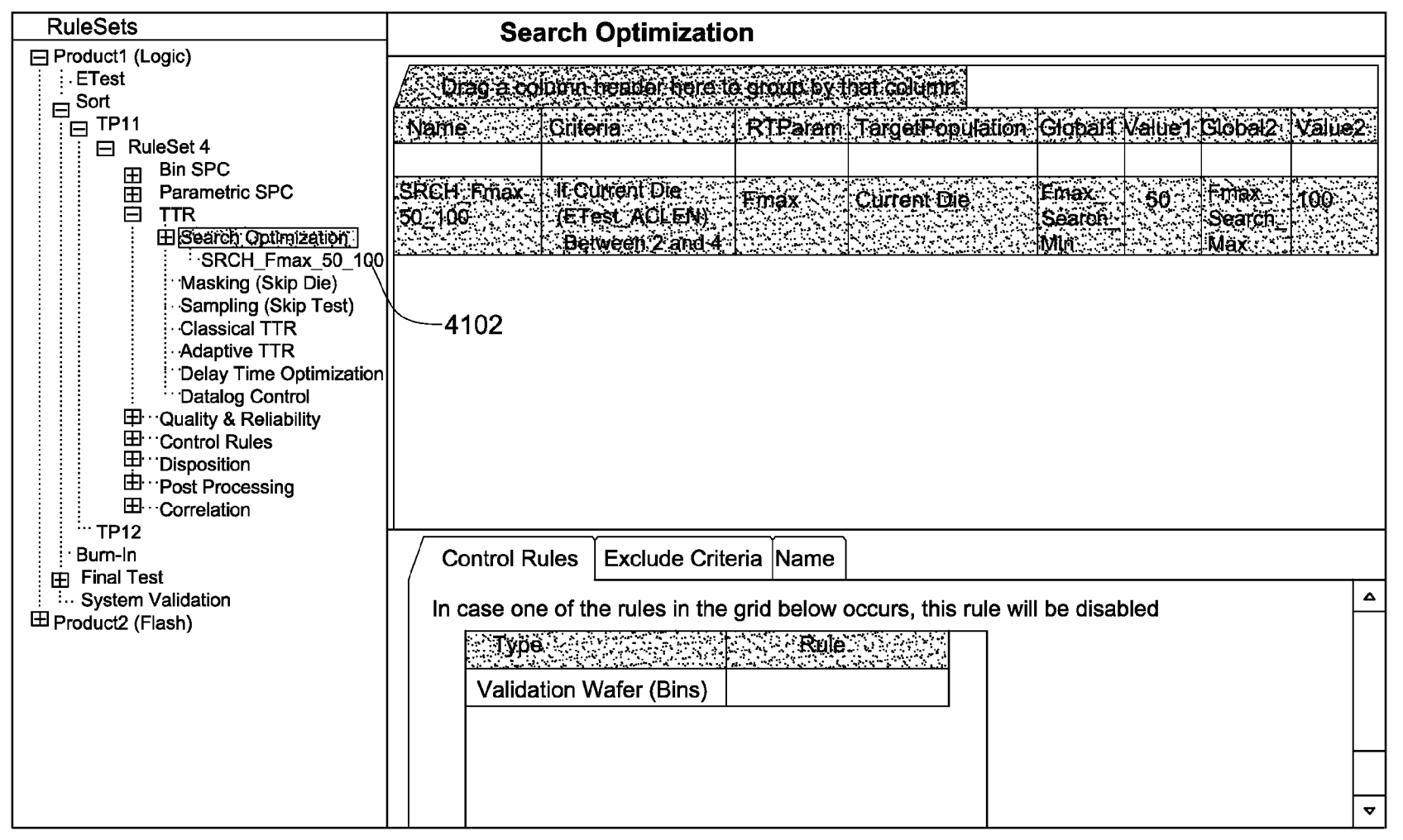

FIG. 41 shows the new rule 4102 as a new leaf in the hierarchy, according to an embodiment of the present invention.

FIG. 42 illustrates another technique in rule definition, according to an embodiment of the invention. Touching the hierarchy at a higher level, for example TTR 1906 provides a list of all rules defined for the touched element. In this example the search optimization rule 4202 as defined above is listed.

FIG. 43 illustrates the techniques of FIG. 42 but at a higher level in the hierarchy, according to an embodiment of the present invention. Touching the hierarchy at rule set 4 1900, shows a list of all rules defined for the touched element. In this case, three rules 4300 including the CBL rule and optimization rule whose definitions were described above are shown as belonging to rule set 4 1900.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

While the invention has been shown and described with respect to particular embodiments, it is not thus limited. Numerous modifications, changes and improvements within the scope of the invention will now occur to the reader.

The invention claimed is:

1. A system for creating a rule relating to semiconductor testing, comprising:
   a user interface configured to receive, from a user, a specification of a parameter for a rule relating to semiconductor testing, wherein said specification does not provide said parameter with a definitive value; and
   a simulator simulating said rule a plurality of times with different values for said parameter in order to quantify a definitive value for said parameter.

2. The system of claim 1, further comprising: a production actualizing module actualizing said rule with said definitive parameter value.

3. The system of claim 1, wherein said user interface is also receiving from a user a definition of a second rule relating to semiconductor testing which does not accord with said rule, and said simulator is simulating said rule and said second rule and based on said simulating to retain one of said rule and said second rule, while discarding another of said rule and said second rule.

4. A system for creating a rule relating to semiconductor testing, comprising:
   means for providing at least one parameter for a rule relating to semiconductor testing; wherein said at least one parameter defines a condition for actualization of said rule; and
   a simulator assuming whether said condition exists and simulating actualization or non actualization of said rule accordingly.

5. The system of claim 4, further comprising: means for actualizing said simulated rule in production.

6. The system of claim 4, wherein said condition is at least one from a group comprising: population, entry conditions, action, validity conditions, run point, end point, scope, algorithm object, rule states, lithography, defects and particles, other fabrication measurements, etest test results, sort results, burn-in results, final test results, system validation results, other test socket results, other test results, neighbors, geography, previous lots, previous wafers, current die, status of another rule, data on same material from a different operation, and data from different material for same operation.

7. The system of claim 4, further comprising:
   means for determining an anticipated value for a return on investment criterion for a plurality of rules including said rule relating to semiconductor testing, based on simulation of said plurality of rules;
   means for determining an actual value for said return on investment criterion for said plurality of rules based on actualization of said plurality of rules; and
   means for comparing said anticipated value with said actual value.

8. The system of claim 7, wherein said return on investment criterion is at least one selected from a group comprising: yield loss prevention, test time reduction, quality improvement, reliability augmentation, test escape prevention, test fleet health, and statistical process control.

9. The system of claim 7, further comprising: means for adapting at least one of said plurality of rules based on an output from said means for comparing, in the case of a determination of a requirement for adapting at least one of said plurality of rules.

10. The system of claim 4, further comprising means for actualizing said rule in offline production and means for analyzing actualization of said rule, wherein said simulator, said means for specifying, said means for actualizing in offline production and said means for analyzing actualization are integrated with one another.

11. A system for semiconductor testing, comprising:
    a first actualization module actualizing a first rule relating to semiconductor testing; and
    a second actualization module actualizing a second rule relating to semiconductor testing, wherein said second rule refers to said first rule.

12. The system of claim 11, wherein said second actualization module using a result of said first rule when actualizing said second rule.

13. The system of claim 11, wherein said second actualization module is actualizing said second rule once said first rule has occurred.

14. The system of claim 11, wherein said first actualization module is performing a corrective action if necessary based on a result of said second rule.

15. The system of claim 11, wherein said first actualization module is actualizing said first rule in real time production and said second actualization module is configured to actualize said second rule in offline production.

16. The system of claim 15, further comprising: a third actualization module actualizing said first rule in real time production, wherein said second rule compares actualization of said first rule by each of said first and third actualization modules.

17. The system of claim 16, wherein said second rule relates to checking the performance in more than one testing station associated with real time production actualizing modules, whereby testing results from said more than one testing station are processed when actualizing said second rule.

18. The system of claim 11, further comprising: a simulation actualization module simulating said first and second rules.

19. The system of claim 18, wherein said simulation actualization module is configured when simulating said second rule to be provided with an invented assumption relating to said first rule, in the case of a determination of a requirement for an invented assumption.

20. The system of claim 11, further comprising: means for defining said first and second rules.

21. A method of semiconductor testing, comprising:
    a first actualization module actualizing a first rule relating to semiconductor testing; and a second actualization module actualizing a second rule relating to semiconductor testing, wherein said second rule refers to said first rule.

22. The method of claim 21, wherein when actualizing said second rule, a result of said first rule is used.

23. The method of claim 21, wherein said second rule is actualized once said first rule has occurred.

24. The method of claim 21, further comprising: said first actualization module performing a corrective action if necessary based on a result of said second rule.

25. The method of claim 21, wherein said actualizing said first rule is performed in real time production and said actualizing said second rule is performed in offline production.

26. The method of claim 21, further comprising: simulating said first and second rules, using at least one invented assumption in the case of a determination of a requirement for at least one invented assumption.

27. A computer program product comprising a computer useable medium having computer readable program code embodied therein for creating a rule relating to semiconductor testing, the computer program product comprising:

computer readable program code for causing a computer to receive a specification of a parameter for a rule relating to semiconductor testing, wherein said specification does not provide said parameter with a definitive value; and computer readable program code for causing a computer to simulate said rule a plurality of times with different values for said parameter in order to quantify a definitive value for said parameter.

28. A computer program product comprising a computer useable medium having computer readable program code embodied therein for creating a rule relating to semiconductor testing, the computer program product comprising:

computer readable program code for causing a computer to provide at least one parameter for a rule relating to semiconductor testing; wherein said at least one parameter defines a condition for actualization of said rule; and computer readable program code for causing a computer to assume whether said condition exists and to simulate actualization or non actualization of said rule accordingly.

29. A computer program product comprising a computer useable medium having computer readable program code embodied therein for semiconductor testing, the computer program product comprising:

computer readable program code for causing a first actualization module to actualize a first rule relating to semiconductor testing; and computer readable program code for causing a second actualization module to actualize a second rule relating to semiconductor testing, wherein said second rule refers to said first rule.

* * * * *